(12) United States Patent
Tanaka

(10) Patent No.: US 7,868,408 B2
(45) Date of Patent: Jan. 11, 2011

(54) SEMICONDUCTOR LIGHT DETECTING ELEMENT INCLUDES FILM WHICH COVERS LIGHT RECEIVING REGION NEAR MAIN SURFACE OF MULTILAYER STRUCTURE AND ELECTRODE ON MAIN SURFACE

(75) Inventor: Akimasa Tanaka, Hamamatsu (JP)

(73) Assignee: Hamamatsu Photonics K.K., Hamamatsu-shi, Shizuoka (JP)

( * ) Notice: Subject to any disclaimer, the term of this patent is extended or adjusted under 35 U.S.C. 154(b) by 0 days.

(21) Appl. No.: 10/594,619

(22) PCT Filed: Mar. 28, 2005

(86) PCT No.: PCT/JP2005/005759
§ 371 (c)(1),
(2), (4) Date: Jun. 19, 2007

(87) PCT Pub. No.: WO2005/093857
PCT Pub. Date: Oct. 6, 2005

(65) Prior Publication Data
US 2008/0006894 A1    Jan. 10, 2008

(30) Foreign Application Priority Data
Mar. 29, 2004   (JP) .............................. 2004-096060

(51) Int. Cl.
*H01L 31/0352*   (2006.01)
*H01L 31/0224*   (2006.01)
*H01L 31/0232*   (2006.01)

(52) U.S. Cl. .................. 257/466; 257/447; 257/228; 257/460; 257/434; 257/E31.032; 257/E31.037; 257/E31.038; 257/E31.125; 257/E31.128

(58) Field of Classification Search .................. 257/447, 257/228, 460, 434, 466, E31.032, E31.037, 257/E31.038, E31.125, E31.128
See application file for complete search history.

(56) References Cited

U.S. PATENT DOCUMENTS

| 4,507,674 | A | * | 3/1985 | Gaalema ..................... 257/436 |
| 5,602,384 | A | * | 2/1997 | Nunogaki et al. ......... 250/203.4 |
| 0,014,321 | A1 |   | 1/2005 | Niigaki et al. |

(Continued)

FOREIGN PATENT DOCUMENTS

CN    1479947    3/2004

(Continued)

*Primary Examiner*—Phat X Cao
*Assistant Examiner*—Diana C Garrity
(74) *Attorney, Agent, or Firm*—Drinker Biddle & Reath LLP

(57) ABSTRACT

A semiconductor photodetector device (PD1) comprises a multilayer structure (LS1) and a glass substrate (1) optically transparent to incident light. The multilayer structure includes an etching stop layer (2), an n-type high-concentration carrier layer (3), an n-type light-absorbing layer (5), and an n-type cap layer (7) which are laminated. A photodetecting region (9) is formed near a first main face (101) of the multilayer structure, whereas a first electrode (21) is provided on the first main face. A second electrode (27) and a third electrode (31) are provided on a second main face (102). A film (10) covering the photodetecting region and first electrode is formed on the first main face. A glass substrate (1) is secured to the front face (10a) of this film.

8 Claims, 41 Drawing Sheets

U.S. PATENT DOCUMENTS

| | | | |
|---|---|---|---|
| 6,933,489 | B2 * | 8/2005 | Fujii et al. ............... 250/214.1 |
| 0,291,521 | A1 | 11/2009 | Tanaka |
| 2003/0113979 | A1 | 6/2003 | Bieck et al. |

FOREIGN PATENT DOCUMENTS

| | | |
|---|---|---|
| JP | S59-501033 | 12/1983 |
| JP | 3-104287 | 5/1991 |
| JP | 6-296035 | 10/1994 |
| JP | 07-043145 | 2/1995 |
| JP | 07-162022 | 6/1995 |
| JP | 2000-502215 | 2/2000 |
| JP | 2001-177142 | 6/2001 |
| JP | 2001-267592 | 9/2001 |
| JP | 2001-339057 | 12/2001 |
| JP | 2002-501679 | 1/2002 |
| JP | 2002-353564 | 12/2002 |
| JP | 2002-368334 | 12/2002 |
| WO | WO 83/04456 | 12/1983 |
| WO | 02/39506 | 5/2002 |
| WO | 03/041174 | 5/2003 |
| WO | 03/096427 | 11/2003 |

* cited by examiner

SEMICONDUCTOR LIGHT DETECTING ELEMENT INCLUDES FILM WHICH COVERS LIGHT RECEIVING REGION NEAR MAIN SURFACE OF MULTILAYER STRUCTURE AND ELECTRODE ON MAIN SURFACE

TECHNICAL FIELD

The present invention relates to a semiconductor photodetector device and a method of manufacturing the same.

BACKGROUND ART

Recently, as the CPU driving frequency has been becoming higher (e.g., 10 GHz or higher), attention has been directed toward optical interconnection techniques in which signals within and between system apparatus are transmitted by light. Semiconductor devices such as semiconductor photodetector devices and semiconductor light-emitting devices are used in the optical interconnection techniques.

When mountability to external substrates is concerned in a semiconductor photodetector device used in the optical interconnection techniques, it will be preferred if an electrode (signal electrode) for taking out signals from the photodetector device is arranged on a surface opposite from a light-incident surface. Examples of such semiconductor photodetector devices are disclosed in Japanese Patent Application Laid-Open Nos. HEI 3-104287, HEI 6-296035, and 2002-353564. These publications disclose semiconductor photodetector devices of back-illuminated type in which a plurality of compound semiconductor layers are formed on one main face side of a semiconductor substrate, while light is incident from the other main face side.

For the following purposes, these back-illuminated semiconductor photodetector devices partly thin the portion of the substrate located under the photodetecting part, while surrounding this portion with a part maintaining the thickness of the substrate. The first purpose is to prevent signals from deteriorating or disappearing because of light absorption by the semiconductor substrate. The second purpose is to prevent the semiconductor photodetector devices from being damaged or broken when mounting the semiconductor photodetector devices onto external substrates by wire bonding or bump bonding.

However, there is a limit to reducing the size of the above-mentioned back-illuminated semiconductor photodetector devices, since there is a portion maintaining the substrate thickness in order to keep mechanical strength. When forming an array of semiconductor photodetector devices by providing a plurality of photodetecting parts in particular, the pitch between the photodetecting parts is hard to narrow, whereby the semiconductor photodetector device array must increase its size.

DISCLOSURE OF THE INVENTION

It is the object of the present invention to provide a semiconductor photodetector device which can be made smaller while keeping a sufficient mechanical strength, and a method of manufacturing the same.

In one aspect, the present invention relates to a semiconductor photodetector device. This photodetector device comprises a multilayer structure including a plurality of compound semiconductor layers laminated and having first and second main faces opposing each other; a photodetecting region formed near the first main face within the multilayer structure; a first electrode arranged on the first main face of the multilayer structure and electrically connected to the photodetecting region; a second electrode arranged on the second main face of the multilayer structure and electrically connected to the first electrode; a third electrode arranged on the second main face of the multilayer structure and electrically connected to a part near the second main face in the multilayer structure; and a light-transmitting layer, optically transparent to incident light and arranged on the first main face of the multilayer structure, covering the photodetecting region and first electrode.

In this photodetector device, the mechanical strength of the multilayer structure is held by the light-transmitting layer even when a plurality of compound semiconductor layers included in the multilayer structure are made thinner. Unlike the prior art mentioned above, there is no need to form a part maintaining the substrate thickness, whereby the device is easily made smaller.

In this photodetector device, the second and third electrodes for taking out output signals are arranged on the second main face of the multilayer structure. Therefore, the photodetector device can be mounted while its second main face positioned on the opposite side of the photodetecting region opposes a mounting surface of an external substrate or the like. As a result, the photodetector device can be mounted easily.

The light-transmitting layer may include a film made of silicon oxide and a glass substrate. The glass substrate may be secured to the multilayer structure through the film made of silicon oxide. Silicon oxide can be fused to glass, and thus can bond the multilayer structure and glass substrate to each other without using other adhesives. Therefore, the light incident on the glass substrate side can reach the multilayer structure without being absorbed by adhesives.

The light-transmitting layer may include a film made of silicon oxide or a resin without a glass substrate.

The plurality of compound semiconductor layers may include a high-concentration carrier layer of a first conductive type, a light-absorbing layer of the first conductive type, and a cap layer of the first conductive type. The photodetecting region may be a region of a second conductive type including at least a part of the cap layer.

The multilayer structure may further comprise a depression formed about the photodetecting region, and a wiring electrode arranged within the depression. The first electrode may be electrically connected to the second electrode through the wiring electrode. The third electrode may be electrically connected to a part positioned near the photodetecting region in the high-concentration carrier layer. The depression formed about the photodetecting region separates the photodetecting region at least partly from the other parts of the multilayer structure, and thus can reduce parasitic capacitance by a greater amount. When the wiring electrode arranged in the depression is utilized as a through electrode penetrating through the multilayer structure, the through electrode can be formed very easily. When the through electrode is used, the electrode is directly drawn from the high-concentration carrier layer of the photodetecting part, whereby the series resistance can be reduced greatly.

The photodetector device of the present invention may further comprise a through lead penetrating through the multilayer structure. The first electrode may be electrically connected to the second electrode through the through electrode. The third electrode may be electrically connected to the high-concentration carrier layer. In this case, the through lead can electrically connect the first and second electrodes to each other reliably. Since the electrode is directly drawn from the high-concentration carrier layer, the series resistance can be reduced greatly.

The second and third electrodes may include respective pad electrodes, while respective bump electrodes may be arranged on these pad electrodes.

The photodetector device may further comprise a light-reflecting film, provided on the second main face, covering the photodetecting region. Light having passed the multilayer structure without being absorbed is reflected by the light-reflecting film, and then is incident on the multilayer structure again, which increases the quantity of light absorbed by the multilayer structure, whereby photosensitivity can be improved more.

The light-transmitting layer may include a lens part converging the incident light. In this case, the incident light can be converged efficiently even when the photodetecting region is smaller than the illuminating area of the incident light. The photodetector device in accordance with the present invention may comprise a plurality of photodetecting regions arranged in a row.

Another aspect of the present invention relates to a method of manufacturing a semiconductor photodetector device. This method comprises the steps of preparing a semiconductor substrate; providing a multilayer structure on the semiconductor substrate, the multilayer structure including a plurality of compound semiconductor layers laminated and having first and second main faces opposing each other, the second main face facing the semiconductor substrate; forming a photodetecting region near the first main face within the multilayer structure; providing a first electrode electrically connected to the photodetecting region onto the first main face of the multilayer structure; forming a light-transmitting layer optically transparent to incident light onto the first main face of the multilayer structure so as to cover the photodetecting region and first electrode; removing the semiconductor substrate after forming the light-transmitting layer; and forming a second electrode electrically connected to the first electrode onto the second main face of the multilayer structure while forming a third electrode electrically connected to a part near the second main face in the multilayer structure onto the second main face after removing the semiconductor substrate.

Since the semiconductor substrate is removed after forming the light-transmitting layer onto the first main face of the multilayer structure, a semiconductor photodetector device in which the light-transmitting layer is arranged on the opposite side of the second and third electrodes for taking out output signals can be manufactured easily.

Since the light-transmitting layer remains after removing the semiconductor substrate, the mechanical strength of the multilayer structure will be held by the light-transmitting layer even if the plurality of compound semiconductor layers included in the multilayer structure are made thinner. Unlike the prior art mentioned above, there is no need to leave a part maintaining the substrate thickness, whereby the device easily reduces its size. Before forming the light-transmitting layer, the semiconductor substrate keeps the mechanical strength.

The step of forming the light-transmitting layer may include the steps of forming a film made of silicon oxide so as to cover the photodetecting region and first electrode; and securing a glass substrate optically transparent to the incident light onto the film made of silicon oxide. Silicon oxide can be fused to glass, and thus can bond the multilayer structure and glass substrate to each other without using other adhesives. Therefore, the light incident on the glass substrate side can reach the multilayer structure without being absorbed by adhesives.

The step of forming the light-transmitting layer may include the step of forming a film made of silicon oxide or a resin so as to cover the photodetecting region and first electrode.

The step of removing the semiconductor substrate may include the step of removing the semiconductor substrate by wet etching. The step of forming the multilayer structure may include the step of forming an etching stop layer for stopping wet etching between the semiconductor substrate and the plurality of compound semiconductor layers. Using an etchant which can etch the semiconductor substrate but not the etching stop layer can selectively remove the semiconductor substrate. Therefore, the semiconductor substrate can be removed reliably and easily while leaving the plurality of compound semiconductor layers.

The method in accordance with the present invention may further comprise the step of removing the etching stop layer by wet etching after removing the semiconductor substrate. Using an etchant which can etch the etching stop layer but not the compound semiconductor layers can selectively remove the etching stop layer alone. Therefore, the etching stop layer can be removed reliably and easily while leaving the plurality of compound semiconductor layers.

The plurality of compound semiconductor layers may include a high-concentration carrier layer of a first conductive type, a light-absorbing layer of the first conductive type, and a cap layer of the first conductive type. The step of forming the multilayer structure may include the step of successively laminating the high-concentration carrier layer, light-absorbing layer, and cap layer on the semiconductor substrate. The step of forming the photodetecting region may include the step of forming a region of a second conductive type including at least a part of the cap layer as the photodetecting region.

This method may further comprise the steps of forming a depression about the photodetecting region; and providing a wiring electrode for electrically connecting the first electrode to the second electrode in the depression. The step of forming the third electrode may include the step of forming the third electrode such that the third electrode is electrically connected to a part positioned near the photodetecting region in the high-concentration carrier layer. The depression formed about the photodetecting region separates the photodetecting region at least partly from the other parts of the multilayer structure, and thus can reduce parasitic capacitance by a greater amount. When the wiring electrode arranged in the depression is utilized as a through electrode penetrating through the multilayer structure, the through electrode can be formed very easily.

The step of forming the second electrode may include the step of forming a through lead penetrating through the multilayer structure, and electrically connecting the first electrode to the second electrode through the through lead. The step of forming the third electrode may include the step of forming the third electrode such that the third electrode is electrically connected to the high-concentration carrier layer. In this case, the through lead can electrically connect the first and second electrodes to each other reliably. Also, since the electrode is directly drawn from the high-concentration carrier layer, the series resistance can be reduced greatly.

The method in accordance with the present invention may further comprise the step of forming a light-reflecting film covering the photodetecting region onto the second main face of the multilayer structure. In this case, light having passed the multilayer structure without being absorbed is reflected by the light-reflecting film, and then is incident on the multilayer structure again, which increases the quantity of light absorbed by the multilayer structure, whereby photosensitivity can be improved.

The light-transmitting layer may include a lens part converging the incident light. In this case, the incident light can be converged efficiently even when the photodetecting region is smaller than the illuminating area of the incident light.

The present invention will further be understood from the following detailed descriptions and attached drawings. The attached drawings are given by illustration only, and do not intend to limit the scope of the present invention.

EXPLANATIONS OF NUMERALS OR LETTERS

1: glass substrate; 121a: lens part; 2: etching stop layer; 3(3a): high-concentration carrier layer; 5(5a): light-absorbing layer; 7(7a): cap layer; 9: photodetecting region; 10: film; 11: photodetecting part; 12: depression; 17: contact electrode; 21: first electrode; 23: contact electrode; 25: first wiring electrode; 27: first pad electrode (second electrode); 31: third electrode; 33: second pad electrode; 35: second wiring electrode; 41: bump electrode; 51: semiconductor substrate; 60: film; 131a: lens part; 71: contact electrode; 73: through lead; 81: third electrode; 83: contact electrode; LS1, LS2: layer structure; PD1 to PD8: semiconductor photodetector device; PDA1, PDA2: semiconductor photodetector array.

BEST MODES FOR CARRYING OUT THE INVENTION

Semiconductor photodetector devices in accordance with embodiments of the present invention will be explained with reference to the drawings. In the explanation, the same numerals will be used for the same constituents or those having the same functions without repeating their overlapping descriptions.

First Embodiment

Figure 1:
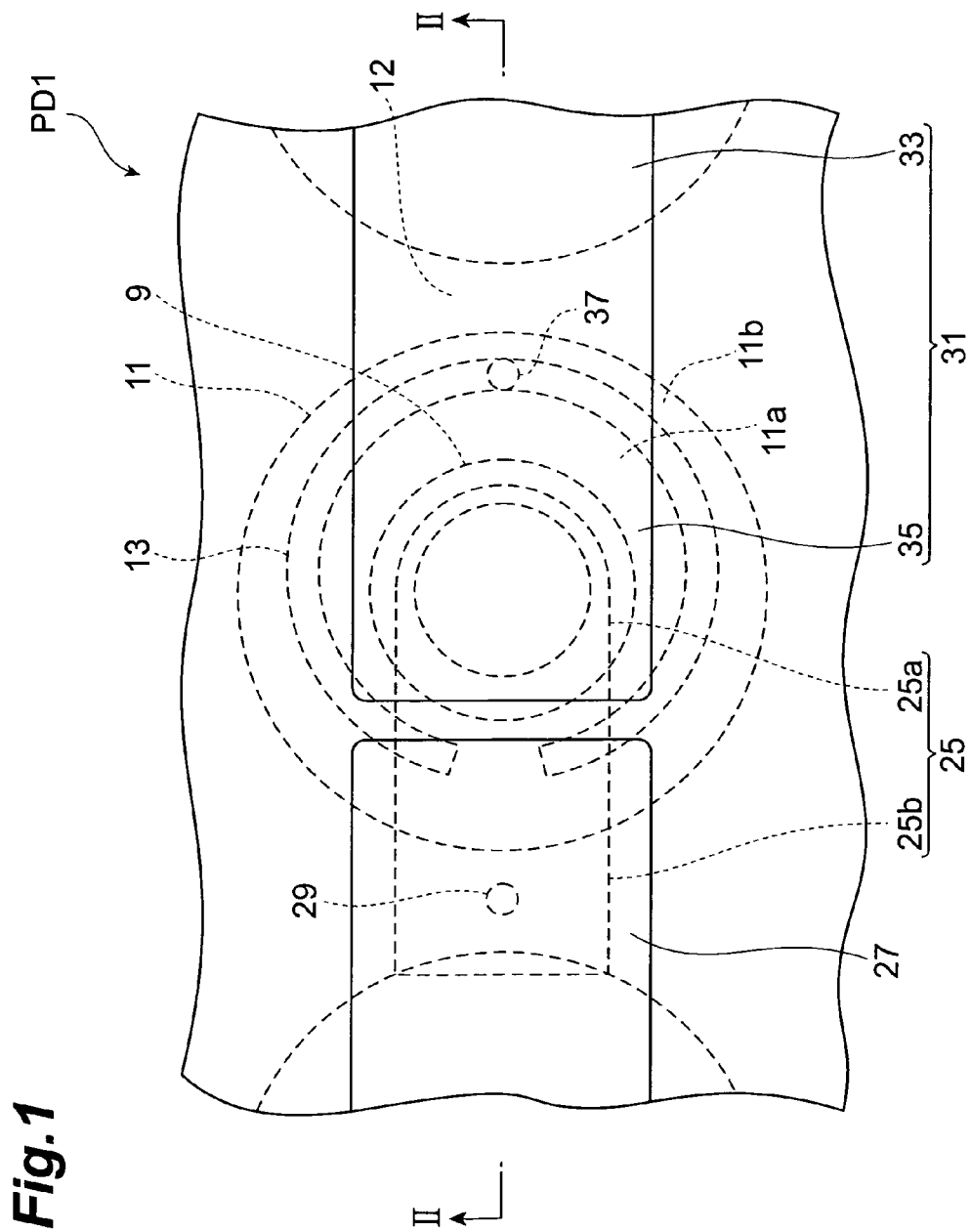
FIG. 1 is a schematic plan view showing the semiconductor photodetector device in accordance with a first embodiment.
Figure 2:
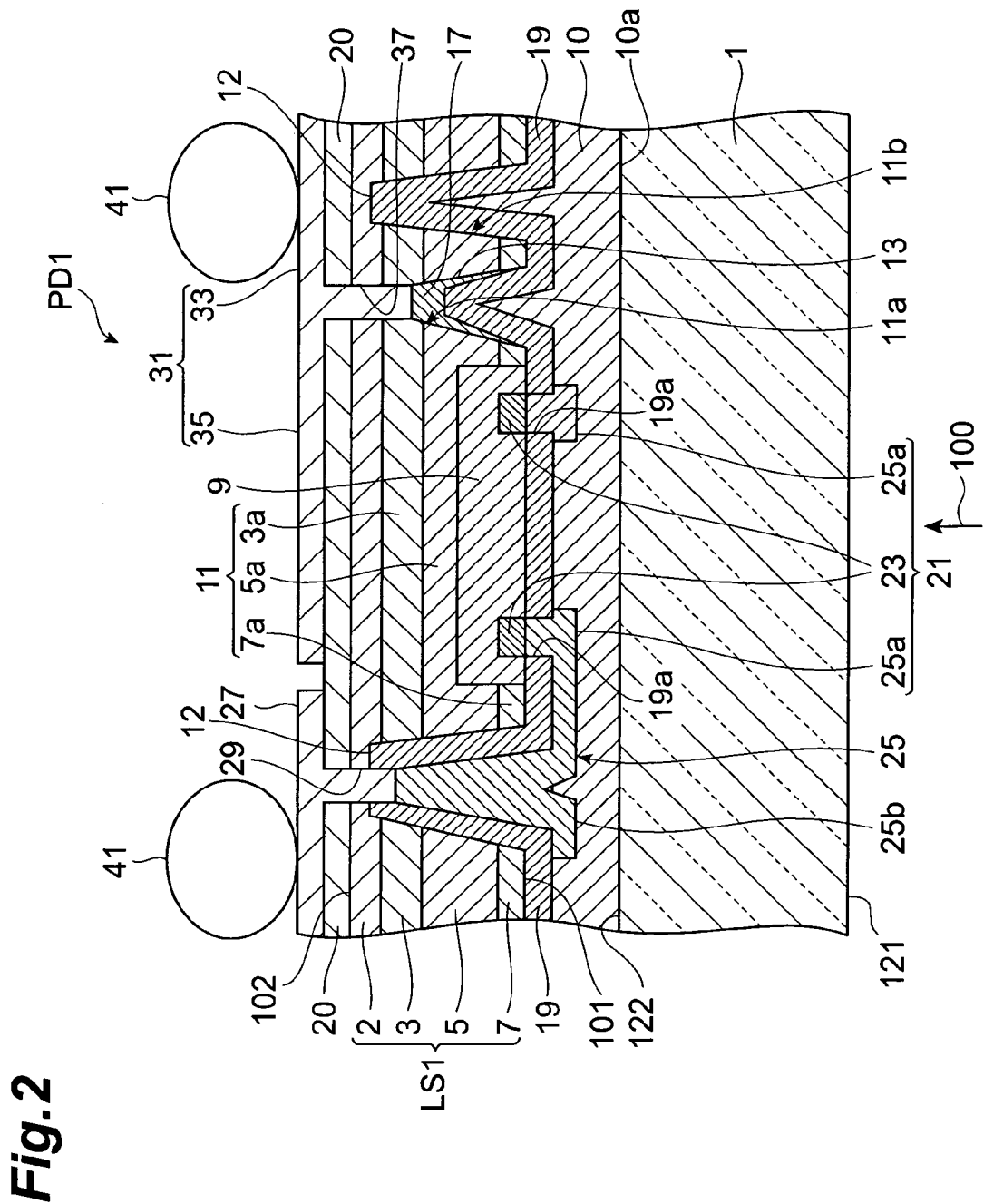
FIG. 2 is a schematic sectional view taken along the line II-II of FIG. 1.
Figure 3:
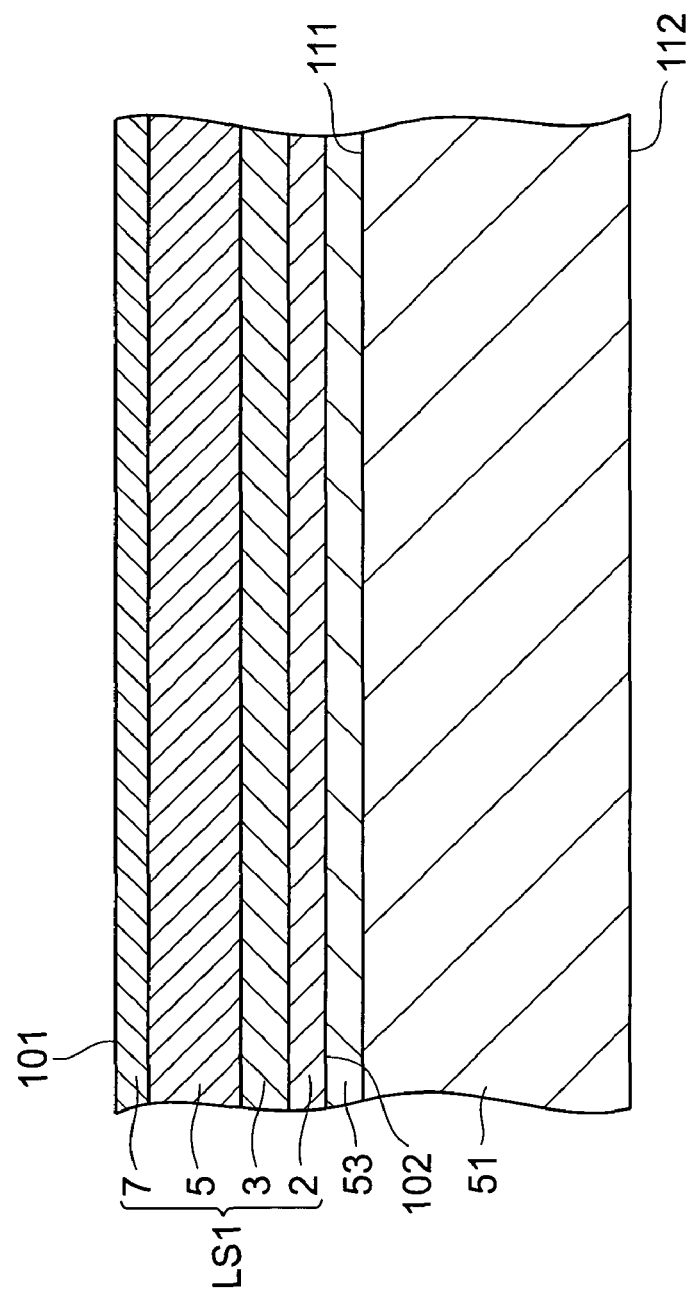
FIG. 3 is a schematic sectional view showing a manufacturing step of the semiconductor photodetector device in accordance with the first embodiment.
Figure 4:
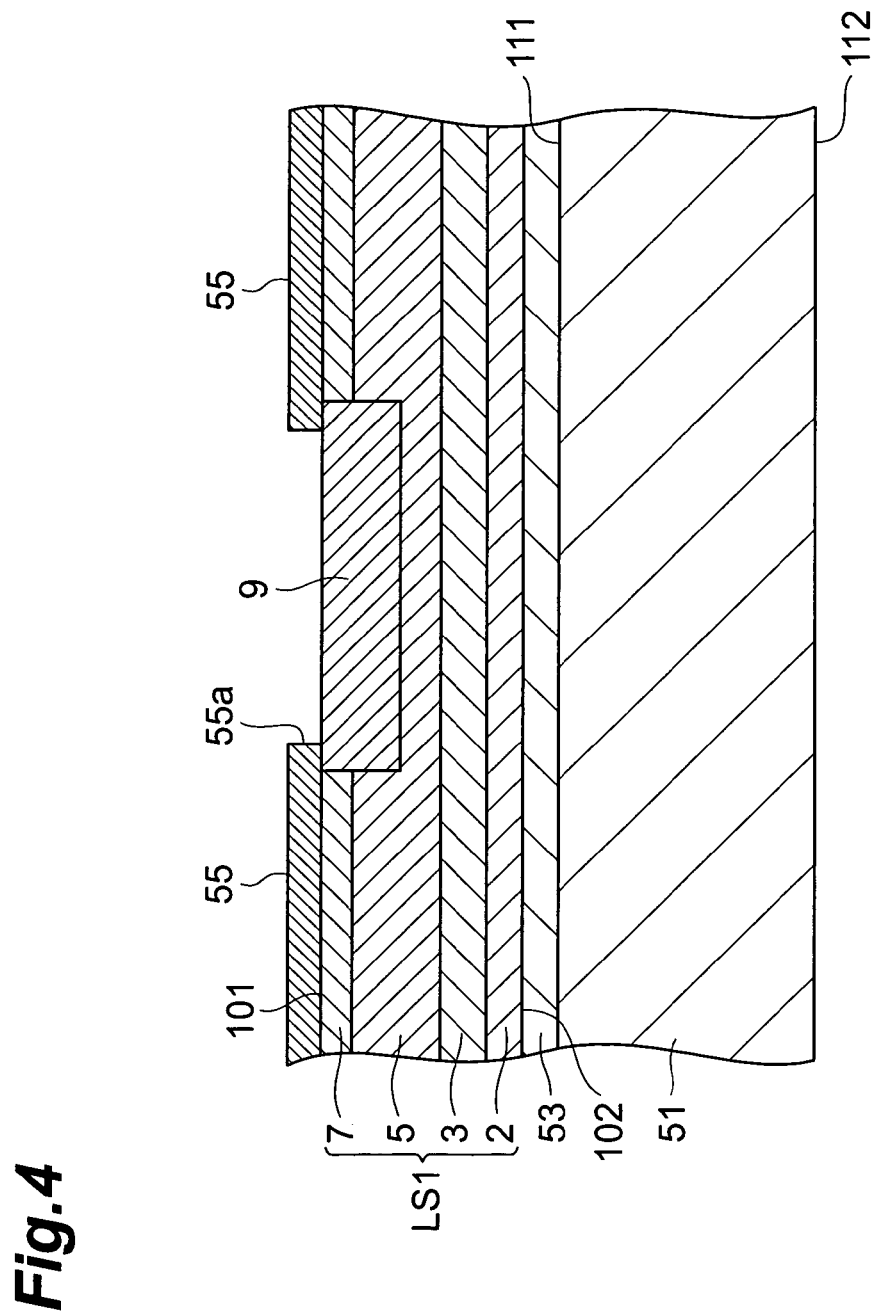
FIG. 4 is a schematic sectional view showing a manufacturing step of the semiconductor photodetector device in accordance with the first embodiment.
Figure 5:
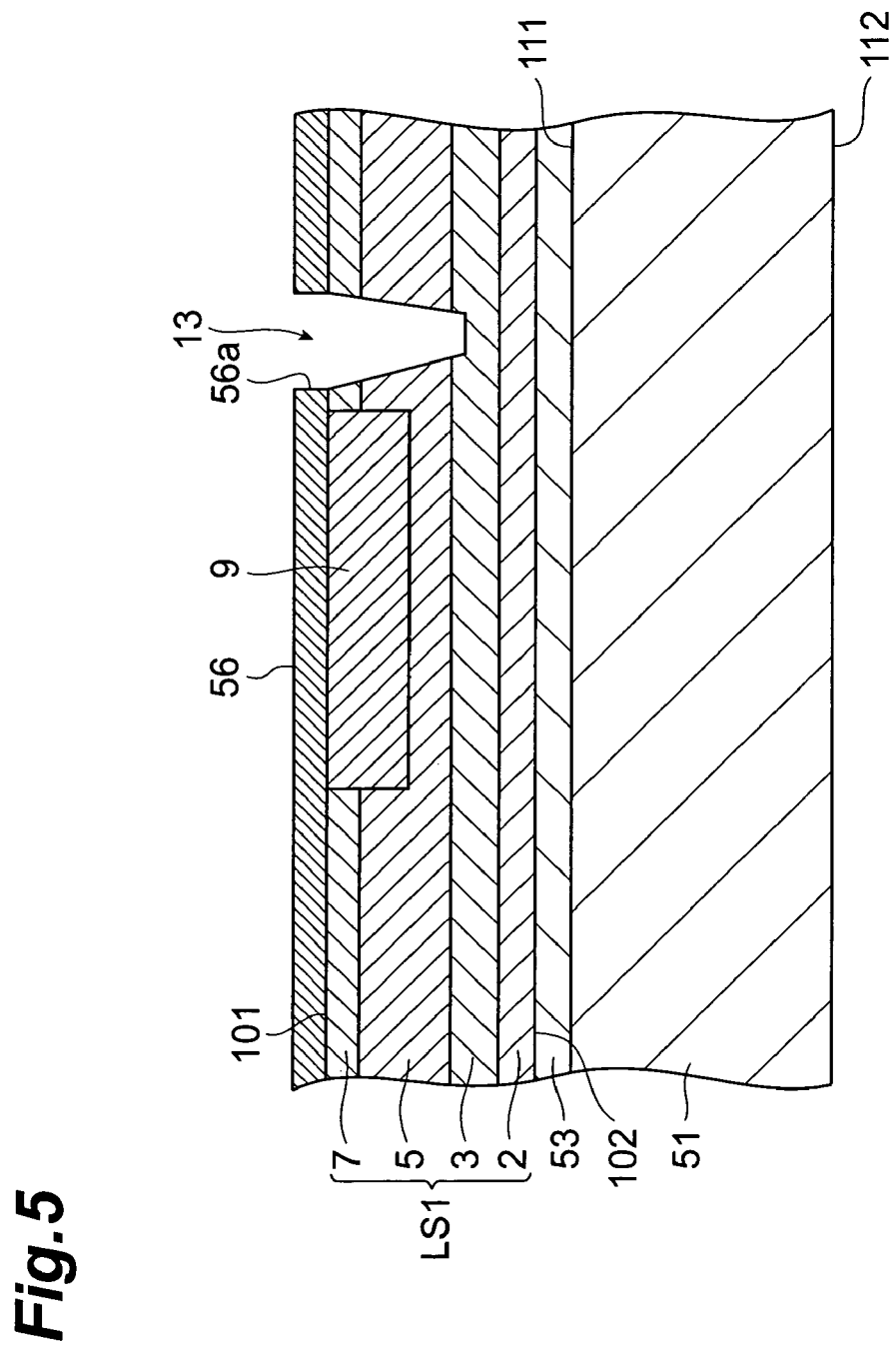
FIG. 5 is a schematic sectional view showing a manufacturing step of the semiconductor photodetector device in accordance with the first embodiment.
Figure 6:
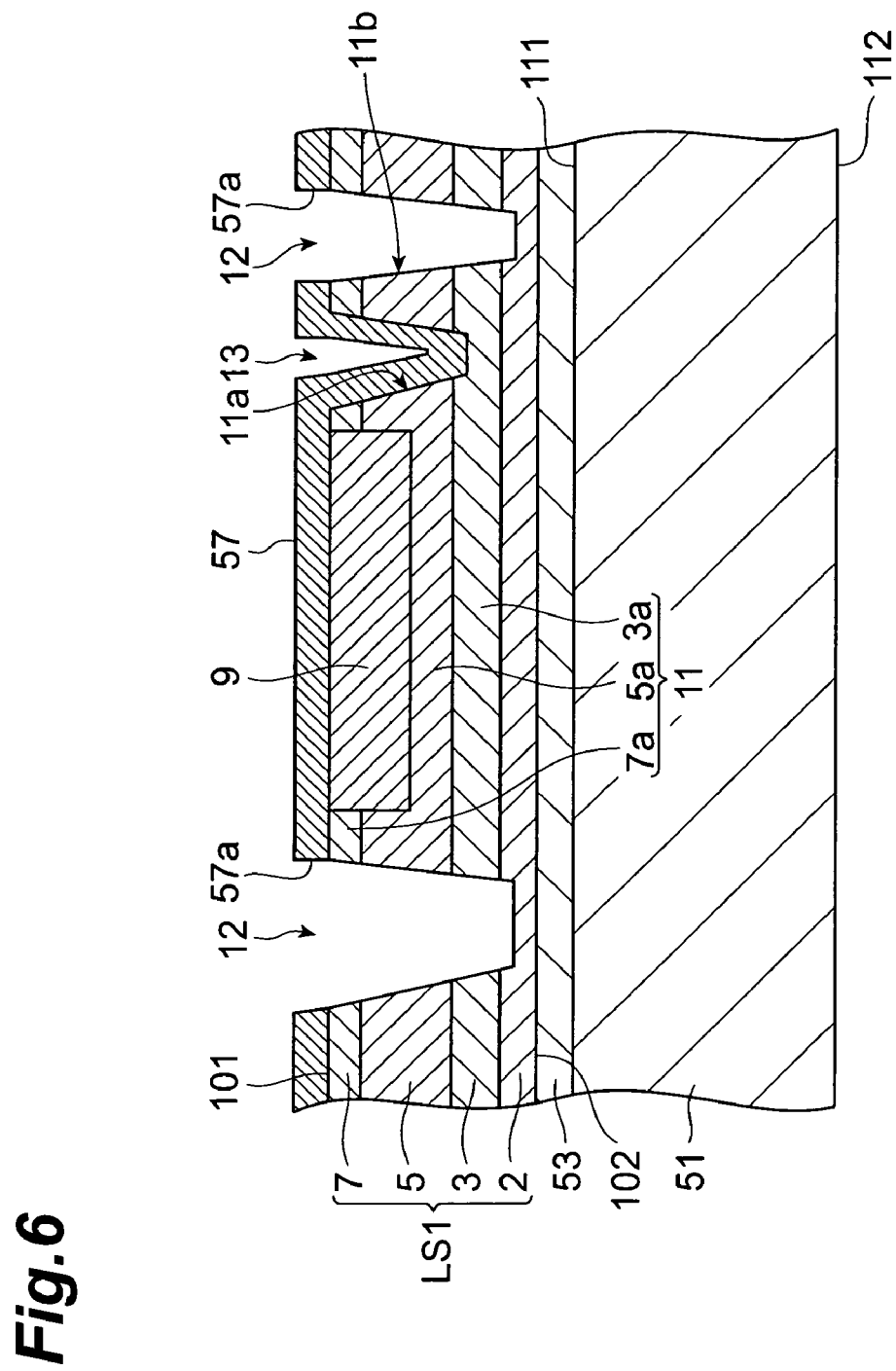
FIG. 6 is a schematic sectional view showing a manufacturing step of the semiconductor photodetector device in accordance with the first embodiment.
Figure 7:
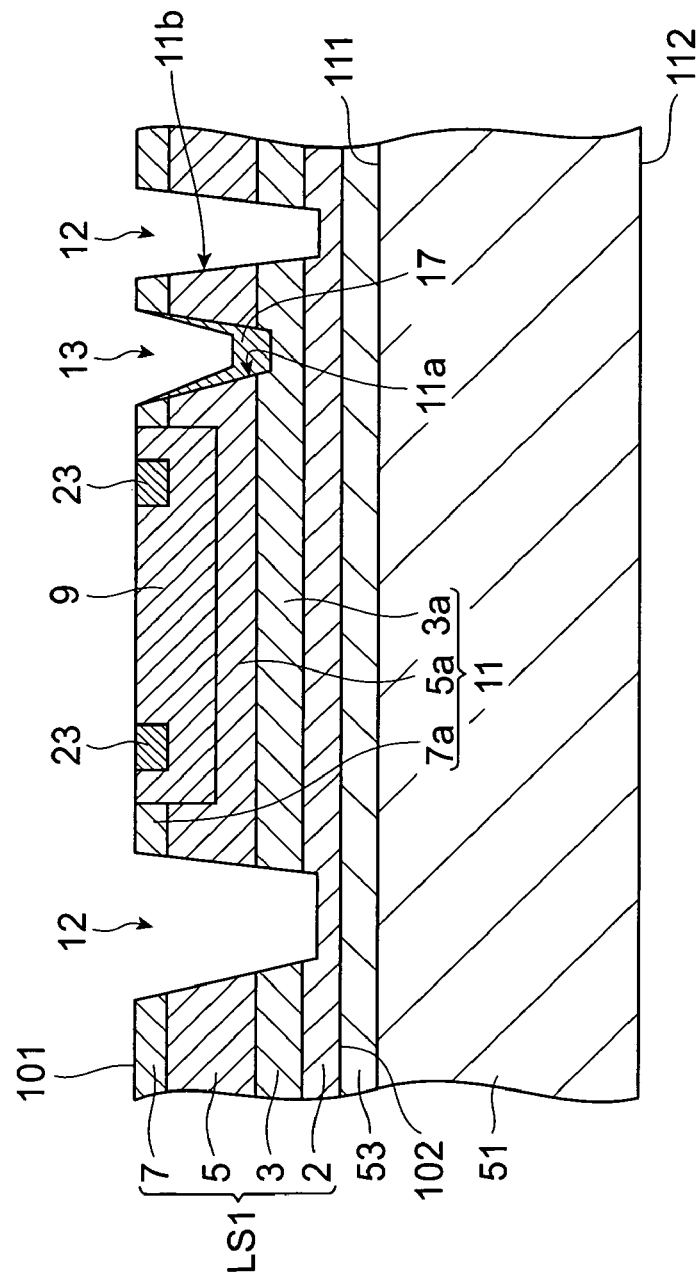
FIG. 7 is a schematic sectional view showing a manufacturing step of the semiconductor photodetector device in accordance with the first embodiment.
Figure 8:
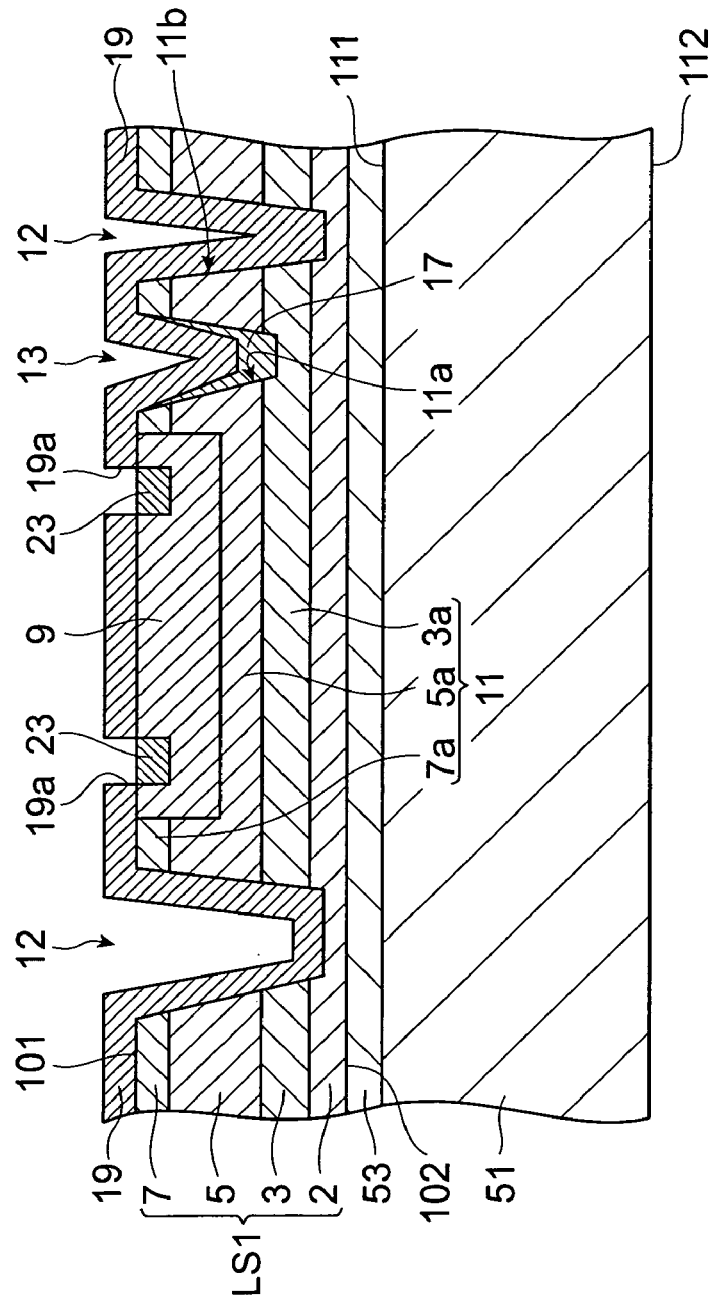
FIG. 8 is a schematic sectional view showing a manufacturing step of the semiconductor photodetector device in accordance with the first embodiment.
Figure 9:
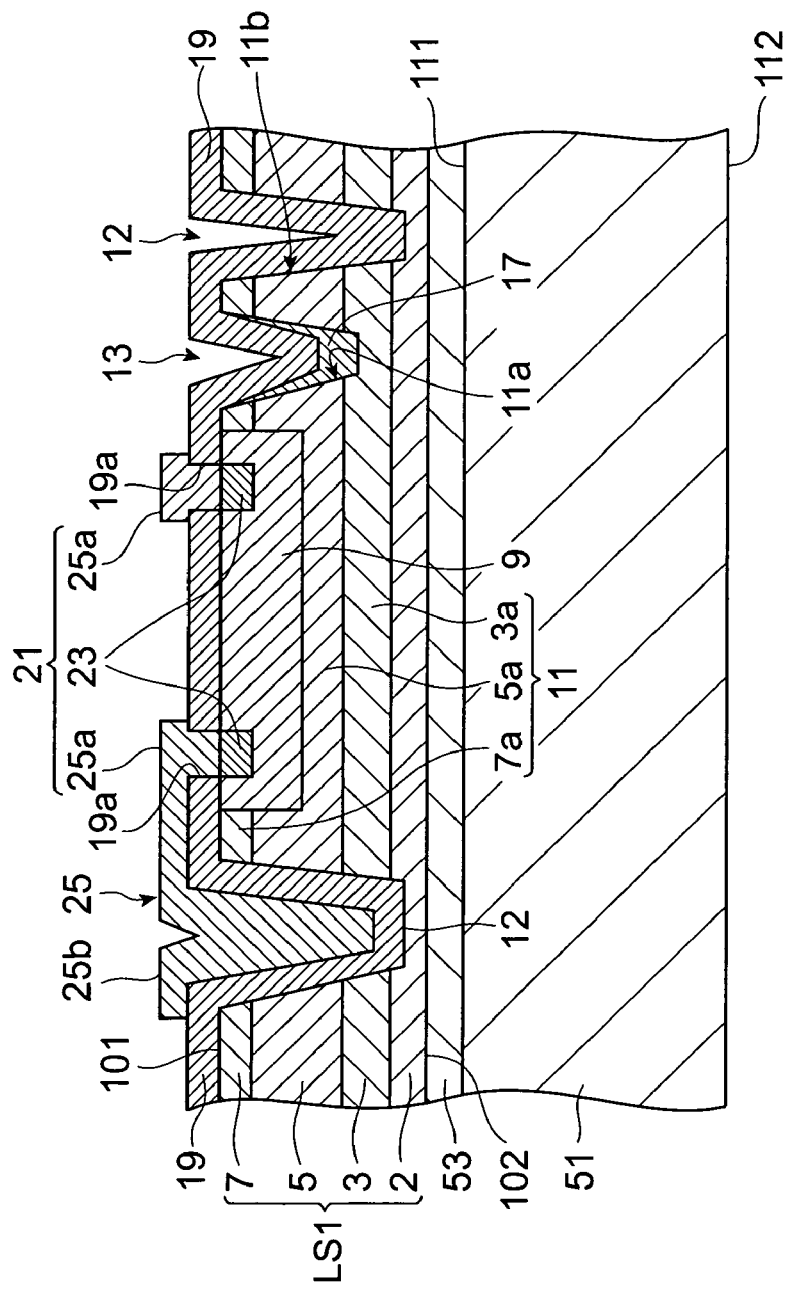
FIG. 9 is a schematic sectional view showing a manufacturing step of the semiconductor photodetector device in accordance with the first embodiment.

FIG. 1 is a schematic plan view showing the semiconductor photodetector device in accordance with a first embodiment. FIG. 2 is a schematic sectional view taken along the line II-II of FIG. 1. FIG. 1 does not depict bump electrodes 41.

A semiconductor photodetector device PD1 comprises a multilayer structure LS1 and a glass substrate 1. The glass substrate 1 has two main faces opposing each other, i.e., front face 121 and rear face 122. The multilayer structure LS1 is provided on the rear face 122 of the glass substrate 1. This semiconductor photodetector device PD1 is a photodetector device of front-illuminated type in which light is incident on the multilayer structure LS1 from the glass substrate 1 side. The semiconductor photodetector device PD1 is a photodetector device for short-distance optical communications in the wavelength band of 0.85 μm, for example.

The multilayer structure LS1 includes an etching stop layer 2, an n-type (first conductive type) high-concentration carrier layer 3, an n-type light-absorbing layer 5, and an n-type cap layer 7. The multilayer structure LS1 has two main faces opposing each other, i.e., front face 101 and rear face 102. A passivation film 19 which will be explained later is formed on the front face 101, whereas an electrically insulating film (passivation film) 20 is formed on the rear face 102. The electrically insulating film 20 is made of $SiN_X$ and has a thickness of about 0.2 μm, for example.

The multilayer structure LS1 has a photodetecting part 11 and a depression 12 surrounding the photodetecting part 11. The photodetecting part 11 includes an n-type high-concentration carrier layer 3a, an n-type light-absorbing layer 5a, and an n-type cap layer 7a, and has a mesa form (a truncated cone form in this embodiment). The photodetecting part 11 has a p-type (second conductive type) photodetecting region 9. The photodetecting region 9 includes at least a part of the cap layer 7a. In this embodiment, the cap layer 7a and light-absorbing layer 5 are partly included in the photodetecting region 9. The top part of the photodetecting part 11 and the photodetecting region 9 are circular as seen in the direction along which light is incident.

At the top part of the photodetecting part 11, a depression 13 is formed on the outside of photodetecting region 9 as seen in the direction along which light is incident. The depression 13 is formed like a groove such as to reach the high-concentration carrier layer 3a and surround the photodetecting region 9. Thus, the photodetecting part 11 includes a mesa-like inner part 11a containing the photodetecting region 9 and an outer part 11b surrounding the inner part 11a. The depression 13 is formed like letter C extending along the edge of the photodetecting region 9 while leaving a portion of the top part of the photodetecting part 11 as seen in the direction along which light is incident.

A contact electrode 17 is arranged on the bottom part of the depression 13. The contact electrode 17 is electrically connected to the high-concentration carrier layer 3a. The contact layer 17 is made of a multilayer body of Au-Ge/Ni/Au, and has a thickness of about 1000 nm. As with the depression 13, the contact electrode 17 is formed like letter C as seen in the direction along which light is incident.

On the front face of the photodetecting part 11, i.e., front face 101 of the multilayer structure LS1, the passivation film 19 is formed so as to cover the photodetecting region 9. The passivation film 19 is made of $SiN_X$, for example. In this embodiment, the passivation film 19 functions as an antireflection film. Therefore, the thickness of the passivation film 19 is set to $\lambda/(4n)$, where n is the refractive index of the passivation film 19, and λ is the received light wavelength. In the case of a photodetector device for short-distance optical communications in the wavelength band of 0.85 μm, for example, the thickness of the passivation film 19 is 1000 to 3000 Å. An antireflection film may be formed separately from the passivation film 19 so as to cover the photodetecting region 9.

The high-concentration carrier layers 3 and 3a are compound semiconductor layers and are made of AlGaAs (where Al composition is 0.3) having a carrier concentration of about $1 \times 10^{18}/cm^3$. The high-concentration carrier layers 3 and 3a have a thickness of about 2 μm.

The light-absorbing layers 5 and 5a are compound semiconductor layers and are made of GaAs having a carrier concentration of about $1 \times 10^{14}/cm^3$, for example. The light-absorbing layers 5 and 5a have a thickness of about 3 μm.

The cap layers 7 and 7a are compound semiconductor layers and are made of AlGaAs (where Al composition ratio is 0.3) having a carrier concentration of about $5 \times 10^{15}/cm^3$, for example. The cap layers 7 and 7a have a thickness of about 0.3 μm. The Al composition ratio in the cap layers 7 and 7a is preferably 0.3 or greater. Though the Al composition ratio x of 0.04 is sufficient for detecting light having a wavelength of 0.85 μm or longer, it will be more preferred if the Al composition ratio is 0.3 or greater. However, the Al composition ratio of the cap layers 7 and 7a can be determined as appropriate according to the wavelength of light to be detected. For detecting short-wavelength light having a wavelength of 0.65 μm, for example, the Al composition ratio of 0.4 or greater is necessary.

The photodetecting region 9 is provided on the front face 101 of the multilayer structure LS1. The photodetecting region 9 is formed by thermally diffusing p-type impurities (e.g., Zn) into a desirable area of the cap layer 7a and inverting this area into p-type. The photodetecting region 9 has a depth of about 0.4 μm and a diameter of 5 to 200 μm. The depression (groove) 13 has a width of about 5 μm. The diameter of received light depends on a property required for the photodetector device and can be designed within a broad range of 1 µm to 10 mm.

A first electrode 21 is arranged on the front face 101 of the multilayer structure LS1. The first electrode 21 includes a contact electrode 23 and an electrode part 25a which will be explained later. The contact electrode 23 is formed like a ring on the front face of the photodetecting region 9, and is electrically connected to the photodetecting region 9. The contact electrode 23 is made of Ti/Pt/Au, and has a thickness of about 1000 nm. The contact layer 23 is arranged so as to be buried in the photodetecting region 9 in the cap layer 7a in FIG. 2, but may be arranged on the cap layer 7a and photodetecting region 9 as well.

A first wiring electrode 25 is electrically connected to the contact electrode 23. The first wiring electrode 25 partly covers the photodetecting part 11 and depression 12, and is arranged on the passivation film 19. The first wiring electrode 25 comprises an electrode part 25a arranged on the top part of the photodetecting part 11 and an electrode part 25b arranged within the depression 12. The first wiring electrode 25 is made of Ti/Pt/Au, and has a thickness of about 1.5 µm. The electrode part 25a positioned on the photodetecting part 11 is arranged on the contact electrode 23 such as to expose at least a part of the photodetecting region 9, and is shaped like a ring. The electrode part 25a is connected to the contact electrode 23 through a contact hole 19a formed in the passivation film 19.

As a second electrode, a first pad electrode 27 is arranged on the rear face 102 of the multilayer structure LS1. The first pad electrode 27 is made of Ti/Pt/Au, and has a thickness of about 1.5 µm. The first pad electrode 27 is electrically connected to the first wiring electrode 25 (electrode part 25b) through a contact hole 29 penetrating through the electrically insulating film 20, etching stop layer 2, and passivation film 19. As a result, the contact electrode 23 is electrically connected to the first pad electrode 27 through the first wiring electrode 25. A bump electrode 41 is arranged on the first pad electrode 27.

A third electrode 31 is arranged on the rear face 102 of the multilayer structure LS1. The third electrode 31 includes a second pad electrode 33 and a second wiring electrode 35. The second pad electrode 33 and second wiring electrode 35 are made of Ti/Pt/Au, and have a thickness of about 1.5 µm. The second pad electrode 33 is electrically connected to the high-concentration carrier layer 3a and contact electrode 17 through a contact hole 37 penetrating through the electrically insulating film 20, etching stop layer 2, and high-concentration carrier layer 3. The second wiring electrode 35 is formed below the rear face of the photodetecting region 9 such as to cover this rear face, and functions as a light-reflecting film. A light-reflecting film may be formed below the photodetecting region 9 separately from the second wiring electrode 35. A bump electrode 41 is arranged on the second pad electrode 33 as in the first pad electrode 27.

The taking out of an electrode from the photodetecting region 9 is realized by the contact electrode 23, first wiring electrode 25, first pad electrode 27, and bump electrode 41. The taking out of an electrode from the high-concentration carrier layer 3a is realized by the contact electrode 17, second pad electrode 33, and bump electrode 41.

A film 10 is formed on the front face 101 of the multilayer structure LS1 so as to cover the photodetecting region 9 and first electrode 21 (the contact electrode 23 and the electrode part 25a of the first wiring electrode 25). The film 10 is made of silicon oxide (SiO) and is optically transparent to incident light. The surface 10a on the side opposite from the multilayer structure LS1 in the film 10 is flattened. The film 10 has a thickness of 3 to 10 µm.

The glass substrate 1 is in contact with and attached to the surface 10a of the film 10. The glass substrate 1 has a thickness of about 0.3 mm and is optically transparent to incident light.

In the following, a method of manufacturing the semiconductor photodetector device PD1 will be explained with reference to FIGS. 3 to 15. FIGS. 3 to 15 are views for explaining this manufacturing method, and show a vertical section of the semiconductor photodetector device PD1. This manufacturing method successively executes the following steps (1) to (13):

Step (1)

First, a semiconductor substrate 51 is prepared. The semiconductor substrate 51 has a thickness of 300 to 500 µm and is made of n-type GaAs having a carrier concentration of about $1 \times 10^{18}/cm^3$, for example. A buffer layer 53 and an etching stop layer 2 are successively grown on one main face (front face) 111 of the semiconductor substrate 51 by hydride vapor-phase growth, chloride vapor-phase growth, metal-organic chemical vapor deposition (MOCVD), molecular beam epitaxy (MBE), or the like, so as to be laminated (see FIG. 3). Thereafter, an n-type high-concentration carrier layer 3, an n-type light-absorbing layer 5, and an n-type cap layer 7 are successively grown on the etching stop layer 2 by hydride vapor-phase growth, chloride vapor-phase growth, MOCVD, MBE, or the like, so as to be laminated (see FIG. 3).

The buffer layer 53 is made of nondoped GaAs and has a thickness of about 0.05 µm. The etching stop layer 2 is made of nondoped AlGaAs (having an Al composition of 0.5) and has a thickness of about 1.0 µm. The etching stop layer 2 is formed so as to be positioned between the semiconductor substrate 51 and high-concentration carrier layer 3. It will be preferred if the etching stop layer 2 has an Al composition ratio of 0.4 or greater. This is because AlGaAs having an Al composition ratio of 0.4 or greater is harder to be etched by an etchant used when etching GaAs which will be explained later.

The foregoing step (1) forms the multilayer structure LS1 and buffer layer 53 on the front face 111 of the semiconductor substrate 51.

Step (2)

Next, a film made of $SiO_2$ or $SiN_X$ is formed on the cap layer 7. Then, the film 55 is patterned, so as to provide an opening 55a at a position to form a photodetecting region 9 (see FIG. 4). Thereafter, using the patterned film 55 as a mask, impurities (e.g., Zn) are thermally diffused into the cap layer 7, so as to invert the conductive type of a portion of the cap layer 7 into p-type. Thus, the photodetecting region 9 is formed near the front face 101 remote from the semiconductor substrate 51 within the multilayer structure LS1 (see FIG. 4). Thereafter, the film 55 is removed by buffered hydrofluoric acid (BHF).

Step (3)

Next, a resist film 56 having an opening 56a at a position to form a depression 13 is formed on the cap layer 7. The resist film 56 can be formed by using photolithography. Then, using the resist film 56 as a mask, etching (wet etching) is performed with a mixed liquid of $Br_2$ and methanol until the high-concentration carrier layer 3 is exposed. This forms the depression 13 (see FIG. 5). Subsequently, the resist film 56 is removed.

Step (4)

Next, a resist film 57 having an opening 57a at a position to form a depression 12 is formed on the cap layer 7. The resist film 57 can be formed by using photolithography. Then, using the resist film 57 as a mask, etching (wet etching) is performed with a mixed liquid of $Br_2$ and methanol until the etching stop layer 2 is exposed, so as to form the depression 12. This forms a photodetecting part 11 in a mesa form (see FIG. 6). Namely, the photodetecting part 11 includes the high-concentration carrier layer 3a, light-absorbing layer 5a, and cap layer 7a. Here, arranging the resist film 57 over the outer part 11b can appropriately regulate the advancing of etching not only in the depth direction but also in lateral directions, which makes it possible to form the depression 13 and photodetecting part 11 properly. As a result, the yield at the time of manufacturing the semiconductor photodetector device PD1 can be made higher. Thereafter, the resist film 57 is removed.

Step (5)

Next, a resist film (not depicted) having an opening at a position corresponding to the depression 13 is formed. Then, on the high-concentration carrier layer 3 (3a) exposed by forming the depression 13, a contact electrode 17 made of Au—Ge/Ni/Au is formed by vapor deposition using this resist film as a mask and liftoff (see FIG. 7). Also, a resist film is formed again such as to have an opening at a position to form a contact electrode 23, and the contact electrode 23 made of Ti/Pt/Au is formed in the photodetecting region 9 by vapor deposition and liftoff while using this resist film as a mask (see FIG. 7). Subsequently, the resist film is removed. The contact electrode 23 is formed so as to be buried in the photodetecting region 9 in the cap layer 7a in FIG. 7, but may be formed on the front face of the cap layer 7a and photodetecting region 9 as well.

Step (6)

Next, a passivation film 19 made of $SiN_X$ is formed on the front face 101 of the multilayer structure LS1 by PCVD. Then, a resist film (not depicted) having openings positioned above the contact electrodes 17, 23 is formed, and a contact hole 19a is formed in the passivation film 19 (see FIG. 8). Subsequently, the resist film is removed.

Step (7)

Next, a resist film (not depicted) having an opening at a position corresponding to a first wiring electrode 25 is formed. Then, using this resist film as a mask, the first wiring electrode 25 made of Ti/Pt/Au is formed by liftoff (see FIG. 9). The above-mentioned steps (6) and (7) form a first electrode 21 on the front face 101 side of the multilayer structure LS1. Subsequently, the resist film is removed. Thereafter, sintering is performed in an $H_2$ atmosphere.

Step (8)

Figure 10:
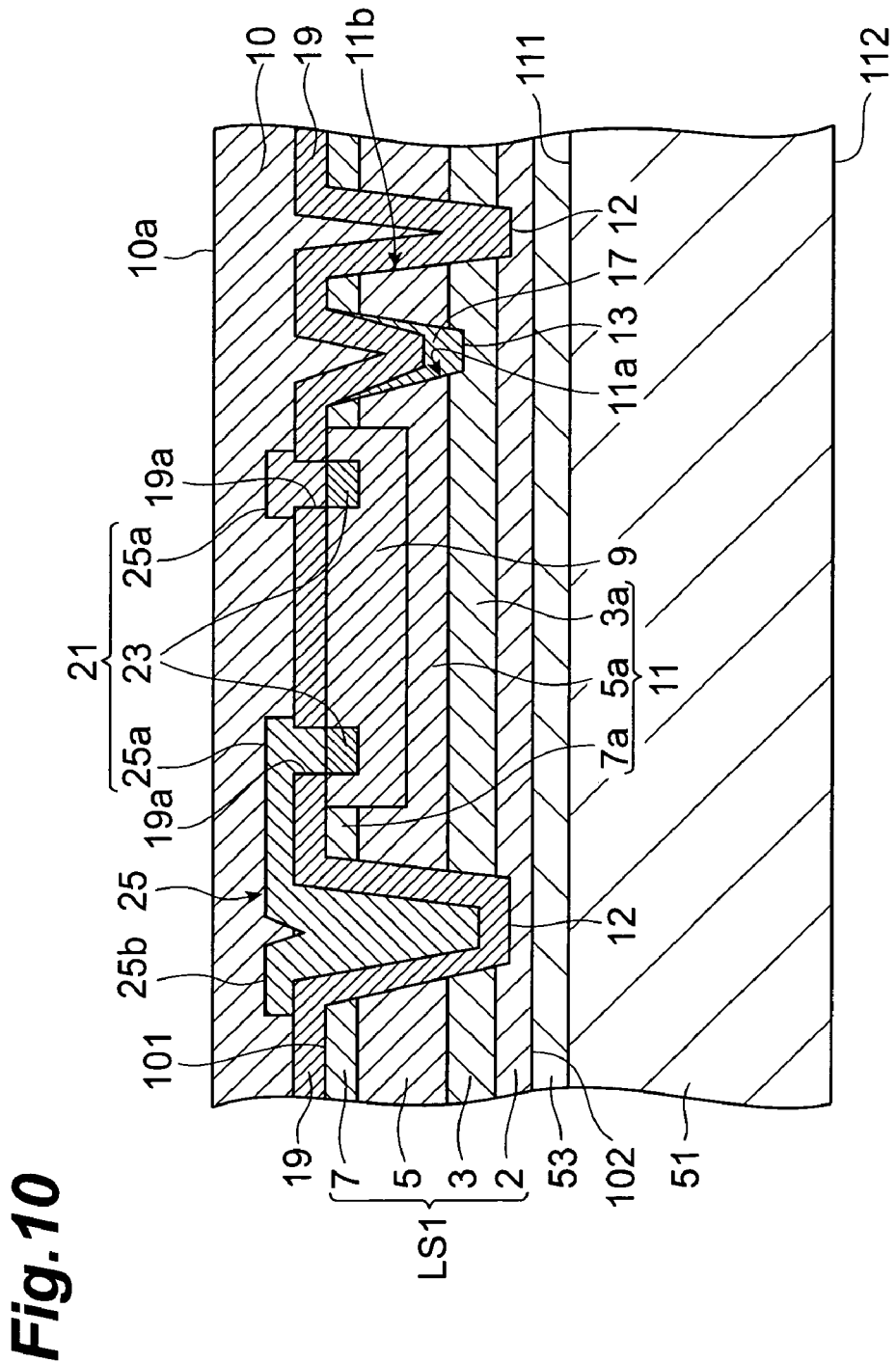
FIG. 10 is a schematic sectional view showing a manufacturing step of the semiconductor photodetector device in accordance with the first embodiment.

Next, a film 10 is formed and flattened oh the front face 101 of the multilayer structure LS1 so as to cover the photodetecting region 9 and first electrode 21 (see FIG. 10). Here, the surface 10a positioned on the side opposite from the multilayer structure LS1 in the film 10 is flattened as a front face of a structure including the multilayer structure LS1 and semiconductor substrate 51. The film 10 can be formed by plasma chemical vapor deposition or coating. Here, "flattened" does not always mean that there are no irregularities at all. Slight irregularities may exist as long as a glass substrate 1 and the film 10 can be fused to each other while a surface of the glass substrate 1 and the surface 10a of the film 10 are in contact with each other when the glass substrate 1 and the semiconductor substrate 51 are pressed and heated while being stacked together with the film 10 interposed therebetween in step (9) which will be explained later.

Step (9)

Figure 11:
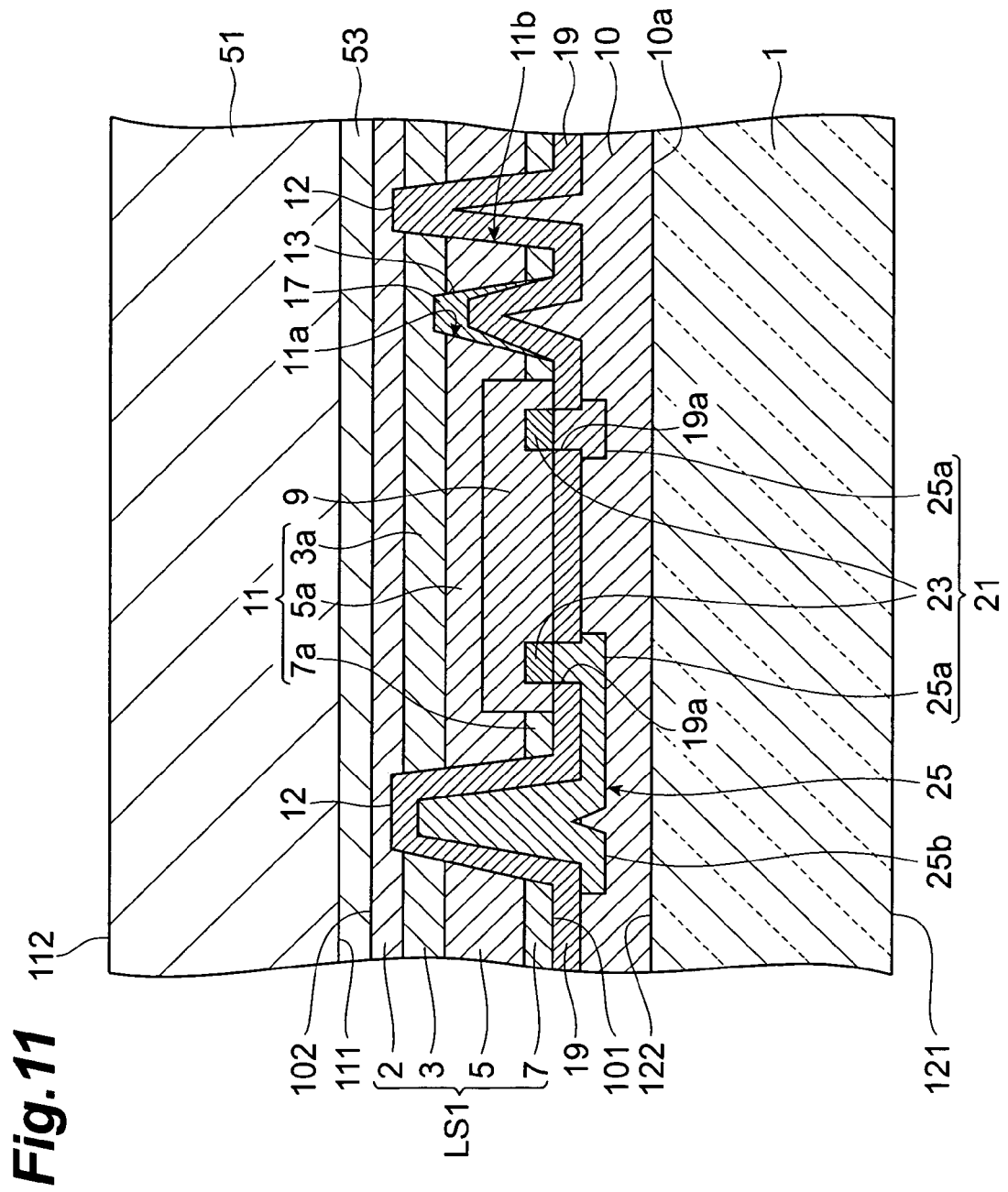
FIG. 11 is a schematic sectional view showing a manufacturing step of the semiconductor photodetector device in accordance with the first embodiment.
Figure 12:
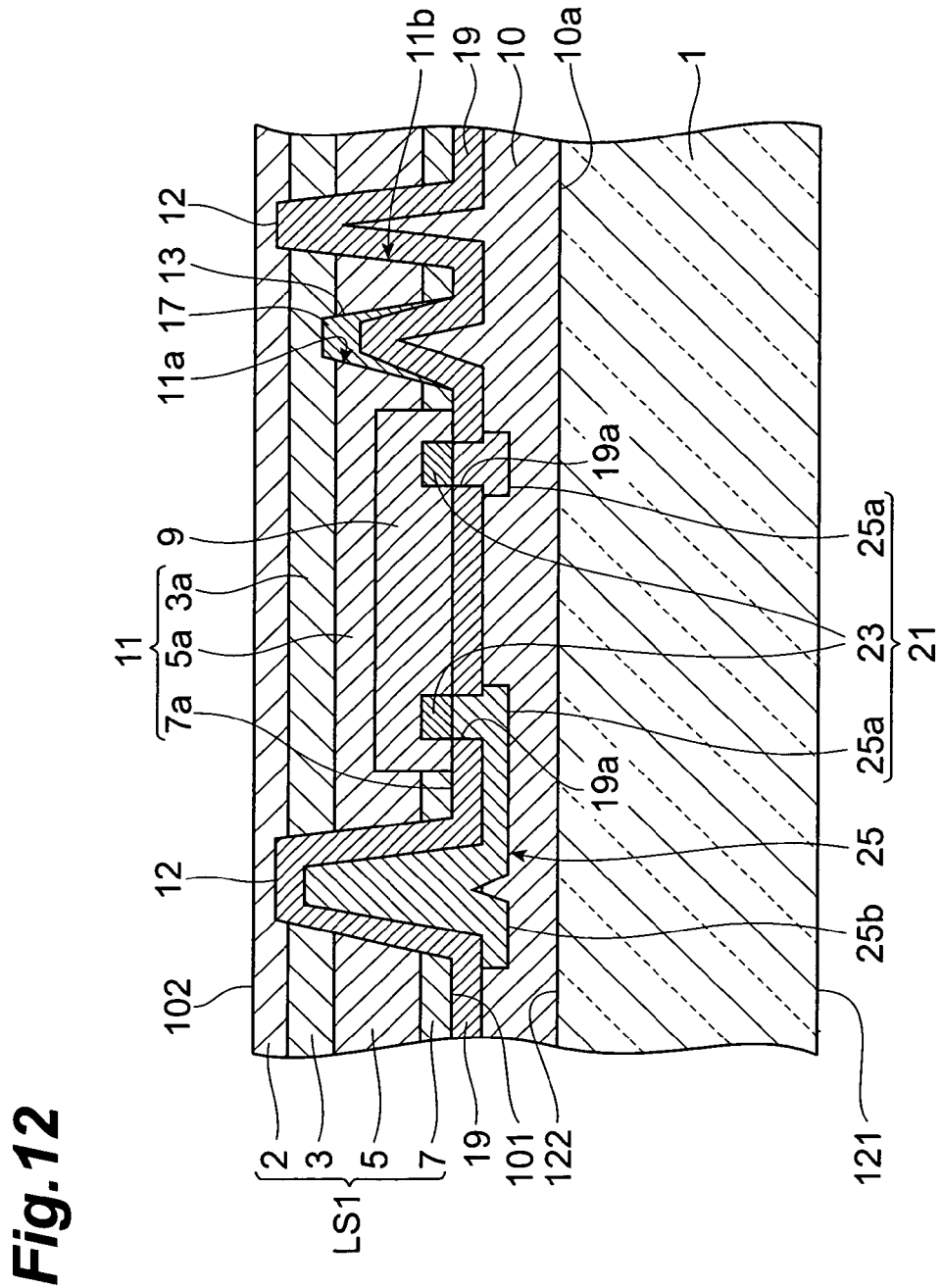
FIG. 12 is a schematic sectional view showing a manufacturing step of the semiconductor photodetector device in accordance with the first embodiment.

Next, the glass substrate 1 is attached to the semiconductor 51 formed with the multilayer structure LS1, buffer layer 53, and film 10 (see FIG. 11). First, the glass substrate 1 is prepared, and one main face (rear face) 122 of the glass substrate 1 is cleaned. Then, the glass substrate 1 and the semiconductor substrate 51 are stacked such that the cleaned rear face 122 of the glass substrate 1 and the surface 10a of the film 10 are in contact with each other. Subsequently, the stacked glass substrate 1 and semiconductor substrate 51 are pressed and heated, so as to attach the glass substrate 1 and film 10 to each other by fusion.

Specifically, it will be preferred if the pressure applied to the stacked glass substrate 1 and semiconductor substrate 51 is about 98 kPa while the heating temperature is 500 to 700° C. Since the uppermost film 10 on the semiconductor substrate 51 is made of silicon oxide, the pressing and heating under such a condition fuses the surface 10a of the film 10 to the rear face 122 of the glass substrate 1, thereby securing the multilayer structure LS1 and semiconductor substrate 51 to the glass substrate 1.

For performing this attaching step, it is desirable that not only the rear face 122 of the glass substrate 1 but also the surface 10a of the film 10 be clean. To this aim, it will be preferred if a contrivance is made such as to perform the fusing operation immediately after taking out the semiconductor substrate 51 from the PCVD apparatus used for forming the film 10, for example.

Preferably, the glass substrate employed has a coefficient of thermal expansion close to that of GaAs. This can minimize the stress occurring between the semiconductor substrate 51 and glass substrate 1 because of the difference between their coefficients of thermal expansion in the cooling step after heating, and thus can suppress the decrease of bonding strength and occurrence of crystal defects due to the stress to the minimum.

Step (10)

Next, the semiconductor substrate 51 is removed. After the multilayer structure LS1 and semiconductor substrate 51 are secured to the glass substrate 1, the main face positioned on the side opposite from the glass substrate 1 in the semiconductor substrate 51, i.e., the rear face 112, is exposed. In this step, etching is performed from the rear face 112 side of the semiconductor substrate 51, so as to remove the semiconductor substrate 51 and buffer layer 53 (see FIG. 12).

Specifically, an etchant exhibiting a lower etching rate to the etching stop layer 2 is used, so as to remove the semiconductor substrate 51 and buffer layer 53. This yields the glass substrate 1 mounted with the multilayer structure LS1. Preferably used as the etchant is a mixed solution ($NH_4OH$:$H_2O_2$=1:5) of aqueous ammonia ($NH_4OH$) and aqueous hydrogen peroxide ($H_2O_2$). First, the glass substrate 1 and semiconductor substrate 51 attached together are dipped into the mixed solution of $NH_4OH$ and $H_2O_2$. This etches the semiconductor substrate 51 from the rear side. When the etching advances to such an extent that the semiconductor substrate 51 and buffer layer 53 are removed, the etching stop layer 2 is exposed in the etchant. The etching stop layer 2 ($Al_{0.5}Ga_{0.5}As$) has a high tolerance to this etchant, whereby its etching rate becomes very low. Therefore, the etching automatically stops at the time when the etching stop layer 2 is exposed. Thus, the semiconductor substrate 51 and buffer layer 53 are removed. The semiconductor substrate 51 and buffer layer 53 may also be removed by chemical mechanical polishing (CMP) instead of etching.

Step (11)

Figure 13:
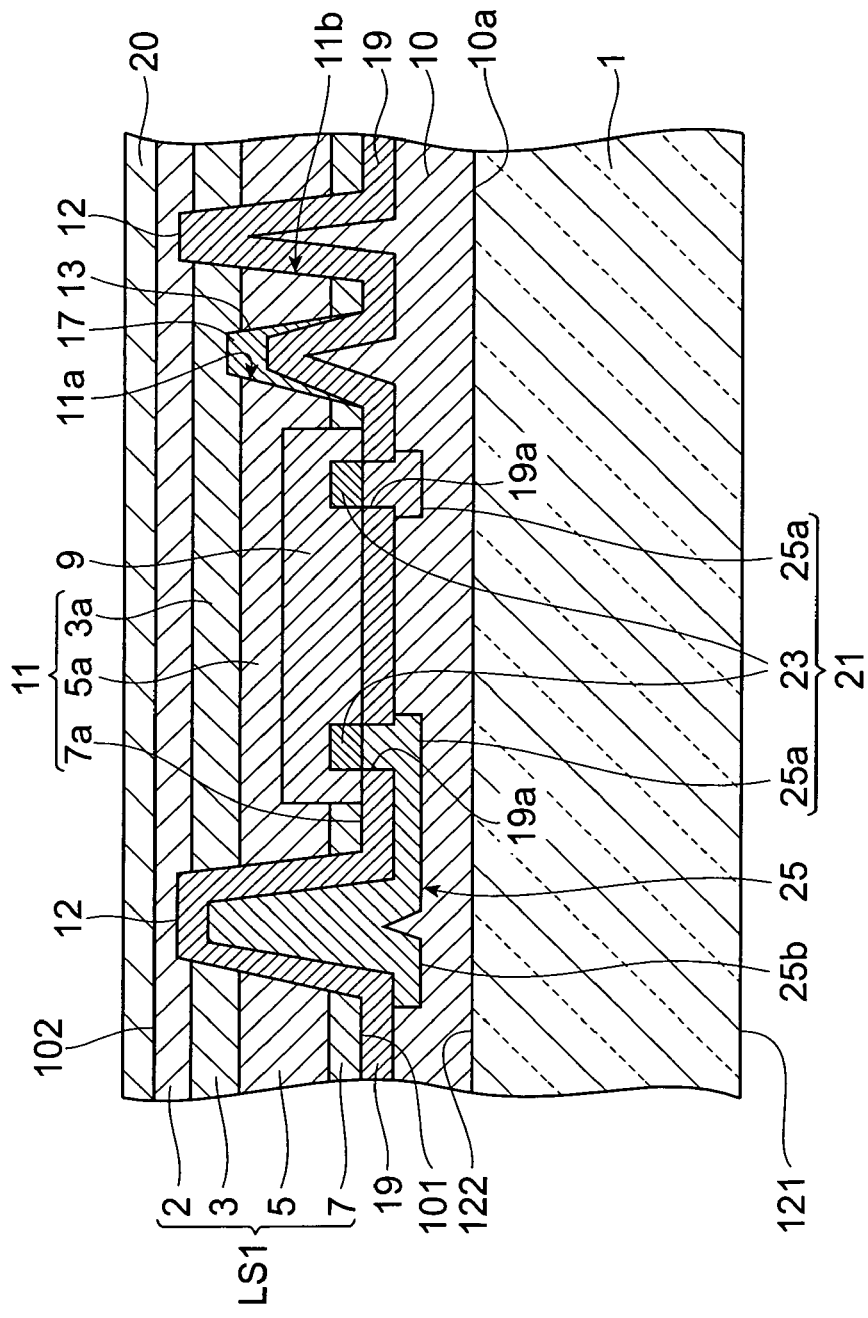
FIG. 13 is a schematic sectional view showing a manufacturing step of the semiconductor photodetector device in accordance with the first embodiment.
Figure 14:
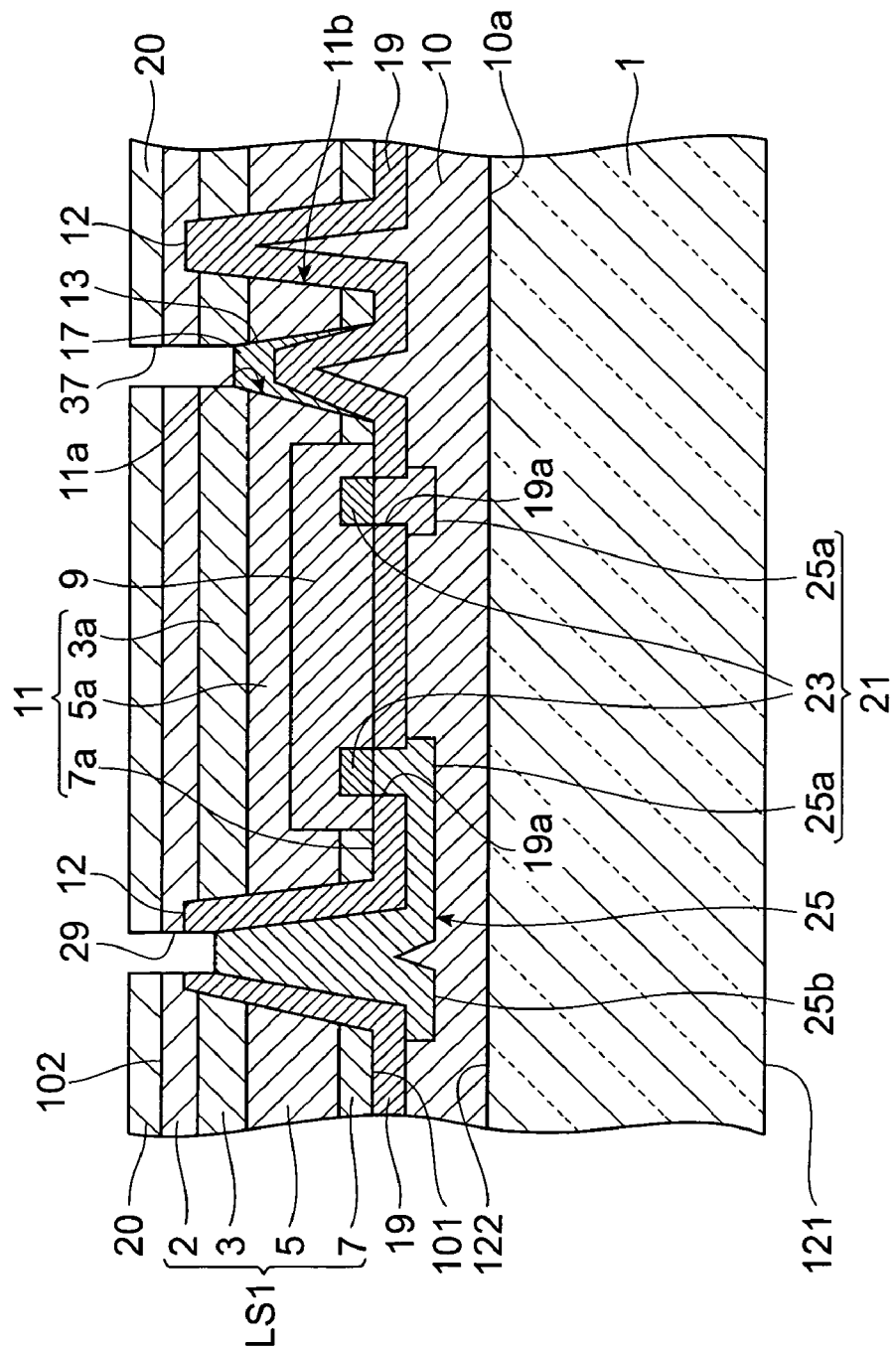
FIG. 14 is a schematic sectional view showing a manufacturing step of the semiconductor photodetector device in accordance with the first embodiment.
Figure 15:
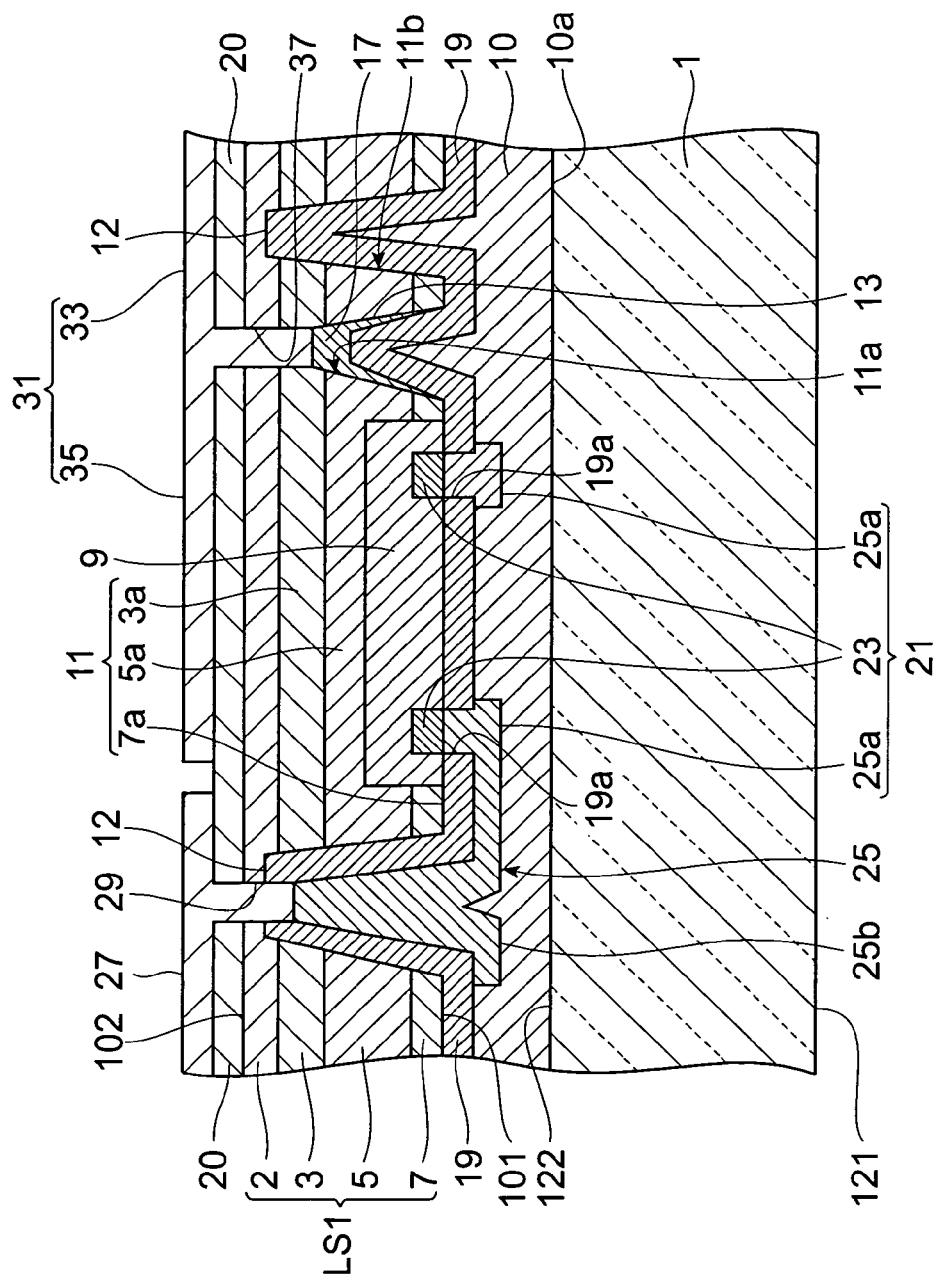
FIG. 15 is a schematic sectional view showing a manufacturing step of the semiconductor photodetector device in accordance with the first embodiment.

Next, an electrically insulating film 20 made of $SiN_X$ is formed on the rear face 102 of the etching stop layer 2 by PCVD (see FIG. 13).

Step (12)

Next, a resist film (not depicted) having an opening at a position to form a contact hole 37 is formed on the electrically insulating film 20. Using this resist film as a mask, the electrically insulating film 20, etching stop layer 2, and high-concentration carrier layer 3 are etched (wet-etched) until the contact electrode 17 is exposed. This forms the contact hole 37 (see FIG. 14). Preferably employed as etchants are buffered hydrofluoric acid (BHF) for the electrically insulating film 20, hydrochloric acid (HCl) for the etching stop layer 2, and a mixed solution ($NH_4OH:H_2O_2=1:5$) of aqueous ammonia ($NH_4OH$) and aqueous hydrogen peroxide ($H_2O_2$) for the high-concentration carrier layer 3. Subsequently, the resist film is removed.

Next, a resist film (not depicted) having an opening at a position to form a contact hole 29 is formed on the electrically insulating film 20. Using this resist film as a mask, the electrically insulating film 20, etching stop layer 2, and passivation film 19 are etched (wet-etched) until the first wiring electrode 25 (electrode part 25b) is exposed. This forms the contact hole 29 (see FIG. 14). Preferably employed as etchants are buffered hydrofluoric acid (BHF) for the electrically insulating film 20, and hydrochloric acid (HCl) for the passivation film 19. Subsequently, the resist film is removed.

Step (13)

Next, a resist film (not depicted) having openings at respective positions corresponding to a first pad electrode 27, a second pad electrode 33, and a second wiring electrode 35 is formed. Then, using this resist film as a mask, the first pad electrode 27, second pad electrode 33, and second wiring electrode 35 made of Ti/Pt/Au are formed by liftoff (see FIG. 15). At this time, the second wiring electrode 35 is formed so as to cover the rear face (the surface on the side opposite from the light-incident surface) of the photodetecting region 9. Here, the second pad electrode 33 and second wiring electrode 35 are formed integrally with each other. Subsequently, the resist film is removed. Thereafter, sintering is performed in an $H_2$ atmosphere. Though the second pad electrode 33 and second wiring electrode 35 are formed integrally with each other, they may be formed separately from each other as well.

These steps (1) to (13) complete the semiconductor photodetector device PD1 having the structure shown in FIGS. 1 and 2.

The bump electrodes 41 can be obtained by forming solder on the first pad electrode (second electrode) 27 and second pad electrode 33 by plating, solder ball mounting, or printing, and then performing reflow. The bump electrodes 41 are not limited to solder, but may be gold bumps, nickel bumps, copper bumps, or conductive resin bumps containing a metal such as conductive filler.

In this embodiment, the mechanical strength of the multilayer structure LS1 (high-concentration carrier layer 3, light-absorbing layer 5, cap layer 7, etc.) is held by the glass substrate 1 and film 10 even when the high-concentration carrier layer 3, light-absorbing layer 5, and cap layer 7 are made thinner. Unlike the conventional semiconductor photodetector devices, there is no need to form a part maintaining the substrate thickness, which makes it easier to reduce the size of the semiconductor photodetector device PD1.

Since the first pad electrode 27 and third electrode 31 (the second pad electrode 33 and second wiring electrode 35) for taking out output signals are arranged on the rear face 102 of the multilayer structure LS1, the semiconductor photodetector device PD1 can be mounted while the rear face 102 (the main face on the side opposite from the front face 101 arranged with the photodetecting region 9) opposes a mounting surface of an external substrate or the like. Therefore, the semiconductor photodetector device PD1 can be mounted easily.

Since the multilayer structure LS1 is secured to the glass substrate 1 by way of the film 10, the glass substrate 1 can be attached to the multilayer structure LS1 without using other adhesives. As with the glass substrate 1, silicon oxide constituting the film 10 is optically transparent to light to be detected. Therefore, the incident light transmitted through the glass substrate 1 can reach the multilayer structure LS1 (photodetecting region 9) without being absorbed by adhesives. This can prevent the sensitivity of photodetection from decreasing.

The photodetecting part 11 has a mesa structure including the high-concentration carrier layer 3a, light-absorbing layer 5a, cap layer 7a, and photodetecting region 9, thereby being separated from its surrounding semiconductor layers. This can further reduce the parasitic capacitance.

The first electrode 21 (the contact electrode 23 and the electrode part 25a of the first wiring electrode 25) is electrically connected to the first pad electrode (second electrode) 27 through the electrode part 25b of the first wiring electrode 25 positioned within the depression 12 formed such as to surround the photodetecting part 11. The third electrode 31 (the second pad electrode 33 and second wiring electrode 35) is electrically connected to the high-concentration carrier layer part 3a included in the photodetecting part 11. Consequently, the electrode part 25b in the depression 12 can be utilized as a part of a through electrode penetrating through the multilayer structure LS1, whereby the through electrode can be formed very easily. Using wet etching as a technique for forming the contact hole 29 can manufacture the semiconductor photodetector device PD1 at low cost with a favorable yield.

Since the electrode is directly drawn from the high-concentration carrier layer 3a of the photodetecting part 11, the series resistance can be reduced greatly in this embodiment.

The second wiring electrode 35 covering the photodetecting region 9 is formed on the rear face 102 of the multilayer structure LS1. Therefore, light having passed the light-absorbing layer 5a without being absorbed is reflected by the second wiring electrode 35, and then is incident on the light-absorbing layer 5a again and absorbed thereby, whereby photosensitivity can further be improved.

In the manufacturing method in accordance with this embodiment, the film 10 covering the photodetecting region 9 and first electrode 21 is formed on the front face 101 of the multilayer structure LS1, the glass substrate 1 is attached to the film 10 such that the surface 10a of the film 10 is in contact with the rear face 122 of the glass substrate 1, and then the semiconductor substrate 51 is removed. This can easily manufacture the semiconductor photodetector device PD1 having a structure in which the glass substrate 1 is attached onto the front face 101 of the multilayer structure LS1 through the film 10.

Since the glass substrate 1 and film 10 remain after removing the semiconductor substrate 51, the mechanical strength of the multilayer structure LS1 is held by the glass substrate 1 and film 10 in subsequent manufacturing steps. Before attaching the glass substrate 1, the semiconductor substrate 51 keeps the mechanical strength of the multilayer structure LS1.

In the step of forming the multilayer structure LS1, the etching stop layer 2 for stopping wet etching is formed between the semiconductor substrate 51 and high-concentration carrier layer 3. Therefore, using etchants which cannot etch the etching stop layer 2 can selectively remove the semiconductor substrate 51. Consequently, the semiconductor substrate 51 can be removed reliably and easily while leaving the high-concentration carrier layer 3, light-absorbing layer 5, and cap layer 7.

Second Embodiment

Figure 16:
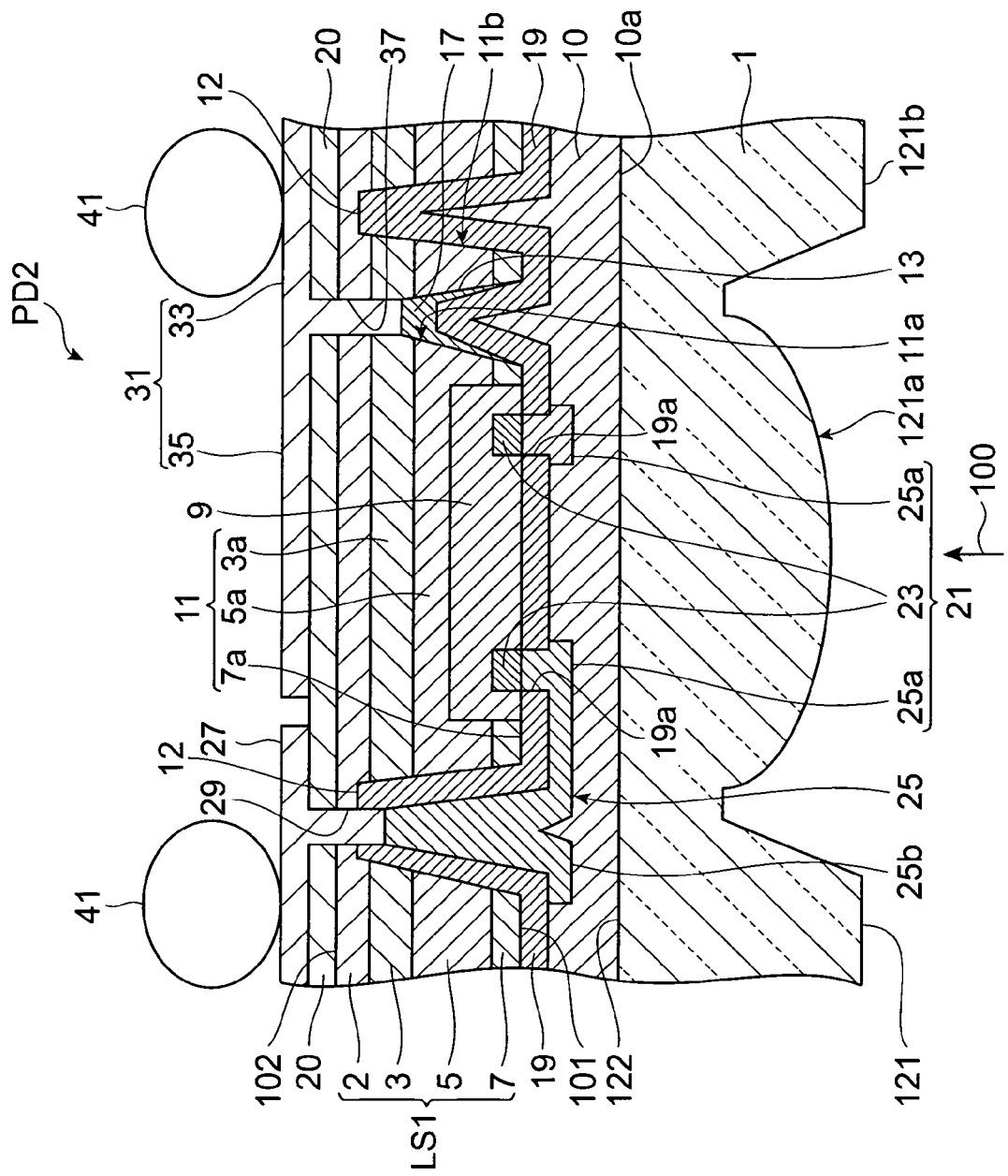
FIG. 16 is a schematic sectional view showing the semiconductor photodetector device in accordance with a second embodiment.

FIG. 16 is a schematic sectional view showing the structure of the semiconductor photodetector device in accordance with a second embodiment. This semiconductor photodetector device PD2 differs from the semiconductor photodetector device PD1 in accordance with the first embodiment in that the glass substrate 1 is formed with a lens part 121a.

The semiconductor photodetector device PD2 comprises a multilayer structure LS1 and the glass substrate 1. This semiconductor photodetector device PD2 is a photodetector device of front-illuminated type in which light is incident on the multilayer structure LS1 from the glass substrate 1 side. The semiconductor photodetector device PD2 is a photodetector device for short-distance optical communications in the wavelength band of 0.85 μm, for example.

The lens part 121a converging incident light is formed on the front face 121 of the glass substrate 1. The other part 121b of the front face 121 is thicker than the lens part 121a. Namely, the lens part 121a is depressed from the thickest part 121b of the front face 121.

Figure 17:
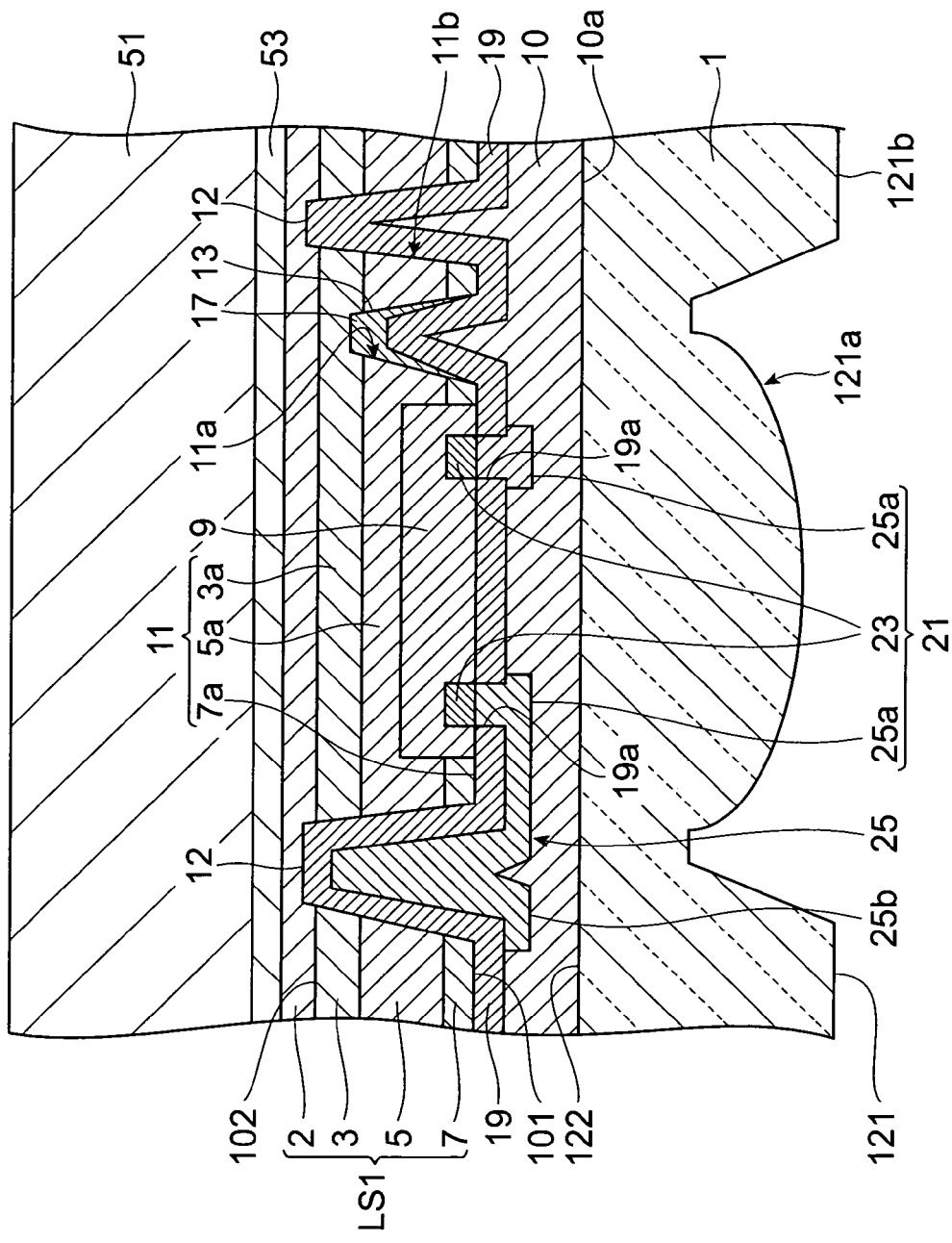
FIG. 17 is a schematic sectional view showing a manufacturing step of the semiconductor photodetector device in accordance with the second embodiment.

Next, a method of manufacturing the semiconductor photodetector device PD2 will be explained with reference to FIG. 17. FIG. 17 is a view for explaining this manufacturing method, and shows a vertical section of the semiconductor photodetector device PD2.

This manufacturing method successively executes the following steps (1) to (13). Steps (1) to (8) are the same as steps (1) to (8) in the first embodiment, and thus will not be explained.

Step (9)

Next, the glass substrate 1 is attached to the semiconductor substrate 51 formed with the multilayer structure LS1, buffer layer 53, and film 10 (see FIG. 17). The attaching method is the same as that in step (9) in the first embodiment. Specifically, the glass substrate 1 having the front face 121 formed with the lens part 121a is prepared, and the rear face 122 of the glass substrate 1 is cleaned. Then, the glass substrate 1 and the semiconductor substrate 51 are stacked together such that the cleaned rear face 122 and the surface 10a remote from the multilayer structure LS1 in the film 10 are in contact with each other. Subsequently, the stacked glass substrate 1 and semiconductor substrate 51 are pressed and heated, so that the glass substrate 1 and film 10 are attached together by fusion. Details of this attaching method are the same as those in step (9) in the first embodiment.

The alignment between the photodetecting region 9 on the semiconductor substrate 51 and the lens part 121a on the glass substrate 1 can easily be effected with reference to a marker provided on the rear face 122 side of the glass substrate 1 by providing the marker and using a double-sided aligner. Instead of providing the marker, the outer shape of the lens part 121a may be utilized as a marker.

Steps (10) to (13) are the same as steps (10) to (13) in the first embodiment, and thus will not be explained here. These steps (1) to (13) complete the semiconductor photodetector device PD2 having the structure shown in FIG. 16.

In this embodiment, as in the above-mentioned first embodiment, the mechanical strength of the multilayer structure LS1 (laminated high-concentration carrier layer 3, light-absorbing layer 5, and cap layer 7) is held by the glass substrate 1 and film 10, while the semiconductor photodetector device PD2 is easily made smaller. Also, the semiconductor photodetector device PD2 can be mounted easily.

Since the glass substrate 1 is provided with the lens part 121a, the incident light can be received efficiently even when the photodetecting region 9 is smaller than the illuminating area of the incident light. As a result, the semiconductor photodetector device PD2 with an excellent S/N ratio and high reliability can be obtained.

In this embodiment, the lens part 121a is formed as being depressed from the thickest part 121b in the front face 121 of the glass substrate 1. Therefore, the glass substrate 1 formed with the lens part 121a can easily be attached to the multilayer structure LS1. Since the lens part 121a can be processed before being attached, the processing method is less likely to be limited, whereby a higher degree of freedom is attained in terms of lens designing such as lens forms.

The lens part 121a may be formed after attaching the glass substrate 1 to the semiconductor substrate 51 mounted with the multilayer structure LS1 and film 10. When the degree of freedom in lens designing is concerned, however, it will be preferred if the glass substrate 1 having the lens part 121a formed beforehand therewith is attached to the semiconductor substrate 51.

Third Embodiment

Figure 18:
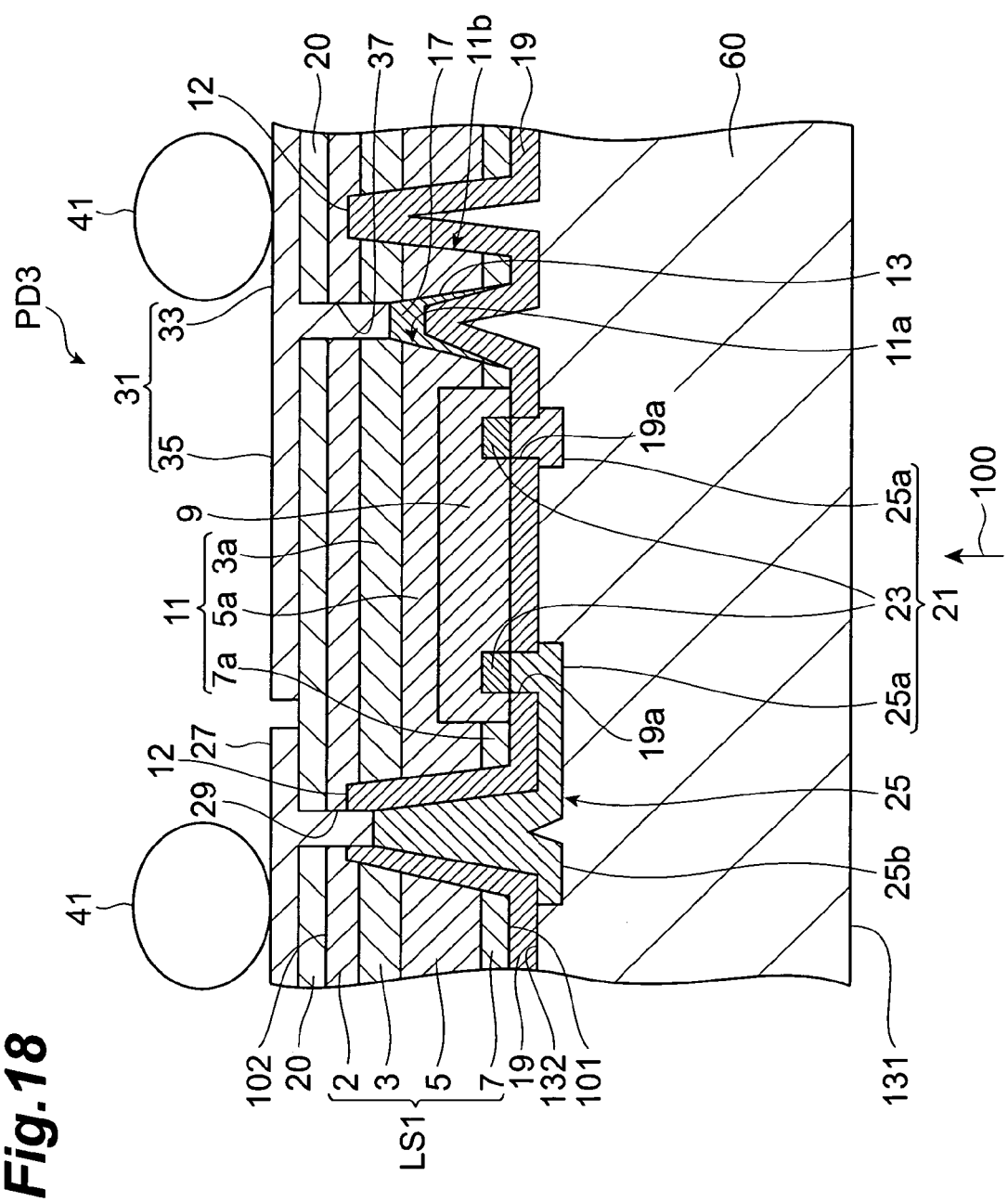
FIG. 18 is a schematic sectional view showing the semiconductor photodetector device in accordance with a third embodiment.

FIG. 18 is a schematic sectional view showing the structure of the semiconductor photodetector device in accordance with a third embodiment. This semiconductor photodetector device PD3 differs from the semiconductor photodetector device PD1 in accordance with the first embodiment in that it has a film made of silicon oxide ($SiO_2$) or a resin instead of the glass substrate 1 and film 10.

The semiconductor photodetector device PD3 comprises the multilayer structure LS1 and a film 60. The film 60 has two main faces opposing each other, i.e., front face 131 and rear face 132. The multilayer structure LS1 is provided on the rear face 132 of the film 60. This semiconductor photodetector device PD3 is a photodetector device of front-illuminated type in which light is incident on the multilayer structure LS1 from the film 60 side. The semiconductor photodetector device PD3 is a photodetector device for short-distance optical communications in the wavelength band of 0.85 μm, for example.

On the front face 101 of the multilayer structure LS1, the film 60 is formed such as to cover the photodetecting region 9 and the first electrode 21 (the contact electrode 23 and the electrode part 25a of the first wiring electrode 25). The film 60 is made of silicon oxide or a resin (e.g., polyimide resin, PMMA, or epoxy resin). The film 60 has a thickness of about 50 μm and is optically transparent to incident light.

Figure 19:
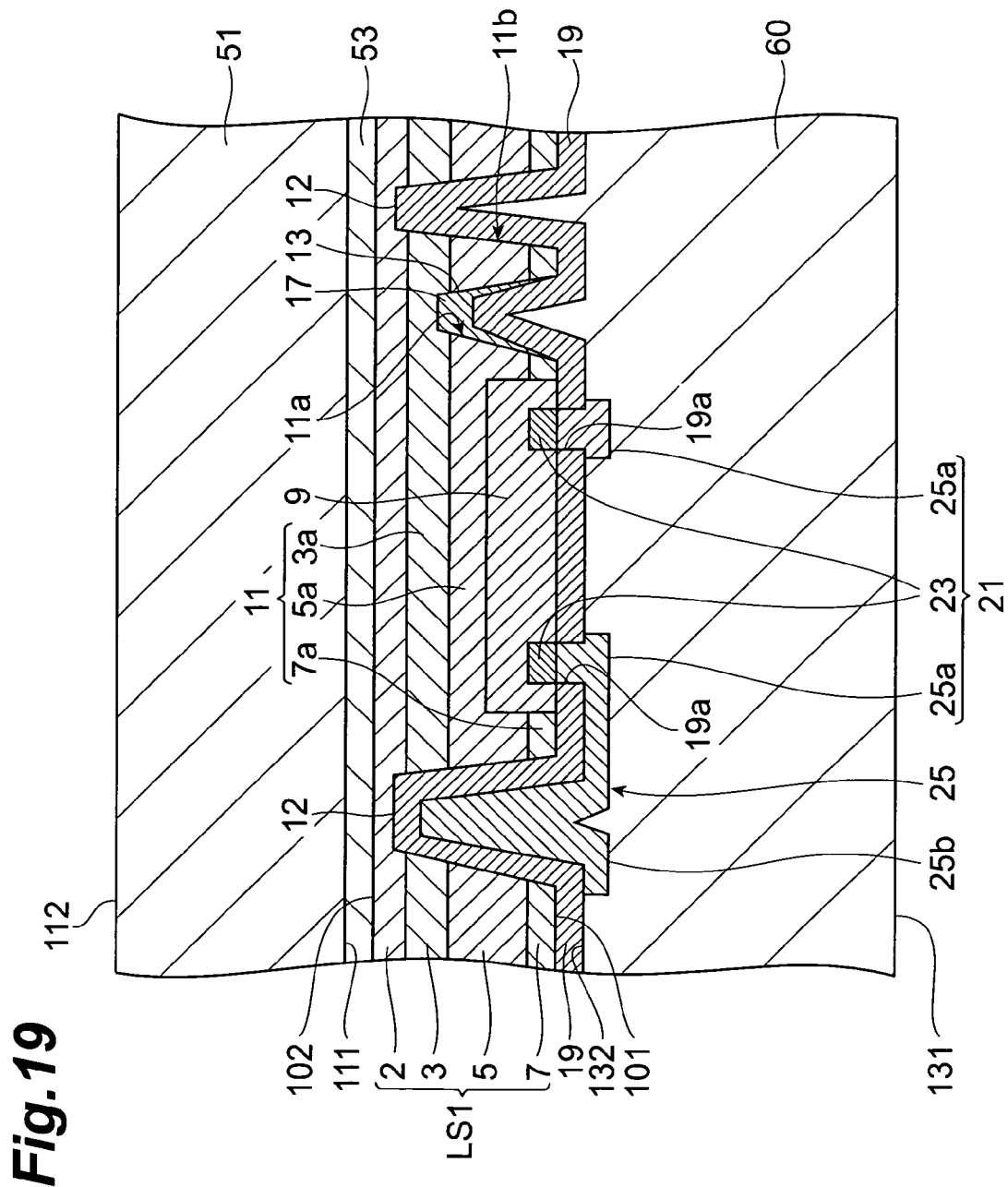
FIG. 19 is a schematic sectional view showing a manufacturing step of the semiconductor photodetector device in accordance with the third embodiment.
Figure 20:
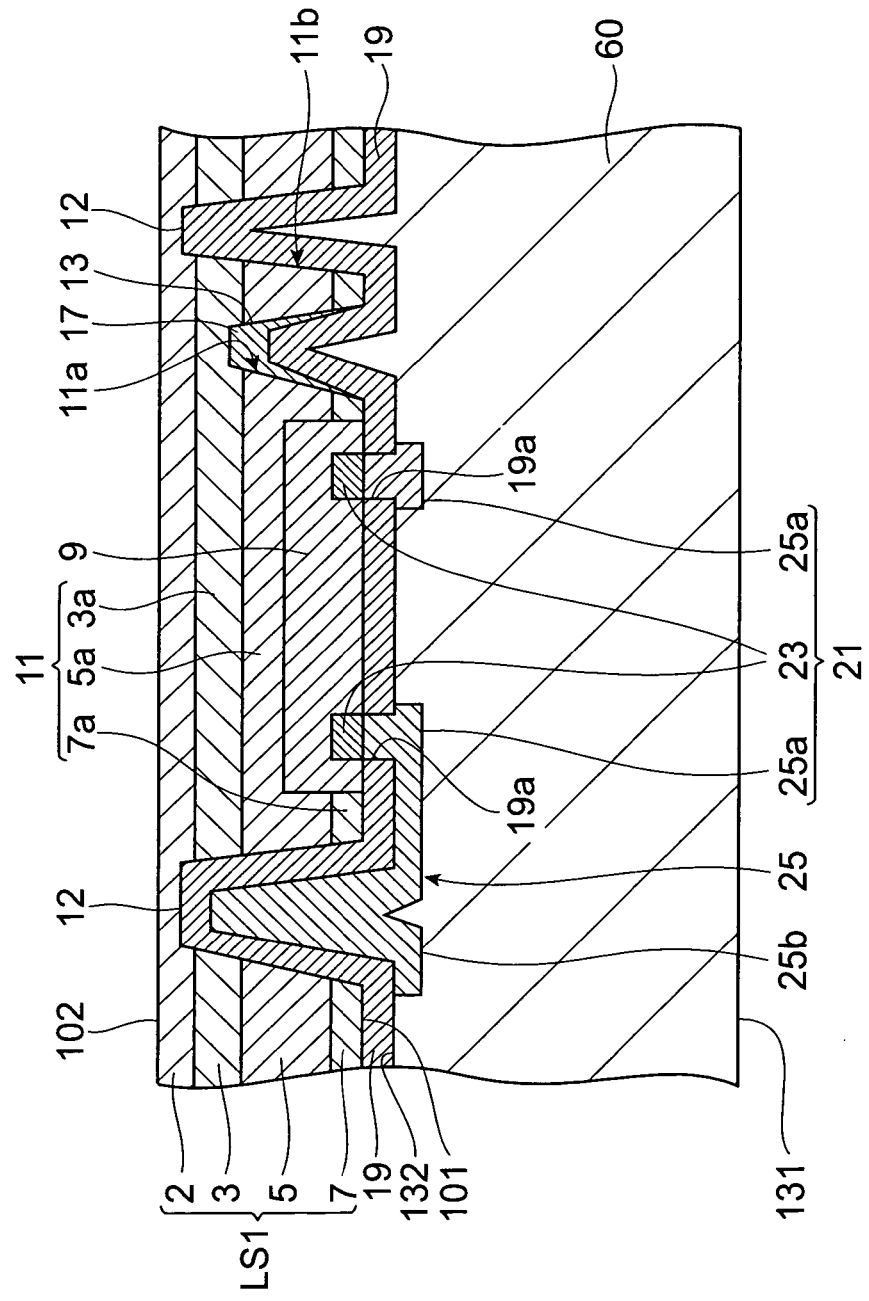
FIG. 20 is a schematic sectional view showing a manufacturing step of the semiconductor photodetector device in accordance with the third embodiment.

A method of manufacturing the semiconductor photodetector device PD3 will now be explained with reference to FIGS. 19 and 20. FIGS. 19 and 20 are views for explaining this manufacturing method, and show a vertical section of the semiconductor photodetector device PD3.

This manufacturing method successively executes the following steps (1) to (12). Steps (1) to (7) are the same as steps (1) to (7) in the first embodiment, and thus will not be explained.

Step (8)

Next, the film 60 is formed on the front face 101 side of the multilayer structure LS1 such as to cover the photodetecting region 9 and first electrode 21 (see FIG. 19). When the film 60 is made of silicon oxide, PCVD employing TEOS (Tetraethylorthosilicate) as a film-forming gas for forming a silicon oxide film ($SiO_2$) can be used for forming the film 60, for example. When the film 60 is made of a resin, on the other hand, coating can be used for forming the film 60, for example.

Step (9)

Next, the semiconductor substrate 51 is removed. After forming the film 60, the rear face 112 positioned on the side opposite from the film 60 in the semiconductor substrate 51 is exposed. In this step, the semiconductor substrate 51 and buffer layer 53 are removed by etching from the rear face 112 side of the semiconductor substrate 51 (see FIG. 20). The method of etching the semiconductor substrate 51 and buffer layer 53 is the same as the etching method in step (10) in the first embodiment.

Steps (10) to (12) are the same as steps (11) to (13) in the first embodiment, and thus will not be explained here. These steps (1) to (12) complete the semiconductor photodetector device PD3 having the structure shown in FIG. 18.

In this embodiment, as in the above-mentioned first embodiment, the mechanical strength of the multilayer structure LS1 (laminated high-concentration carrier layer 3, light-absorbing layer 5, and cap layer 7) is held by the film 60, while the semiconductor photodetector device PD3 is easily made smaller. Also, the semiconductor photodetector device PD3 can be mounted easily.

Fourth Embodiment

Figure 21:
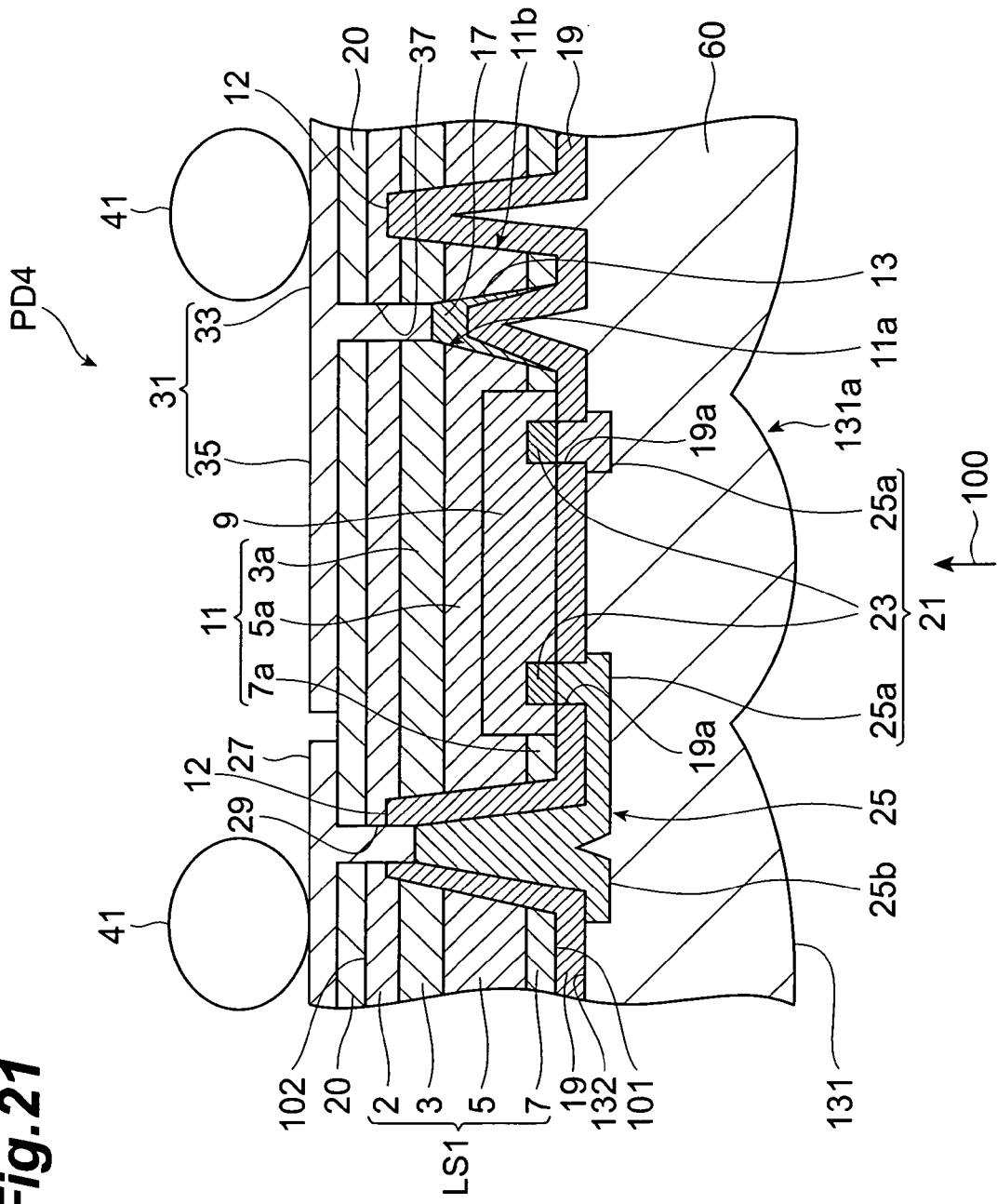
FIG. 21 is a schematic sectional view showing the semiconductor photodetector device in accordance with a fourth embodiment.

FIG. 21 is a schematic sectional view showing the structure of the semiconductor photodetector device in accordance with a fourth embodiment. This semiconductor photodetector device PD4 differs from the semiconductor photodetector device PD3 in accordance with the third embodiment in that the film 60 is formed with a lens part 131a.

The semiconductor photodetector device PD4 comprises the multilayer structure LS1 and the film 60. This semiconductor photodetector device PD4 is a photodetector device of front-illuminated type in which light is incident on the multilayer structure LS1 from the film 60 side. The semiconductor photodetector device PD4 is a photodetector device for short-distance optical communications in the wavelength band of 0.85 µm, for example.

Figure 22:
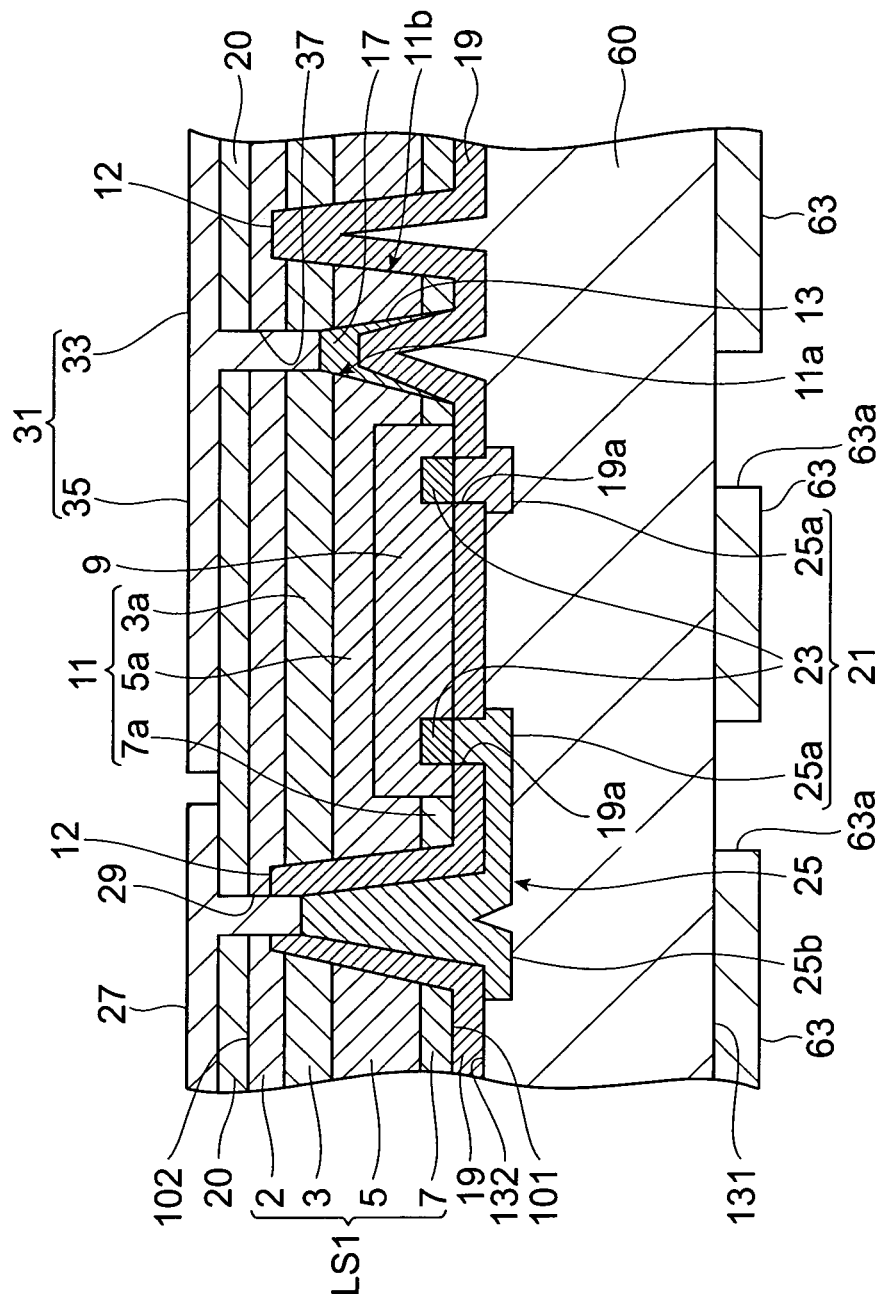
FIG. 22 is a schematic sectional view showing a manufacturing step of the semiconductor photodetector device in accordance with the fourth embodiment.
Figure 23:
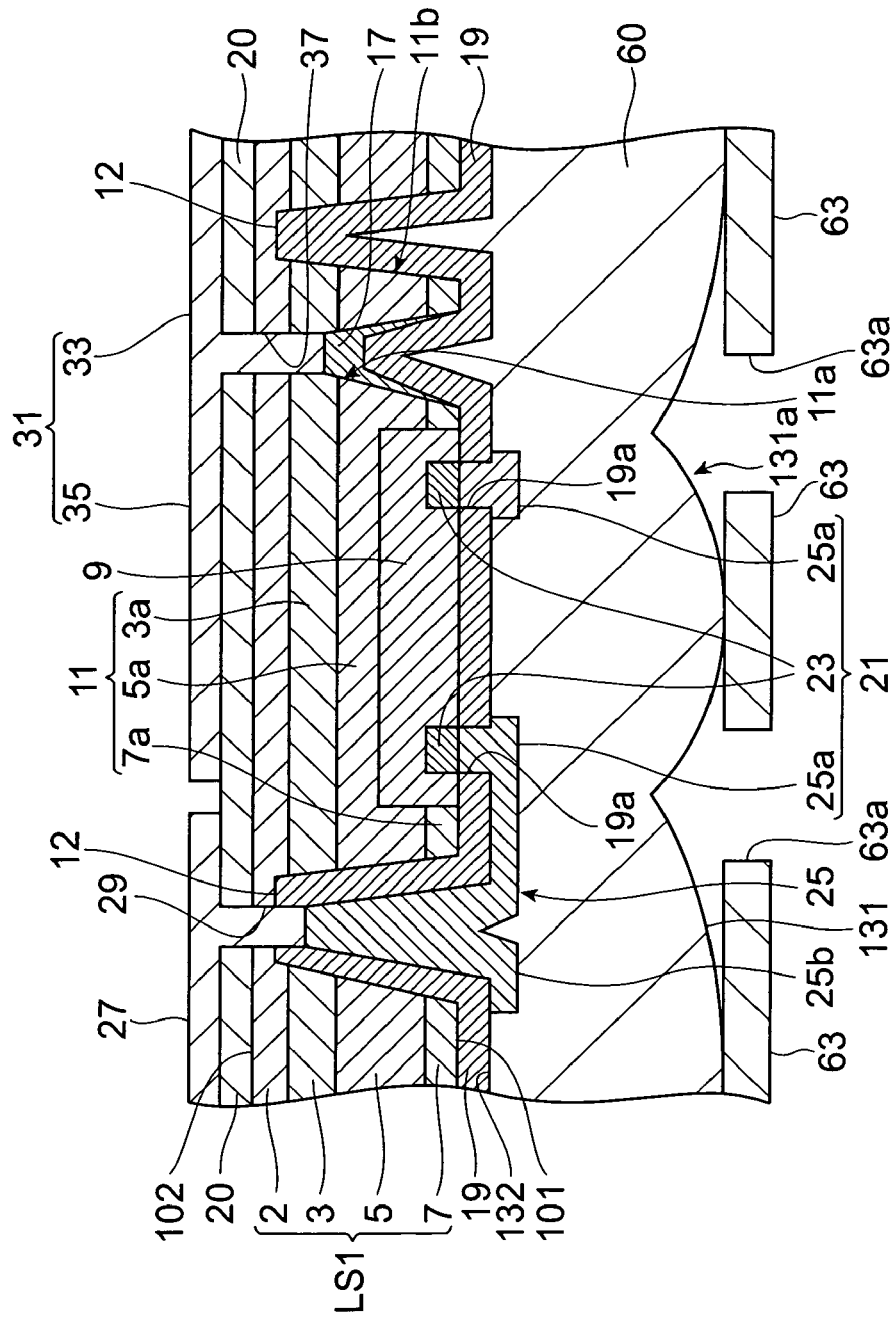
FIG. 23 is a schematic sectional view showing a manufacturing step of the semiconductor photodetector device in accordance with the fourth embodiment.

The front face 131 of the film 60 is formed with the lens part 131a converging incident light. The lens part 131a can be formed by wet etching. For example, as shown in FIG. 22, a resist film 63 having an opening 63a at a desirable position is formed on the front face 131 of the film 60. Then, as shown in FIG. 23, the film 60 is wet-etched while using the resist film 63 as a mask. Since etching proceeds isotropically in the wet etching, the lens part 131 having a lens effect is formed when the opening 63a of the resist film 63 and the photodetecting region 9 are appropriately aligned to each other.

In this embodiment, as in the above-mentioned first embodiment, the mechanical strength of the multilayer structure LS1 (laminated high-concentration carrier layer 3, light-absorbing layer 5, and cap layer 7) is held by the film 60, while the semiconductor photodetector device PD4 is easily made smaller. Also, the semiconductor photodetector device PD4 can be mounted easily.

Since the film 60 is provided with the lens part 131a, the incident light can be received efficiently even when the photodetecting region 9 is smaller than the illuminating area of the incident light. As a result, the semiconductor photodetector device PD4 with an excellent S/N ratio and high reliability can be obtained.

Fifth Embodiment

Figure 24:
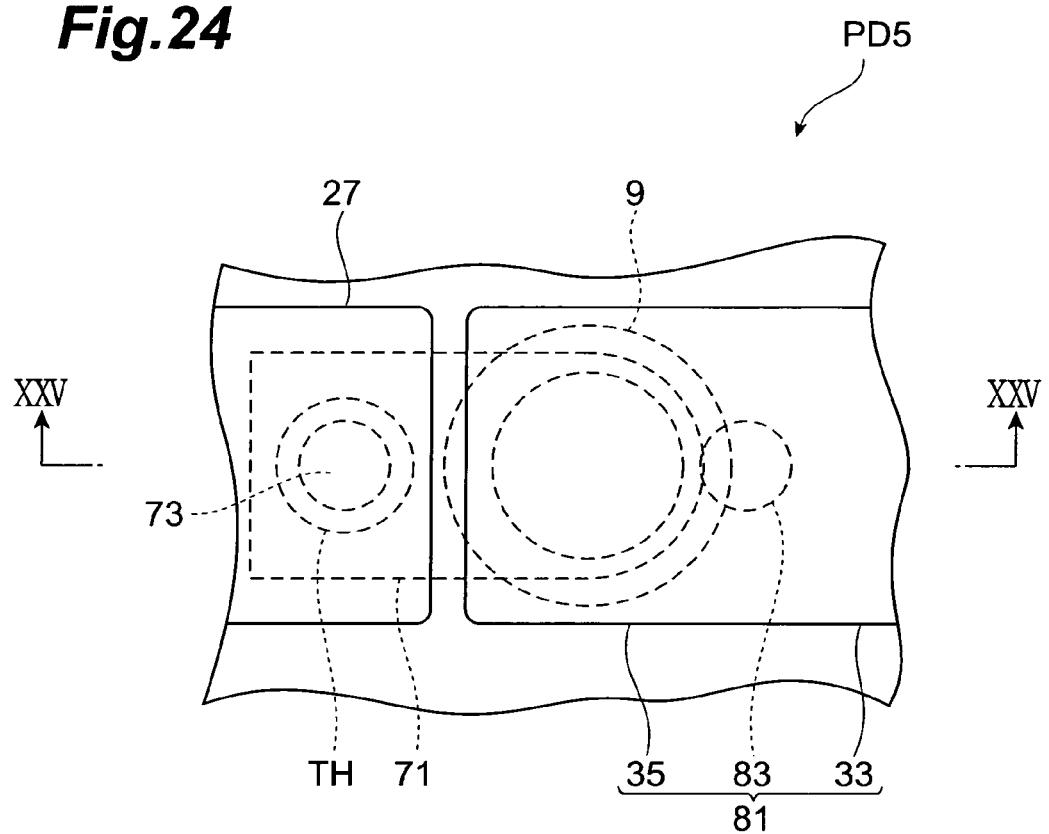
FIG. 24 is a schematic plan view showing the semiconductor photodetector device in accordance with a fifth embodiment.
Figure 25:
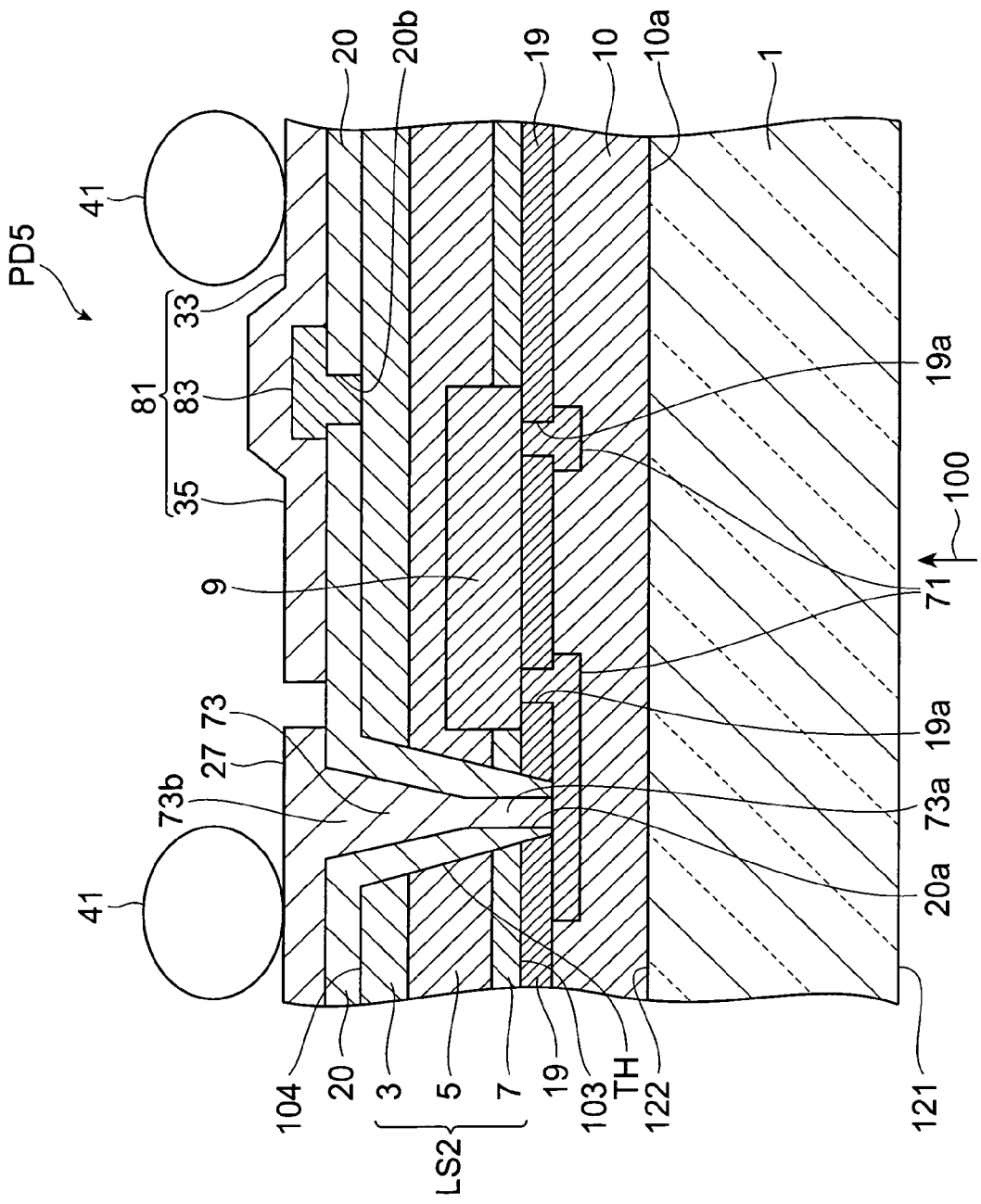
FIG. 25 is a schematic sectional view taken along the line XXV-XXV of the semiconductor photodetector device shown in FIG. 24.

FIG. 24 is a schematic plan view showing the semiconductor photodetector device in accordance with a fifth embodiment. FIG. 25 is a schematic sectional view taken along the line XXV-XXV of FIG. 24. FIG. 24 does not depict bump electrodes 41.

A semiconductor photodetector device PD5 comprises a multilayer structure LS2 and a glass substrate 1. The multilayer structure LS2 is provided on the rear face 122 of the glass substrate 1. This semiconductor photodetector device PD5 is a photodetector device of front-illuminated type in which light is incident on the multilayer structure LS2 from the glass substrate 1 side. The semiconductor photodetector device PD5 is a photodetector device for short-distance optical communications in the wavelength band of 0.85 µm, for example.

The multilayer structure LS2 includes an n-type (first conductive type) high-concentration carrier layer 3, an n-type light-absorbing layer 5, and an n-type cap layer 7. The multilayer structure LS2 has two main faces opposing each other, i.e., front face 103 and rear face 104. The cap layer 7a is formed with a p-type (second conductive type) photodetecting region 9. A passivation film 19 is formed on the front face 103 of the multilayer structure LS2. An electrically insulating film 20 is formed on the rear face 104 of the multilayer structure LS2.

On the front face 103 of the multilayer structure LS2, a contact electrode 71 as a first electrode is arranged on the passivation film 19. The contact electrode 71 passes through a contact hole 19a formed in the passivation film 19, so as to be electrically connected to the photodetecting region 9. The contact electrode 71 is made of Ti/Pt/Au and has a thickness of about 1.5 µm.

The multilayer structure LS2 is formed with a through hole TH extending from the front face 103 to the rear face 104. The electrically insulating film 20 also extends onto the wall face of the multilayer structure LS2 defining the through hole TH. A through lead 73 is provided inside of the electrically insulating film 20 within the through hole TH. One end part 73a of the through lead 73 passes through a contact hole 20a formed in the electrically insulating film 20, so as to be electrically connected to the contact electrode 71.

A first pad electrode 27 (second electrode) and a third electrode 81 are arranged on the rear face 104 of the multilayer structure LS2. The first pad electrode 27 is formed such as to cover the through lead 73, and is electrically connected to an end part 73b on the side opposite from the end part 73a in the through lead 73. A bump electrode 41 is arranged on the first pad electrode 27. The taking out of electrodes from the photodetecting region 9 is realized by the contact electrode 71, through lead 73, first pad electrode 27, and bump electrode 41.

The third electrode 81 includes a contact electrode 83, a second pad electrode 33, and a second wiring electrode 35. The contact electrode 83 passes through a contact hole 20b formed in the electrically insulating film 20, so as to be electrically connected to the high-concentration carrier layer 3. The second pad electrode 33 and second wiring electrode 35 are formed so as to cover the contact electrode 83, and are electrically connected to the contact electrode 83. A bump electrode 41 is arranged on the second pad electrode 33 as in the first pad electrode 27. The taking out of an electrode from the high-concentration carrier layer 3 is realized by the contact electrode 83, second pad electrode 33, and bump electrode 41.

The second wiring electrode 35 is formed below the rear face of the photodetecting region 9 such as to cover this rear face, and functions as a light-reflecting film. A light-reflecting film may be formed below the photodetecting region 9 separately from the second wiring electrode 35.

A film 10 is formed on the front face 103 side of the multilayer structure LS2 so as to cover the photodetecting region 9 and contact electrode 71. The glass substrate 1 is in contact with and attached to the surface 10a on the side opposite from the multilayer structure LS2 in the film 10. The glass substrate 1 has a thickness of about 0.3 mm, and is optically transparent to incident light.

In the following, a method of manufacturing the semiconductor photodetector device PD5 will be explained with reference to FIGS. 26 to 32. FIGS. 26 to 32 are views for explaining the method of manufacturing the semiconductor photodetector device PD5, and show a vertical section of the semiconductor photodetector device PD5.

This manufacturing method successively executes the following steps (1) to (10). Steps (1) and (2) are the same as steps (1) and (2) in the first embodiment, and thus will not be explained.

Step (3)

Figure 26:
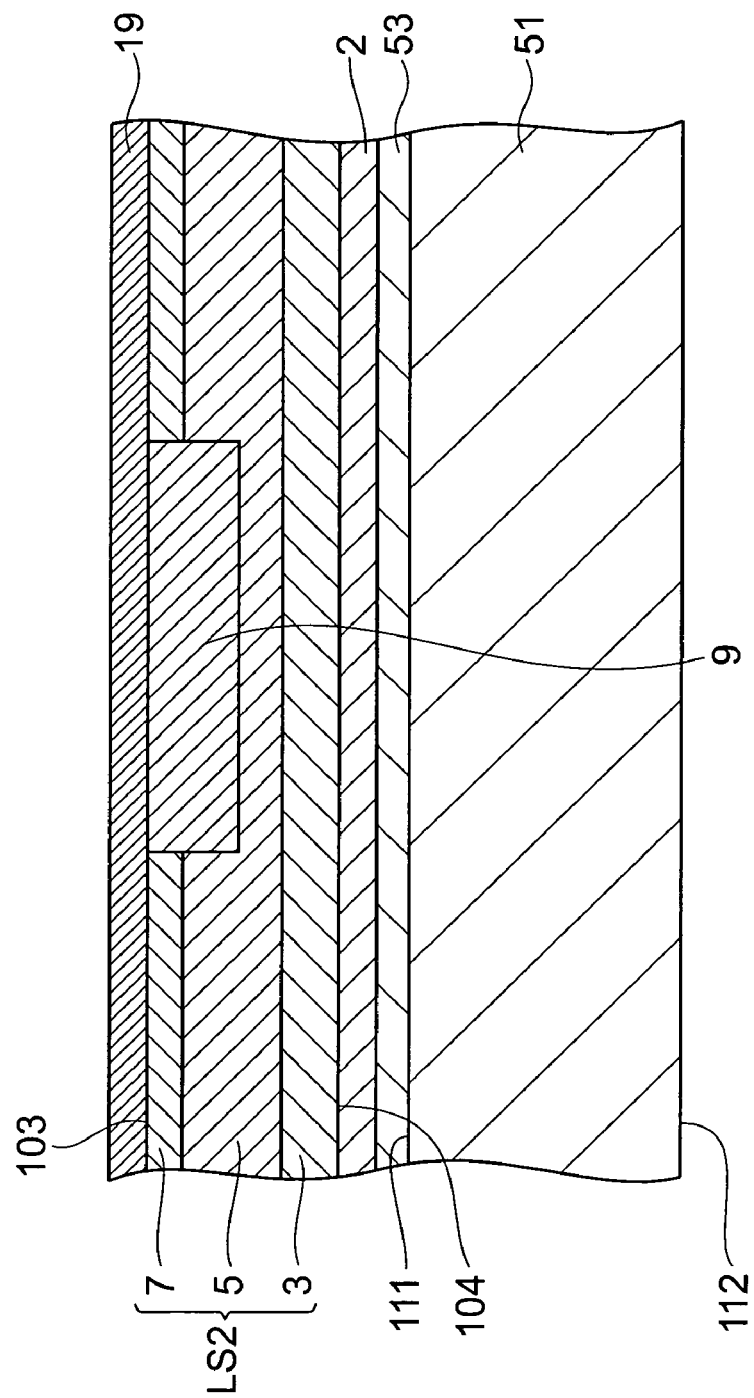
FIG. 26 is a schematic sectional view showing a manufacturing step of the semiconductor photodetector device in accordance with the fifth embodiment.

Next, a passivation film 19 made of $SiN_X$ is formed on the front face 103 of the cap layer 7 (multilayer structure LS2) by PCVD (see FIG. 26).

Step (4)

Figure 27:
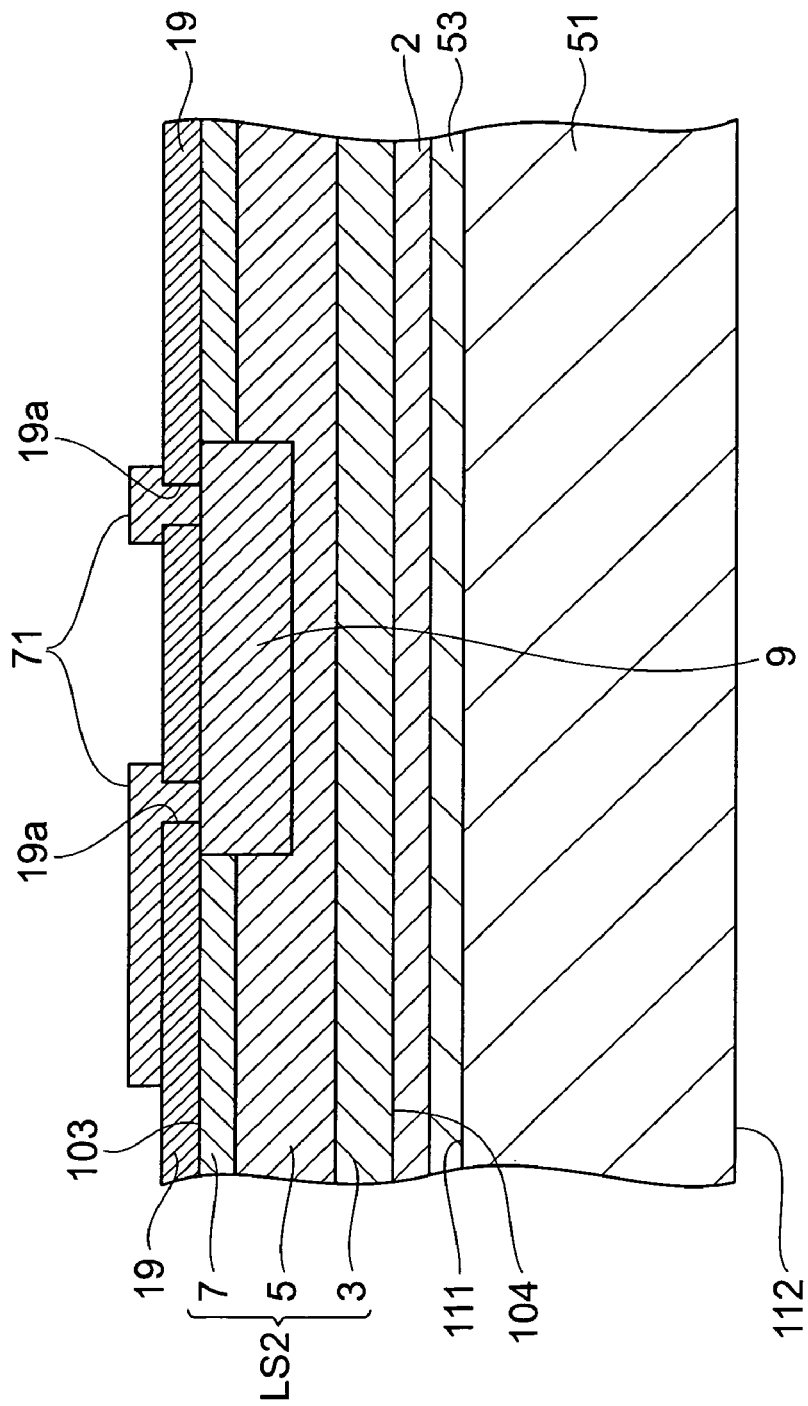
FIG. 27 is a schematic sectional view showing a manufacturing step of the semiconductor photodetector device in accordance with the fifth embodiment.

Next, a resist film (not depicted) having an opening at a position corresponding to the contact electrode 71 is formed, and the passivation film 19 is removed by buffered hydrofluoric acid (BHF) while using this resist film as a mask, so as to form a contact hole 19a in the passivation film 19 (see FIG. 27). Subsequently, the resist film is removed.

Next, a resist film (not depicted) having an opening at a position corresponding to the contact hole 19a is formed again. Then, using this resist film as a mask, a contact electrode 71 made of Ti/Pt/Au is formed by vapor deposition and liftoff on the part of photodetecting region 9 exposed by the contact hole 19a (see FIG. 27 as above). Subsequently, the resist film is removed.

Step (5)

Figure 28:
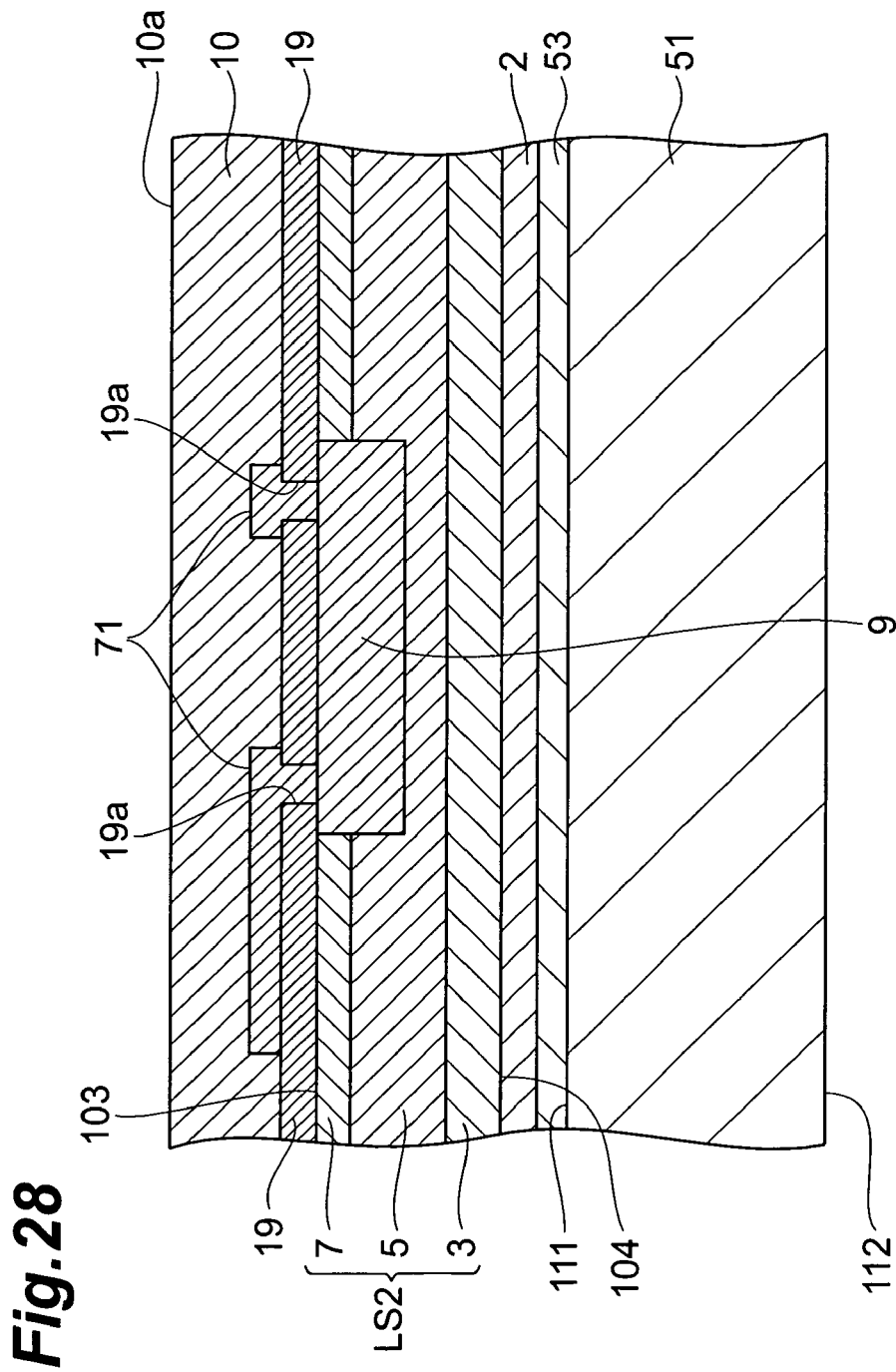
FIG. 28 is a schematic sectional view showing a manufacturing step of the semiconductor photodetector device in accordance with the fifth embodiment.

Next, a film 10 is formed and flattened on the front face 103 side of the multilayer structure LS2 so as to cover the photodetecting region 9 (passivation film 19) and contact electrode 71 (see FIG. 28). Here, the surface 10a positioned on the side opposite from the multilayer structure LS2 in the film 10 is flattened as a front face of a structure including the multilayer structure LS2 and semiconductor substrate 51. The method of forming the film 10 is the same as the forming method in step (8) in the first embodiment.

Step (6)

Figure 29:
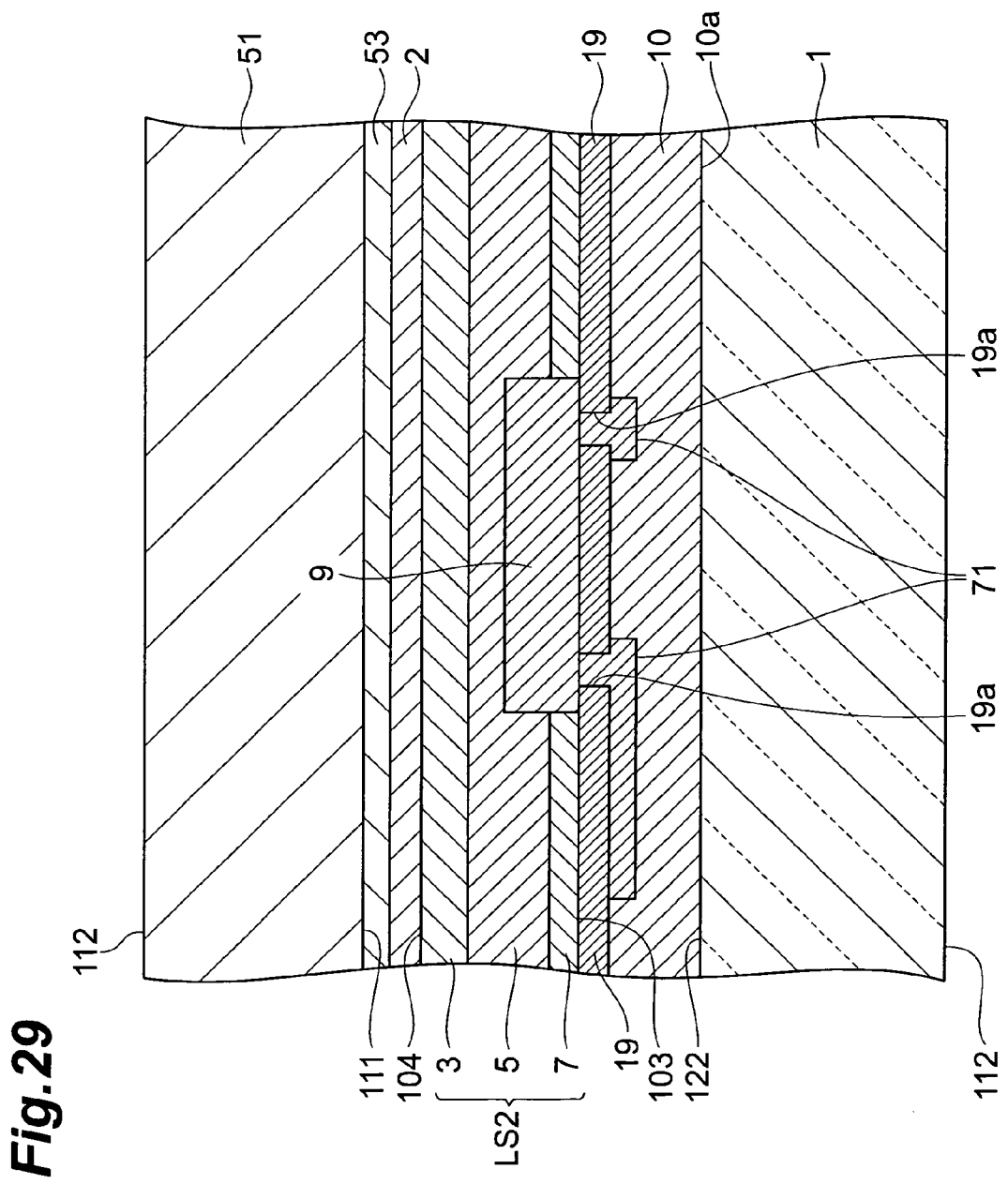
FIG. 29 is a schematic sectional view showing a manufacturing step of the semiconductor photodetector device in accordance with the fifth embodiment.
Figure 30:
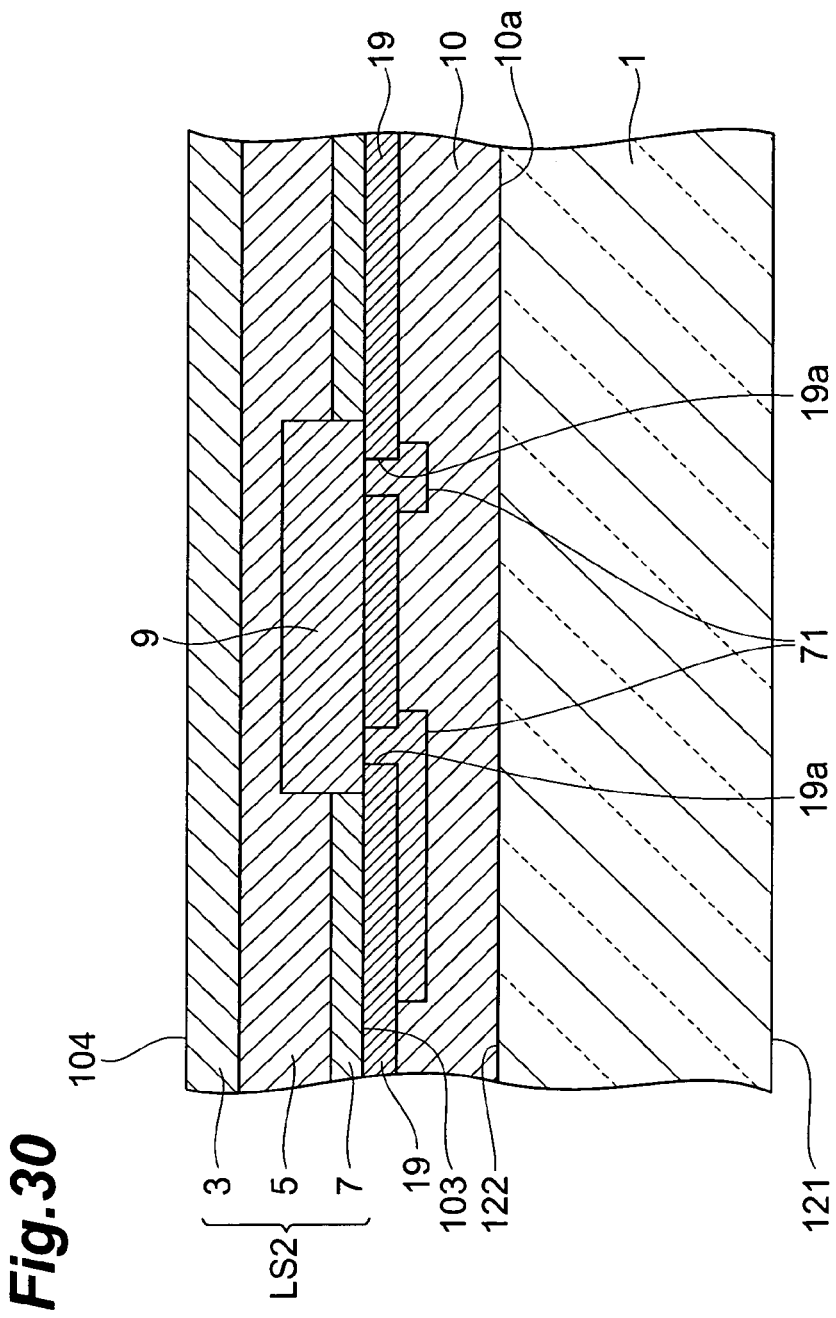
FIG. 30 is a schematic sectional view showing a manufacturing step of the semiconductor photodetector device in accordance with the fifth embodiment.

Next, a glass substrate 1 is attached to the semiconductor substrate 51 formed with the multilayer structure LS2, etching stop layer 2, and film 10 (see FIG. 29). The method of attaching the glass substrate 1 is the same as the attaching method in step (9) in the first embodiment.

Step (7)

Next, the semiconductor substrate 51 is removed. After the glass substrate 1 and semiconductor substrate 51 are attached to each other, the main face (rear face) 112 positioned on the side opposite from the glass substrate 1 in the semiconductor substrate 51 is exposed. This step starts etching from the rear face 112 side of the semiconductor substrate 51, so as to remove the semiconductor substrate 51, buffer layer 53, and etching stop layer 2 (see FIG. 30).

Specifically, an etchant exhibiting a lower etching rate to the etching stop layer 2 is used at first, so as to remove the semiconductor substrate 51 and buffer layer 53. Subsequently, an etchant which can etch the etching stop layer 2 and exhibits a lower etching rate to the AlGaAs layer of the high-concentration carrier layer 3 is used, so as to remove the etching stop layer 2. This yields the glass substrate 1 mounted with the multilayer structure LS2.

The method of etching the semiconductor substrate 51 and buffer layer 53 is the same as the etching method in step (10) in the first embodiment. After etching the semiconductor substrate 51 and buffer layer 53, the glass substrate 1 with the remaining etching stop layer 2 and multilayer structure LS2 is taken out of the mixed solution of $NH_4OH$ and $H_2O_2$, washed with water, dried, and thereafter dipped in a mixed solution of phosphoric acid ($H_3PO_4$), aqueous hydrogen peroxide, and water ($H_3PO_4:H_2O:H_2O_2=4:90:1$). Since AlGaAs is hardly etched by the mixed solution of phosphoric acid, aqueous hydrogen peroxide, and water, only the etching stop layer 2 is etched, whereby the etching automatically stops when the AlGaAs layer of the high-concentration carrier layer 3 is exposed. Thus, the etching stop layer 2 is removed. The semiconductor substrate 51, buffer layer 53, and etching stop layer 2 may be removed by chemical mechanical polishing (CMP) as well.

Step (8)

Next, a resist film (not depicted) having an opening at a position to form a through hole TH is formed on the high-concentration carrier layer 3. Then, using this resist film as a mask, the multilayer structure LS2 and passivation film 19 are etched (dry-etched) until the contact electrode 71 is exposed. This forms the through hole TH (see FIG. 31). Subsequently, the resist film is removed. This dry etching is etching of about several micrometers and can be performed very easily.

Figure 31:
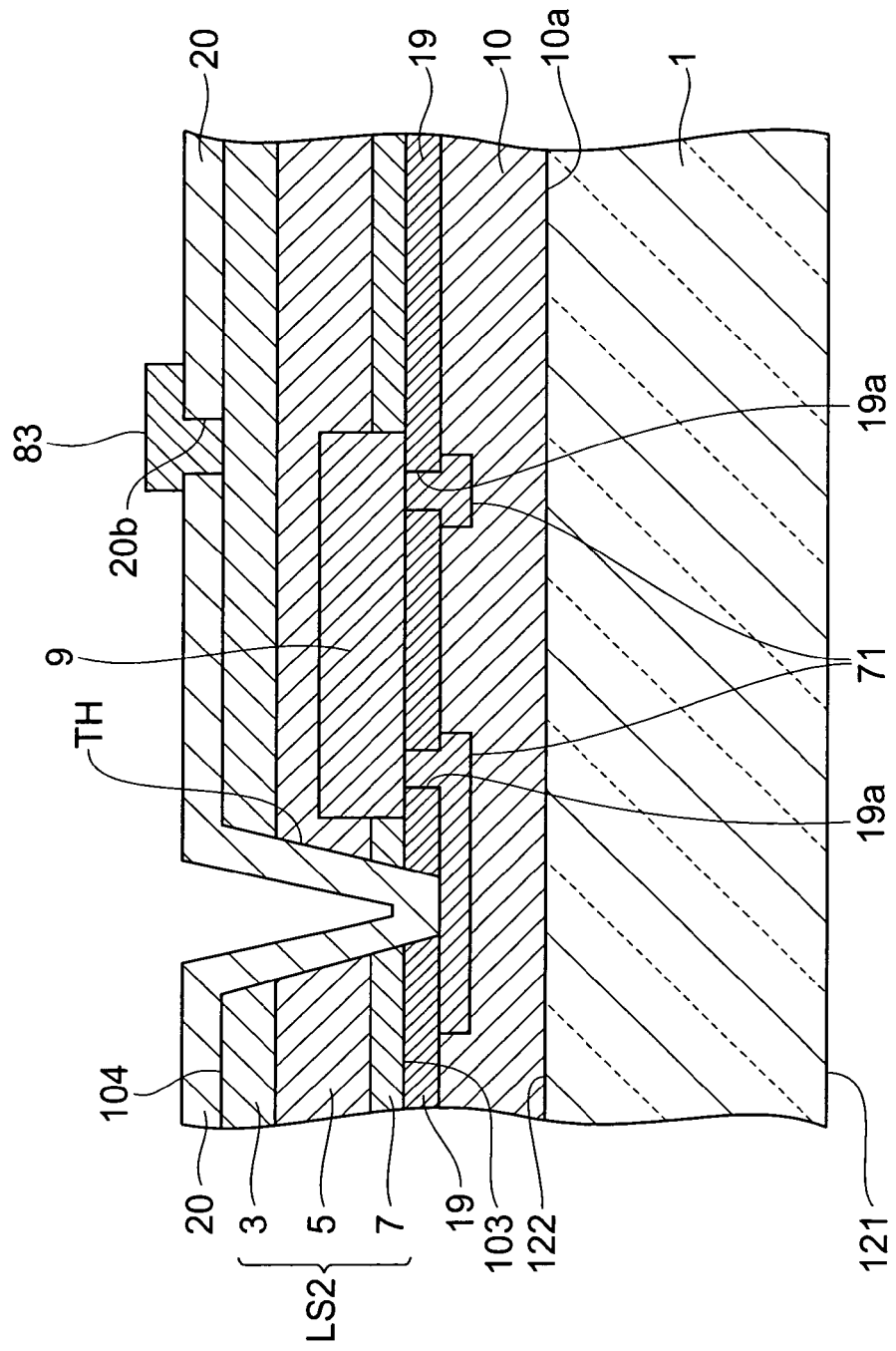
FIG. 31 is a schematic sectional view showing a manufacturing step of the semiconductor photodetector device in accordance with the fifth embodiment.
Figure 32:
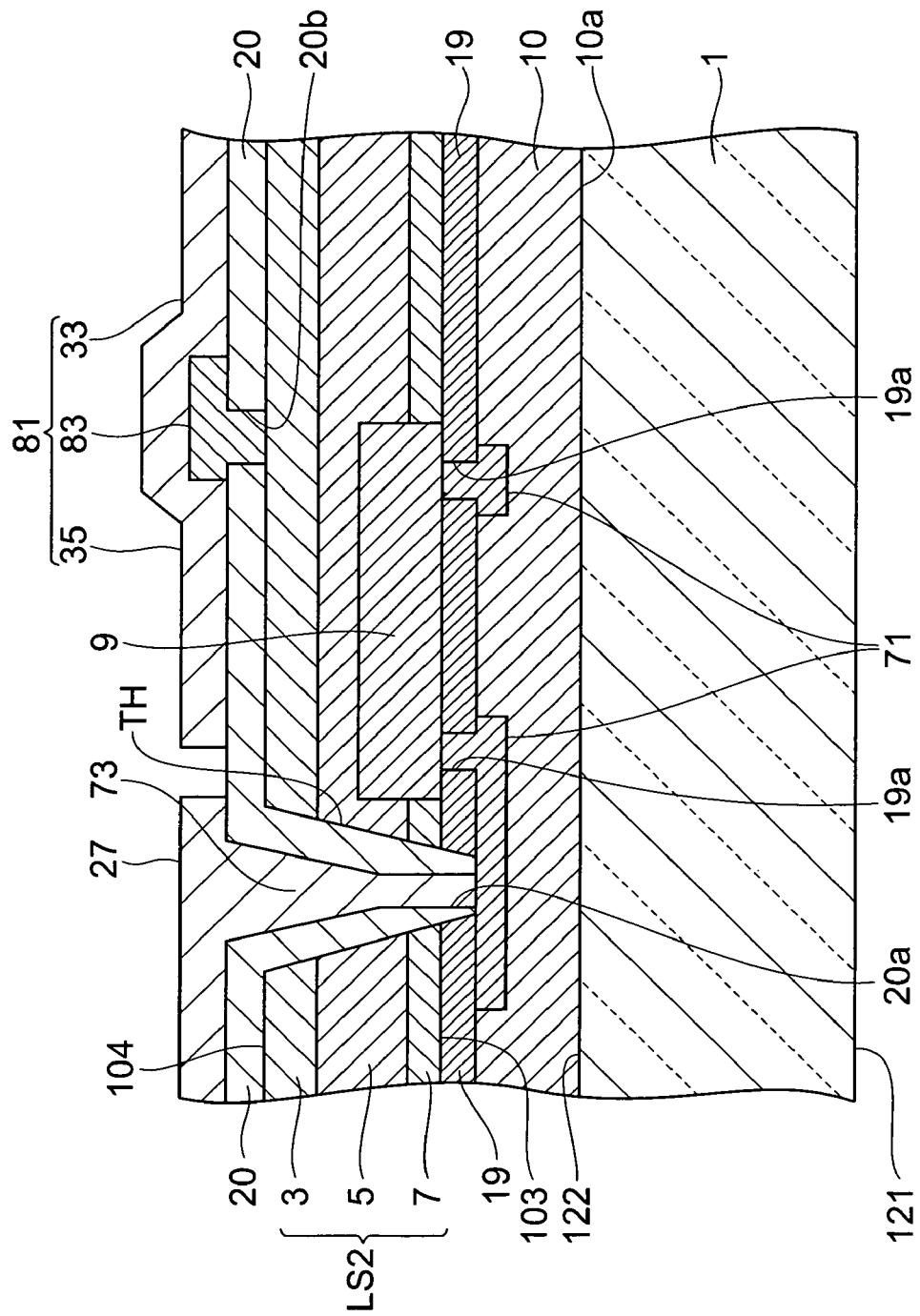
FIG. 32 is a schematic sectional view showing a manufacturing step of the semiconductor photodetector device in accordance with the fifth embodiment.

Next, an electrically insulating film 20 made of $SiN_X$ is formed on the front face of the high-concentration carrier layer 3 by PCVD (see FIG. 31). This forms the electrically insulating film 20 on the wall face of the multilayer structure LS2 defining the through hole TH.

Step (9)

Next, a resist film (not depicted) having an opening at a position corresponding to a contact electrode 83 is formed on the electrically insulating film 20. Then, using this resist film as a mask, the electrically insulating film 20 is removed by BHF, so as to form a contact hole 20b in the electrically insulating film 20 (see FIG. 31 as above). Subsequently, the resist film is removed.

Next, a resist film (not depicted) having an opening at a position corresponding to the contact electrode 83 is formed. Then, using this resist film as a mask, the contact electrode 83 made of Ti/Pt/Au is formed by liftoff (see FIG. 31 as above). Subsequently, the resist film is removed.

Step (10)

Next, a resist film (not depicted) having openings at respective positions corresponding to a through lead 73 and a first pad electrode 27 is formed on the electrically insulating film 20. Then, using this resist film as a mask, the electrically insulating film 20 is removed by BHF, so as to form a contact film 20a in the electrically insulating film 20 (see FIG. 32). This exposes the contact electrode 71. Subsequently, the resist film is removed.

Next, a resist film (not depicted) having openings at respective positions corresponding to a first pad electrode 27 (through lead 73), a second pad electrode 33, and a second wiring electrode 35 is formed. Then, using this resist film as a mask, the first pad electrode 27 (through lead 73), second pad electrode 33, and second wiring electrode 35 made of Ti/Pt/Au are formed by liftoff (see FIG. 32). The first pad electrode 27 and through lead 73 are formed integrally with each other. The second pad electrode 33 and second wiring electrode 35 are formed integrally with each other. Subsequently, the resist film is removed. Thereafter, sintering is performed in an $H_2$ atmosphere. Though the first pad electrode 27 and through lead 73 are formed integrally with each other, they may be formed separately from each other. Similarly, though the second pad electrode 33 and second wiring electrode 35 are formed integrally with each other, they may be formed separately from each other.

These steps (1) to (10) complete the semiconductor photodetector device PD5 having the structure shown in FIGS. 24 and 25.

In this embodiment, as in the above-mentioned first embodiment, the mechanical strength of the multilayer structure LS2 (laminated high-concentration carrier layer 3, light-absorbing layer 5, and cap layer 7) is held by the glass substrate 1 and film 10, while the semiconductor photodetector device PD5 is easily made smaller. Also, the semiconductor photodetector device PD5 can be mounted easily.

In this embodiment, the contact electrode 71 is electrically connected to the first pad electrode 27 through the through lead 73 penetrating through the multilayer structure LS2. Using the through lead 73 can reliably conduct the contact layer 71 to the first pad electrode 27. The second pad electrode 33 is electrically connected to the high-concentration carrier layer 3. Since an electrode is directly drawn from the high-concentration carrier layer 3, the series resistance can greatly be reduced.

In the manufacturing method in accordance with this embodiment, the etching stop layer 2 is removed by wet etching after removing the semiconductor substrate 51. The wet etching selectively removes the etching stop layer 2 alone by using an etchant which can etch the etching stop layer 2 but not the high-concentration carrier layer 3. Therefore, the etching stop layer 2 can be removed reliably and easily while leaving the multilayer structure LS2.

Sixth Embodiment

Figure 33:
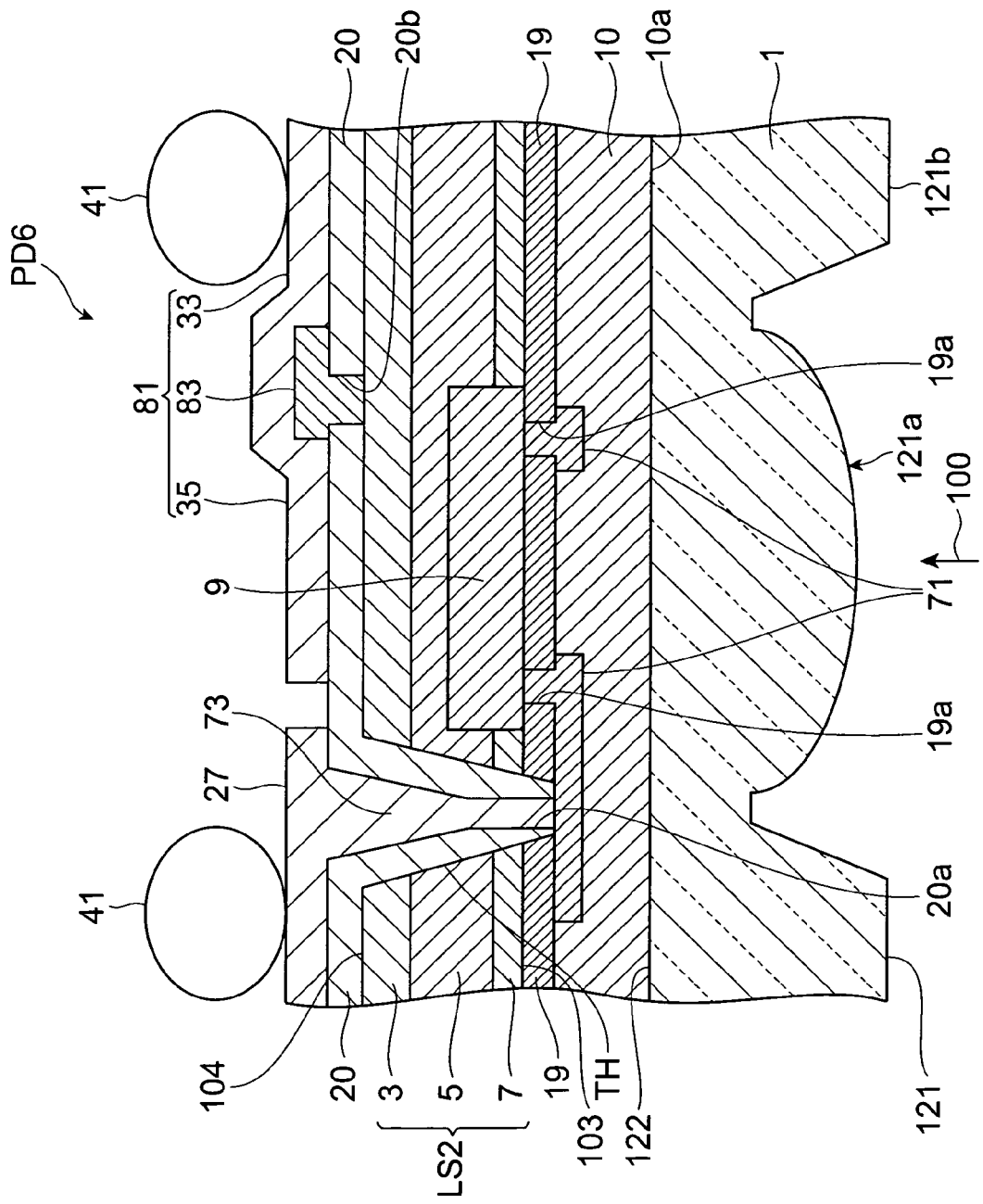
FIG. 33 is a schematic sectional view showing the semiconductor photodetector device in accordance with a sixth embodiment.

FIG. 33 is a schematic sectional view showing the structure of the semiconductor photodetector device in accordance with a sixth embodiment. This semiconductor photodetector device PD6 differs from the semiconductor photodetector device PD5 in accordance with the fifth embodiment in that the glass substrate 1 is formed with a lens part 121a.

The semiconductor photodetector device PD6 comprises a multilayer structure LS2 and the glass substrate 1. This semiconductor photodetector device PD6 is a photodetector device of front-illuminated type in which light is incident on the multilayer structure LS2 from the glass substrate 1 side. The semiconductor photodetector device PD6 is a photodetector device for short-distance optical communications in the wavelength band of 0.85 μm, for example.

The lens part 121a for converging incident light is formed on the front face 121 of the glass substrate 1. The other part 121b of the front face 121 is thicker than the lens part 121a. Namely, the lens part 121a is depressed from the thickest part 121b of the front face 121.

Figure 34:
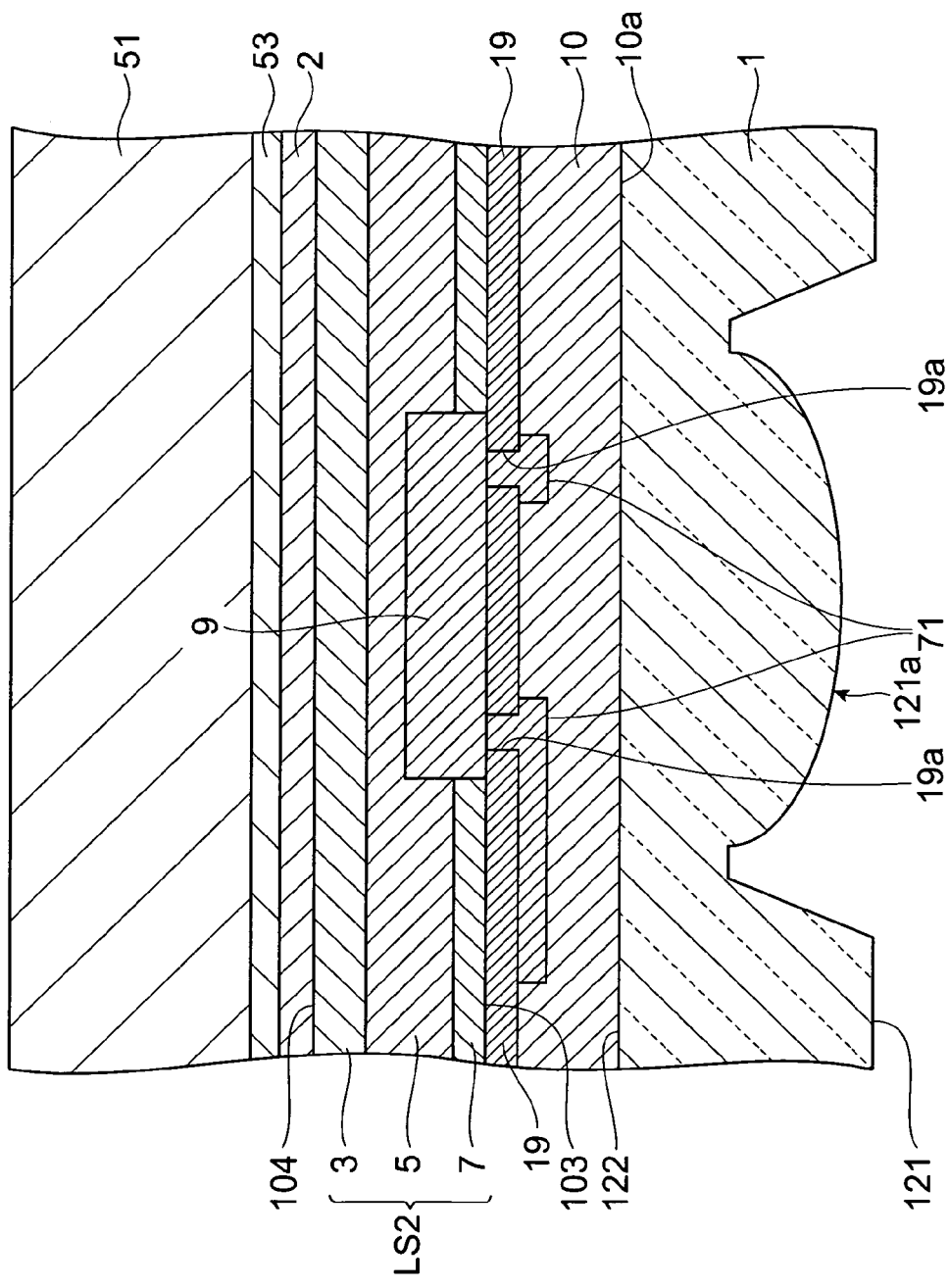
FIG. 34 is a schematic sectional view showing a manufacturing step of the semiconductor photodetector device in accordance with the sixth embodiment.

Next, a method of manufacturing the semiconductor photodetector device PD6 will be explained with reference to FIG. 34. FIG. 34 is a view for explaining this manufacturing method, and shows a vertical section of the semiconductor photodetector device PD6.

This manufacturing method successively executes the following steps (1) to (10). Steps (1) to (5) are the same as steps (1) to (5) in the fifth embodiment, and thus will not be explained.

Step (6)

Next, the glass substrate 1 is attached to the semiconductor 51 formed with the multilayer structure LS2, etching stop layer 2, and film 10 (see FIG. 34). Specifically, the glass substrate 1 having the front face 121 formed with the lens part 121a is prepared, and the rear face 122 of the glass substrate 1 is cleaned. Then, the glass substrate 1 and the semiconductor substrate 51 are stacked such that the cleaned rear face 122 of the glass substrate 1 and the surface 10a remote from the multilayer structure LS2 in the film 10 are in contact with each other. Subsequently, the stacked glass substrate 1 and semiconductor substrate 51 are pressed and heated, so as to attach the glass substrate 1 and film 10 to each other by fusion. Details of this attaching method are the same as those in step (9) in the first embodiment.

Steps (7) to (10) are the same as steps (7) to (13) in the fifth embodiment, and thus will not be explained here. These steps (1) to (10) complete the semiconductor photodetector device PD6 having the structure shown in FIG. 33.

In this embodiment, as in the above-mentioned fifth embodiment, the mechanical strength of the multilayer structure LS2 (laminated high-concentration carrier layer 3, light-absorbing layer 5, and cap layer 7) is held by the glass substrate 1 and film 10, while the semiconductor photodetector device PD6 is easily made smaller. Also, the semiconductor photodetector device PD6 can be mounted easily.

Since the glass substrate 1 is provided with the lens part 121a, the incident light can be received efficiently even when the photodetecting region 9 is smaller than the illuminating area of the incident light. As a result, the semiconductor photodetector device PD6 with an excellent S/N ratio and high reliability can be obtained.

Seventh Embodiment

Figure 35:
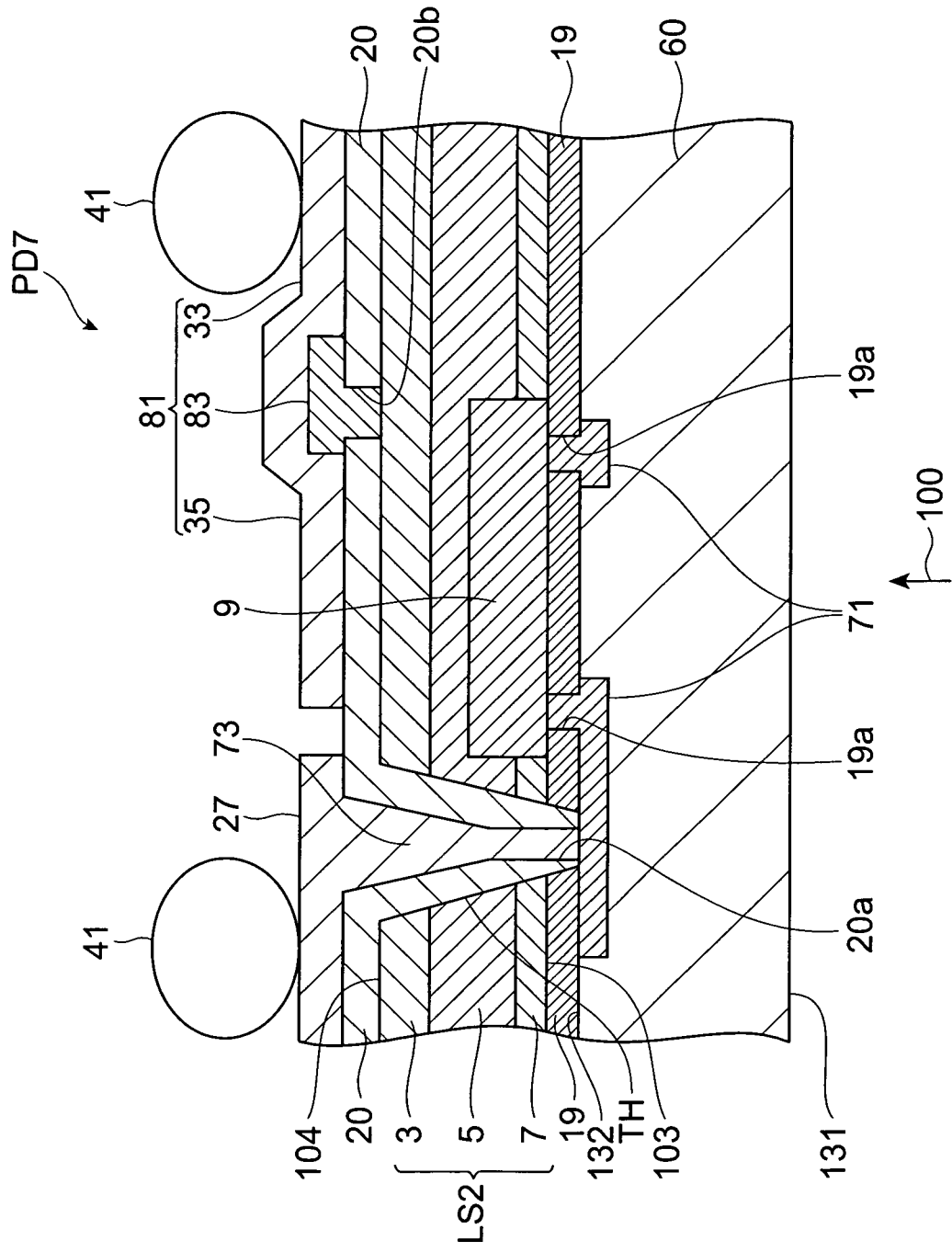
FIG. 35 is a schematic sectional view showing the semiconductor photodetector device in accordance with a seventh embodiment.

FIG. 35 is a schematic sectional view showing the structure of the semiconductor photodetector device in accordance with a seventh embodiment. This semiconductor photodetector device PD7 differs from the semiconductor photodetector device PD5 in accordance with the fifth embodiment in that it has a film made of silicon oxide (SiO) or a resin instead of the glass substrate 1 and film 10.

The semiconductor photodetector device PD7 comprises the multilayer structure LS2 and a film 60. The film 60 has two main faces opposing each other, i.e., front face 131 and rear face 132. The multilayer structure LS2 is provided on the rear face 132 of the film 60. This semiconductor photodetector device PD7 is a photodetector device of front-illuminated type in which light is incident on the multilayer structure LS2 from the film 60 side. The semiconductor photodetector device PD7 is a photodetector device for short-distance optical communications in the wavelength band of 0.85 μm, for example.

On the front face 103 of the multilayer structure LS2, the film 60 is formed such as to cover the photodetecting region 9 and the contact electrode 71. The film 60 is made of silicon oxide or a resin (e.g., polyimide resin, PMMA, or epoxy resin). The film 60 has a thickness of about 50 μm and is optically transparent to incident light.

Figure 36:
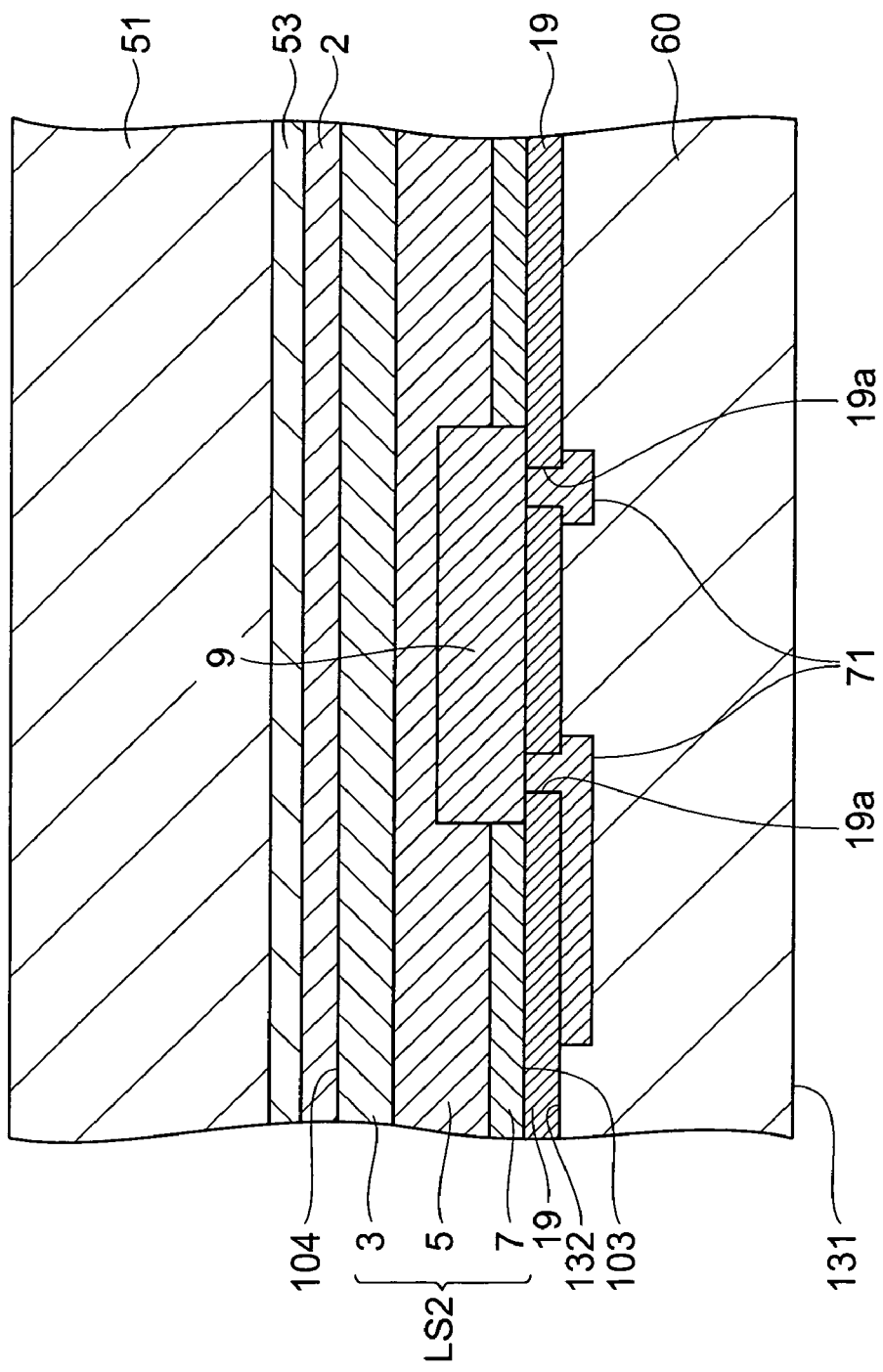
FIG. 36 is a schematic sectional view showing a manufacturing step of the semiconductor photodetector device in accordance with the seventh embodiment.
Figure 37:
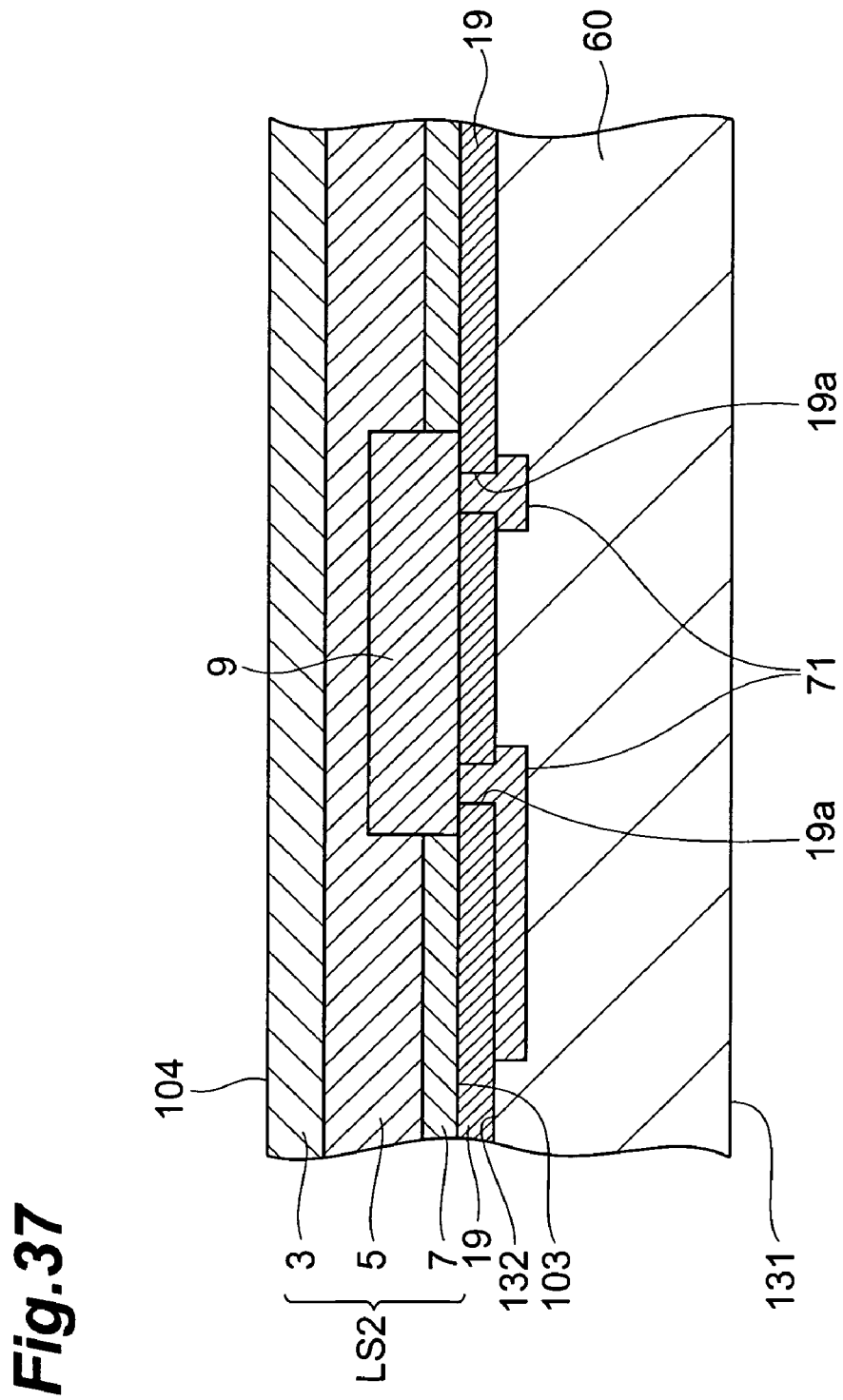
FIG. 37 is a schematic sectional view showing a manufacturing step of the semiconductor photodetector device in accordance with the seventh embodiment.

A method of manufacturing the semiconductor photodetector device PD7 will now be explained with reference to FIGS. 36 and 37. FIGS. 36 and 37 are views for explaining this manufacturing method, and show a vertical section of the semiconductor photodetector device PD7.

This manufacturing method successively executes the following steps (1) to (9). Steps (1) to (4) are the same as steps (1) to (4) in the fifth embodiment, and thus will not be explained.

Step (5)

Next, a film 60 is formed on the front face 103 side of the multilayer structure LS2 so as to cover the photodetecting region 9 (passivation film 19) and contact electrode 71 (see FIG. 36). The method of forming the film 60 is the same as the forming method in step (8) in the third embodiment.

Step (6)

Next, the semiconductor substrate 51 is removed. The main face positioned on the side opposite from the film 60 in the semiconductor substrate 51, i.e., the rear face 112, is exposed after forming the film 60. This step removes the semiconductor substrate 51 and etching stop layer 2 by etching from the rear face 112 side of the semiconductor substrate 51 (see FIG. 37). The method of etching the semiconductor substrate 51 and etching stop layer 2 is the same as the etching method in step (7) in the above-mentioned fifth embodiment.

Steps (7) to (9) are the same as steps (8) to (10) in the fifth embodiment, and thus will not be explained here. These steps (1) to (9) complete the semiconductor photodetector device PD7 having the structure shown in FIG. 35.

In this embodiment, as in the above-mentioned fifth embodiment, the mechanical strength of the multilayer structure LS2 (laminated high-concentration carrier layer 3, light-absorbing layer 5, and cap layer 7) is held by the film 60, while the semiconductor photodetector device PD7 is easily made smaller. Also, the semiconductor photodetector device PD7 can be mounted easily.

Eighth Embodiment

Figure 38:
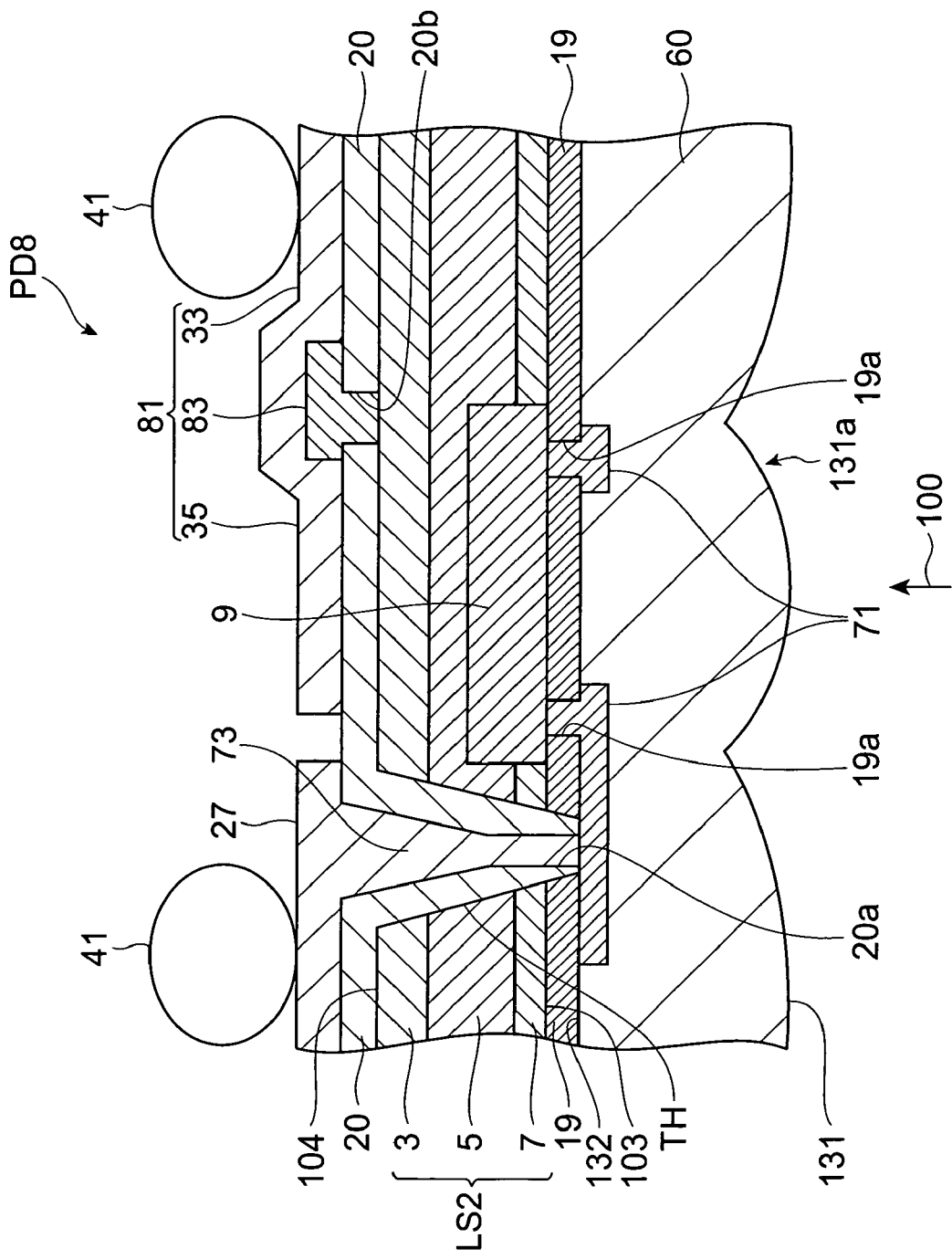
FIG. 38 is a schematic sectional view showing the semiconductor photodetector device in accordance with an eighth embodiment.

FIG. 38 is a schematic sectional view showing the structure of the semiconductor photodetector device in accordance with an eighth embodiment. This semiconductor photodetector device PD8 differs from the semiconductor photodetector device PD7 in accordance with the seventh embodiment in that the film 60 is formed with a lens part 131a.

The semiconductor photodetector device PD8 comprises the multilayer structure LS2 and the film 60. This semiconductor photodetector device PD8 is a photodetector device of front-illuminated type in which light is incident on the multilayer structure LS2 from the film 60 side. The semiconductor photodetector device PD8 is a photodetector device for short-distance optical communications in the wavelength band of 0.85 μm, for example.

The front face 131 of the film 60 is formed with the lens part 131a for converging incident light. The lens part 131a can be formed by wet etching. The wet etching for forming the lens part 131a is the same as the wet etching method explained in the above-mentioned fourth embodiment.

In this embodiment, as in the above-mentioned fifth embodiment, the mechanical strength of the multilayer structure LS2 (laminated high-concentration carrier layer 3, light-absorbing layer 5, and cap layer 7) is held by the film 60, while the semiconductor photodetector device PD8 is easily made smaller. Also, the semiconductor photodetector device PD8 can be mounted easily.

Since the film 60 is provided with the lens part 131a, the incident light can be received efficiently even when the photodetecting region 9 is smaller than the illuminating area of the incident light. As a result, the semiconductor photodetector device PD8 with an excellent S/N ratio and high reliability can be obtained.

Modified examples of these embodiments will now be explained with reference to FIGS. 39 and 40. These modified examples are semiconductor photodetector device arrays PDA1 and PDA2 in which a plurality of photodetecting regions 9 are provided in a row. These photodetector device arrays PDA1 and PDA2 are of so-called front-illuminated type.

Figure 39:
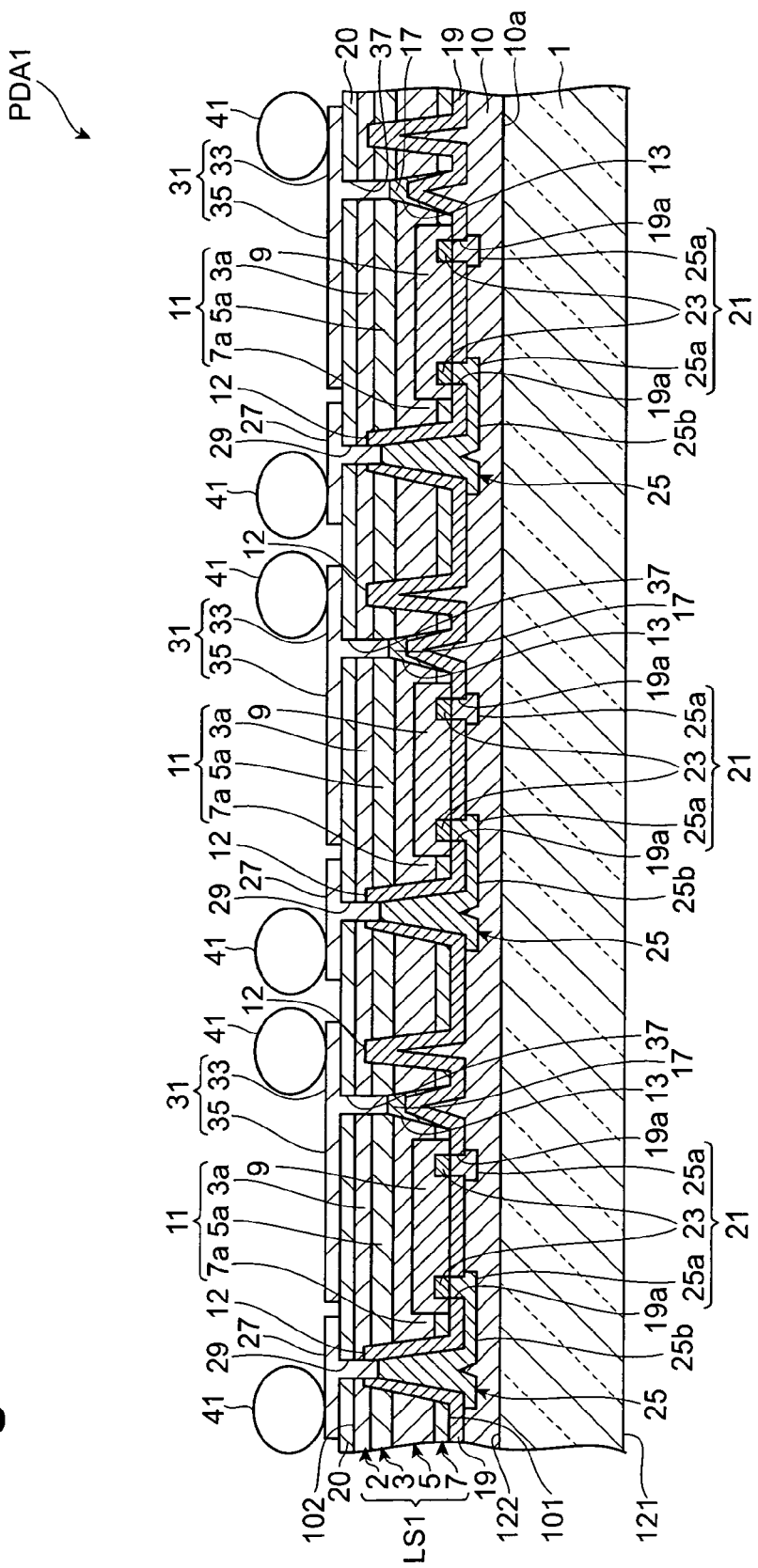
FIG. 39 is a schematic sectional view of the semiconductor photodetector device array in accordance with an embodiment.
Figure 40:
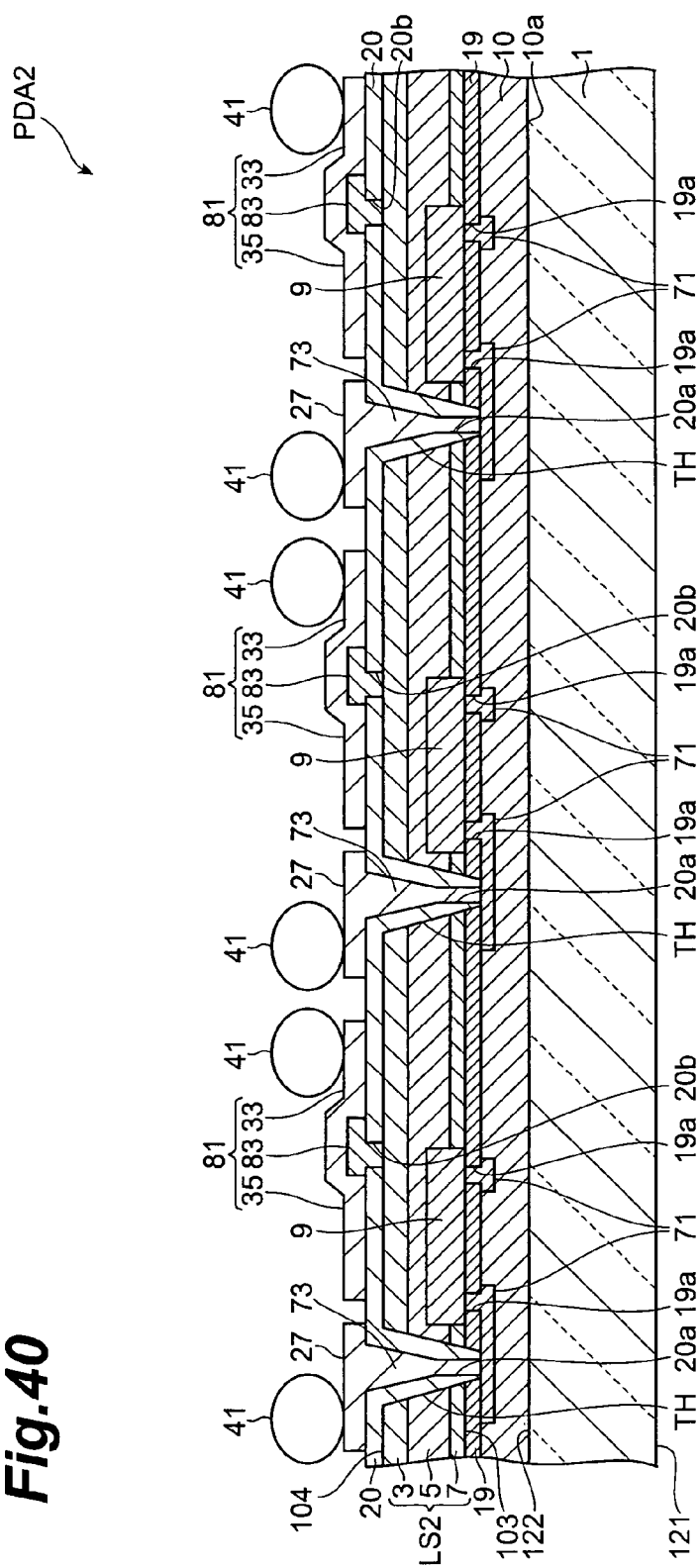
FIG. 40 is a schematic sectional view of the semiconductor photodetector device array in accordance with an embodiment.

In the photodetector array PDA1, a plurality of photodetecting parts 11 and photodetecting regions 9 are arranged one- or two-dimensionally as shown in FIG. 39. In the photodetector array PDA2, a plurality of photodetecting regions 9 are arranged one- or two-dimensionally as shown in FIG. 40.

In the photodetector array PDA1, the mechanical strength of the multilayer structure LS1 (laminated high-concentration carrier layer 3, light-absorbing layer 5, and cap layer 7) is held by the glass substrate 1 as in the above-mentioned first embodiment. Also, the pitch between the photodetecting parts 11 and the pitch between the photodetecting regions 9 can be narrowed, whereby the photodetector array PDA1 is easily made smaller.

In the photodetector array PDA2, the mechanical strength of the multilayer structure LS2 (laminated high-concentration carrier layer 3, light-absorbing layer 5, and cap layer 7) is held by the glass substrate 1 as in the above-mentioned fifth embodiment. Also, the pitch between the photodetecting regions 9 can be narrowed, whereby the photodetector array PDA2 is easily made smaller.

In the photodetector arrays PDA1 and PDA2, the above-mentioned film 60 may be provided instead of the glass substrate 1 and film 10. Lens parts (e.g., the above-mentioned lens parts 121a and 131a) may be formed so as to correspond to the respective photodetecting regions 9.

Figure 41:
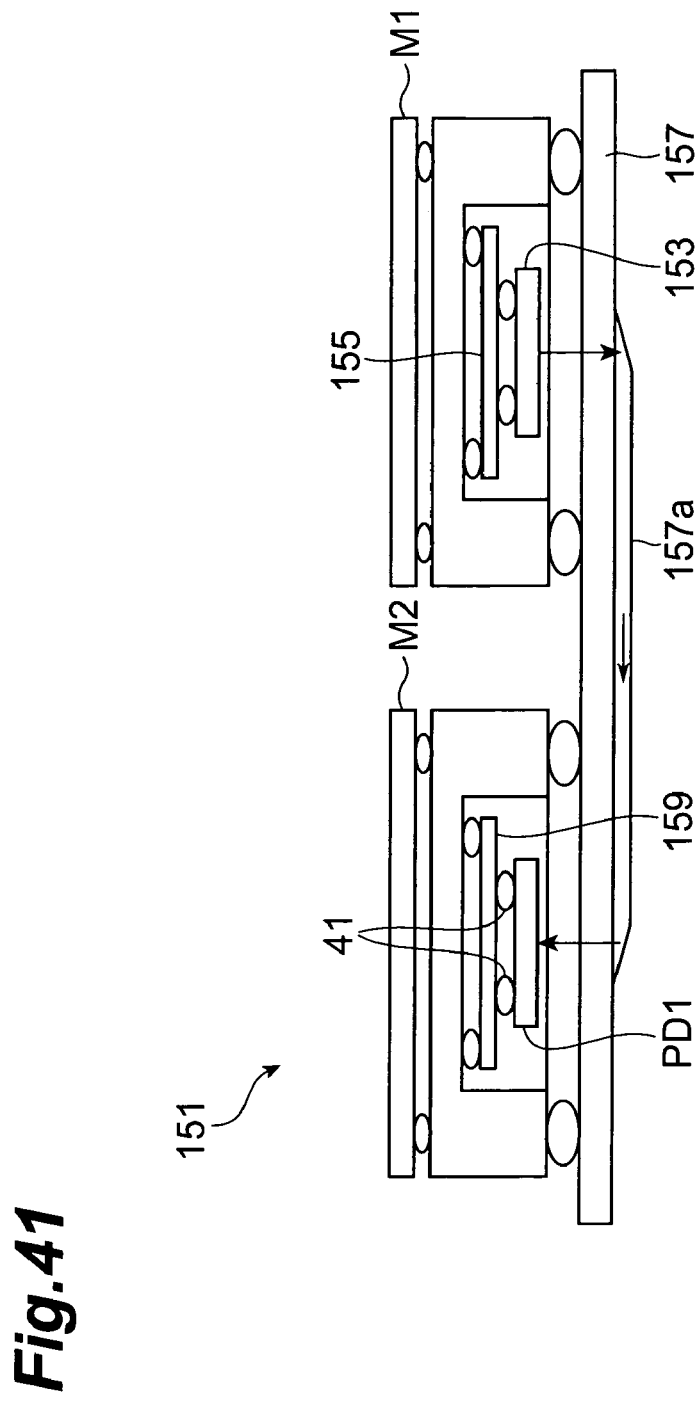
FIG. 41 is a schematic sectional view showing the structure of the optical interconnection system in accordance with an embodiment.

An optical interconnection system using the above-mentioned semiconductor photodetector device (or photodetector array) will now be explained with reference to FIG. 41. FIG. 41 is a schematic view showing the structure of the optical interconnection system.

The optical interconnection system 151 is a system for transmitting optical signals between a plurality of modules (e.g., CPUs, IC chips, and memories) M1 and M2, and includes a semiconductor light-emitting device 153, a driving circuit 155, an optical waveguide substrate 157, a semiconductor photodetector device PD1, an amplifying circuit 159, and the like. A vertical cavity surface emitting laser (VCSEL) of back-illuminated type can be used as the semiconductor light-emitting device 153. The module M1 is electrically connected to the semiconductor light-emitting device 103 through bump electrodes. The driving circuit 155 is electrically connected to the semiconductor light-emitting device 103 through bump electrodes. The semiconductor photodetector device PD1 is electrically connected to the amplifying circuit 159 through bump electrodes 41. The amplifying circuit 159 is electrically connected to the module M2 through bump electrodes.

An electric signal outputted from the module M1 is sent to the driving circuit 155, and is converted into an optical signal by the semiconductor light-emitting device 153. The optical signal from the semiconductor light-emitting device 153 passes through an optical waveguide 157a on the optical waveguide substrate 157, so as to be made incident on the semiconductor photodetector device PD1. The optical signal is converted by the semiconductor photodetector device PD1 into an electric signal, which is then sent to the amplifying circuit 109 and amplified therein. The amplified electric signal is sent to the module M2. Thus, the electric signal outputted from the module M1 is transmitted to the module M2.

Any of the semiconductor photodetector devices PD2 to PD8 or semiconductor photodetector device arrays PDA1 and PDA2 may be used in place of the semiconductor photodetector device PD1. When the semiconductor photodetector device array PDA1, PDA2 is used, the semiconductor light-emitting device 153, driving circuit 155, optical waveguide substrate 157, and amplifying circuit 159 are also arranged so as to form an array.

The present invention is explained in detail with reference to its embodiments in the foregoing. However, the present invention is not limited to the above-mentioned embodiments. The present invention can be modified in various ways within a scope not deviating from its gist. For example, thicknesses, materials, and the like of the semiconductor substrate 51, high-concentration carrier layer 3 (3a, 3b), light-absorbing layer 5 (5a, 5b), cap layer 7 (7a, 7b), and the like are not limited to those mentioned above. Specifically, Si, InP, InGaAs, InSb, or InAsSb may be used as a material of the semiconductor substrate 51 instead of GaAs mentioned above.

From the invention thus described, it will be obvious that the same may be varied in many ways. Such variations are not to be regarded as a departure from the scope of the invention, and all such modifications as would be obvious to one skilled in the art are intended to be included within the following claims.

INDUSTRIAL APPLICABILITY

The present invention can provide a semiconductor photodetector device which can be made smaller while having a sufficient mechanical strength, and a method of manufacturing the same. Also, the present invention allows the semiconductor photodetector device to be mounted easily.

The invention claimed is:

1. A photodetector device comprising:
a multilayer structure including a plurality of compound semiconductor layers laminated and having first and second main faces opposing each other;
a photodetecting region formed near the first main face within the multilayer structure;
a first electrode arranged on the first main face of the multilayer structure and electrically connected to the photodetecting region;
a second electrode arranged on the second main face of the multilayer structure and electrically connected to the first electrode;
a third electrode arranged on the second main face of the multilayer structure and electrically connected to a part near the second main face in the multilayer structure; and
a light-transmitting layer, optically transparent to incident light and arranged on the first main face of the multilayer structure, covering the photodetecting region and the first electrode,
wherein the light-transmitting layer includes a film made of silicon oxide and a glass substrate,
wherein the glass substrate is secured to the multilayer structure through the film made of silicon oxide,
wherein the first electrode includes a contact electrode and an electrode part, the contact electrode is formed on a front face of the photodetecting region and is electrically connected to the photodetecting region,
wherein the film made of silicon oxide covers the first electrode and makes the first main face of the multilayer structure flattened,
wherein the plurality of compound semiconductor layers include a high-concentration carrier layer of a first conductive type, a light-absorbing layer of the first conductive type, and a cap layer of the first conductive type,
wherein the photodetecting region is a region of a second conductive type including at least a part of the cap layer,
wherein the multilayer structure further comprises a depression formed so as to surround the photodetecting region, and a wiring electrode arranged within the depression,
wherein the electrode part of the first electrode electrically connects the first electrode to the second electrode through the wiring electrode arranged within the depression, and
wherein the third electrode is electrically connected to a part positioned near the photodetecting region in the high-concentration carrier layer.

2. A photodetector device according to claim 1, wherein the light-transmitting layer includes a film made of silicon oxide or a resin.

3. A photodetector device according to claim 1, further comprising a through lead penetrating through the multilayer structure;
wherein the first electrode is electrically connected to the second electrode through the through lead; and
wherein the third electrode is electrically connected to the high-concentration carrier layer.

4. A photodetector device according to claim 1, wherein the second and third electrodes include respective pad electrodes, while respective bump electrodes are arranged on the pad electrodes.

5. A photodetector device according to claim 1, further comprising a light-reflecting film, provided on the second main face, covering the photodetecting region.

6. A photodetector device according to claim 1, comprising a plurality of photodetecting regions arranged in a row.

7. A photodetector device according to claim 1, wherein the light-transmitting layer includes a lens part converging the incident light.

8. A photodetector device according to claim 1, further comprising:
a contact through hole formed in a part of the depression, and
electrodes connecting the first electrode with the second electrode are connected through the contact through hole.

* * * * *